US007880190B2

(12) United States Patent
Ogihara et al.

(10) Patent No.: US 7,880,190 B2
(45) Date of Patent: Feb. 1, 2011

(54) COMBINED SEMICONDUCTOR DEVICE, LED PRINT HEAD, AND IMAGE FORMING APPARATUS

(75) Inventors: Mitsuhiko Ogihara, Hachioji (JP); Ichimatsu Abiko, Tokyo (JP); Masaaki Sakuta, Tokyo (JP)

(73) Assignee: Oki Data Corporation, Tokyo (JP)

( * ) Notice: Subject to any disclaimer, the term of this patent is extended or adjusted under 35 U.S.C. 154(b) by 213 days.

(21) Appl. No.: 10/936,515

(22) Filed: Sep. 9, 2004

(65) Prior Publication Data
US 2005/0057641 A1 Mar. 17, 2005

(30) Foreign Application Priority Data
Sep. 17, 2003 (JP) ............................. 2003-324200

(51) Int. Cl.
*H01L 33/00* (2010.01)
(52) U.S. Cl. ............ 257/99; 257/E31.127; 257/E25.028
(58) Field of Classification Search ............... 257/9, 257/E31.127, E25.028, 98, 99; 2/E31.127, 2/E25.028, 9
See application file for complete search history.

(56) References Cited
U.S. PATENT DOCUMENTS
4,116,544 A * 9/1978 Soref ........................... 349/141

6,242,280 B1 * 6/2001 Koay et al. .................. 438/106
6,270,236 B1 * 8/2001 Brussog ...................... 362/235
6,597,713 B2 * 7/2003 Ouchi ......................... 372/36
2001/0026311 A1 * 10/2001 Toyohara et al. ............ 347/244
2005/0001896 A1 * 1/2005 Wakisaka .................... 347/241
2005/0127376 A1 * 6/2005 Young et al. ................. 257/80

FOREIGN PATENT DOCUMENTS
| JP | 02196476 | * | 8/1990 |
| JP | 06-143678 | | 5/1994 |
| WO | WO03029011 | * | 4/2003 |

OTHER PUBLICATIONS
Schnitzer et al., "30% external quantum efficiency from surface textured, thin film light-emitting diodes," Appl. Phys. Lett. 63, 2174, 1993.*

* cited by examiner

*Primary Examiner*—Davienne Monbleau
*Assistant Examiner*—Matthew Reames
(74) *Attorney, Agent, or Firm*—Rabin & Berdo, P.C.

(57) ABSTRACT

A combined semiconductor apparatus has a substrate, a thin semiconductor film attached directly or indirectly to one major surface of the substrate, and a lens attached to the opposite surface of the substrate. The thin semiconductor film includes a light-emitting element that emits light through the substrate. After passing through the substrate, the emitted light is focused by the lens. The substrate functions as a spacing element, assuring that the lens is positioned at the correct distance from the light-emitting element without the need for separate alignment. The substrate also holds the lens without the need for a separate lens holder. Driving circuitry may also be formed on the substrate.

18 Claims, 38 Drawing Sheets

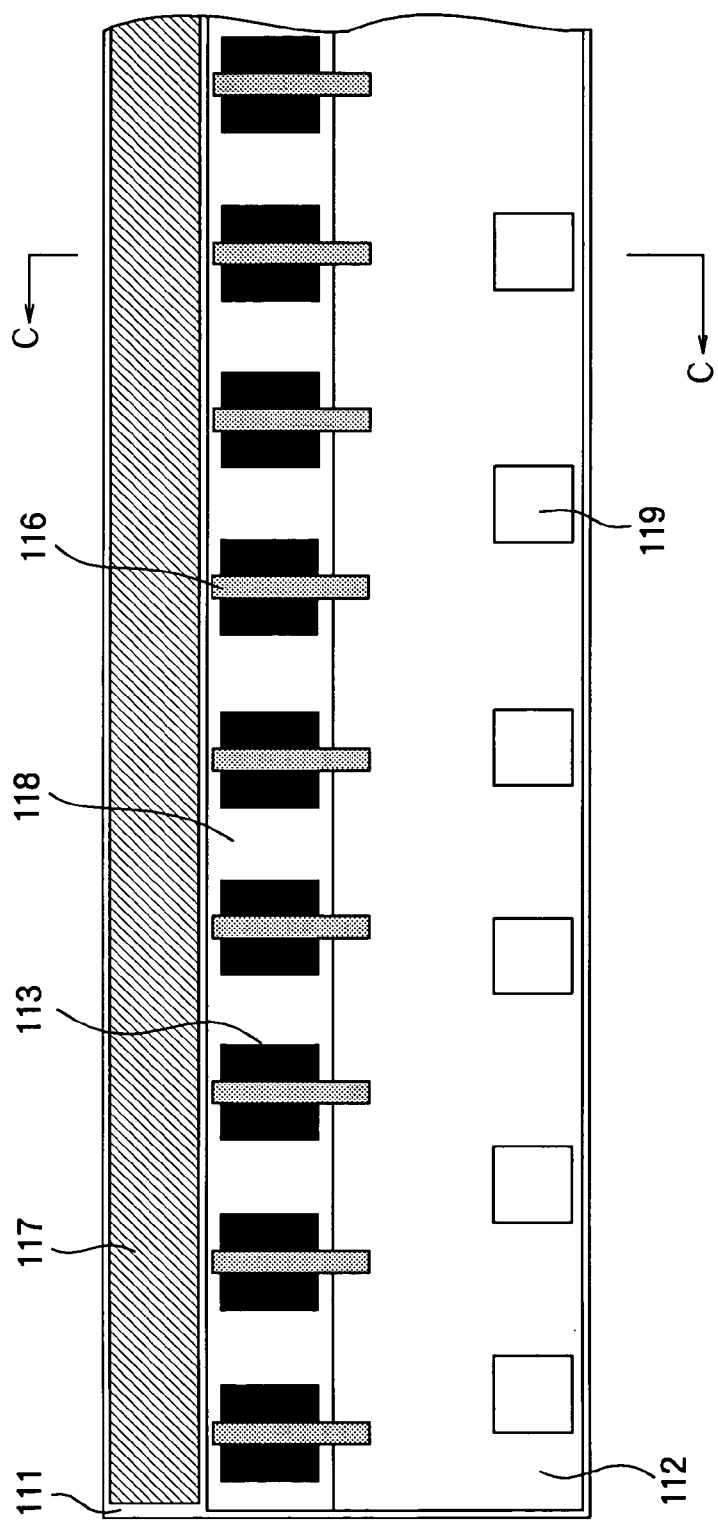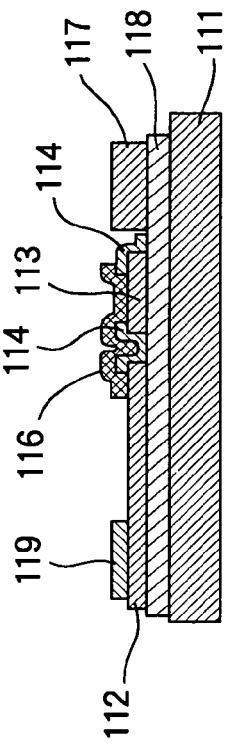

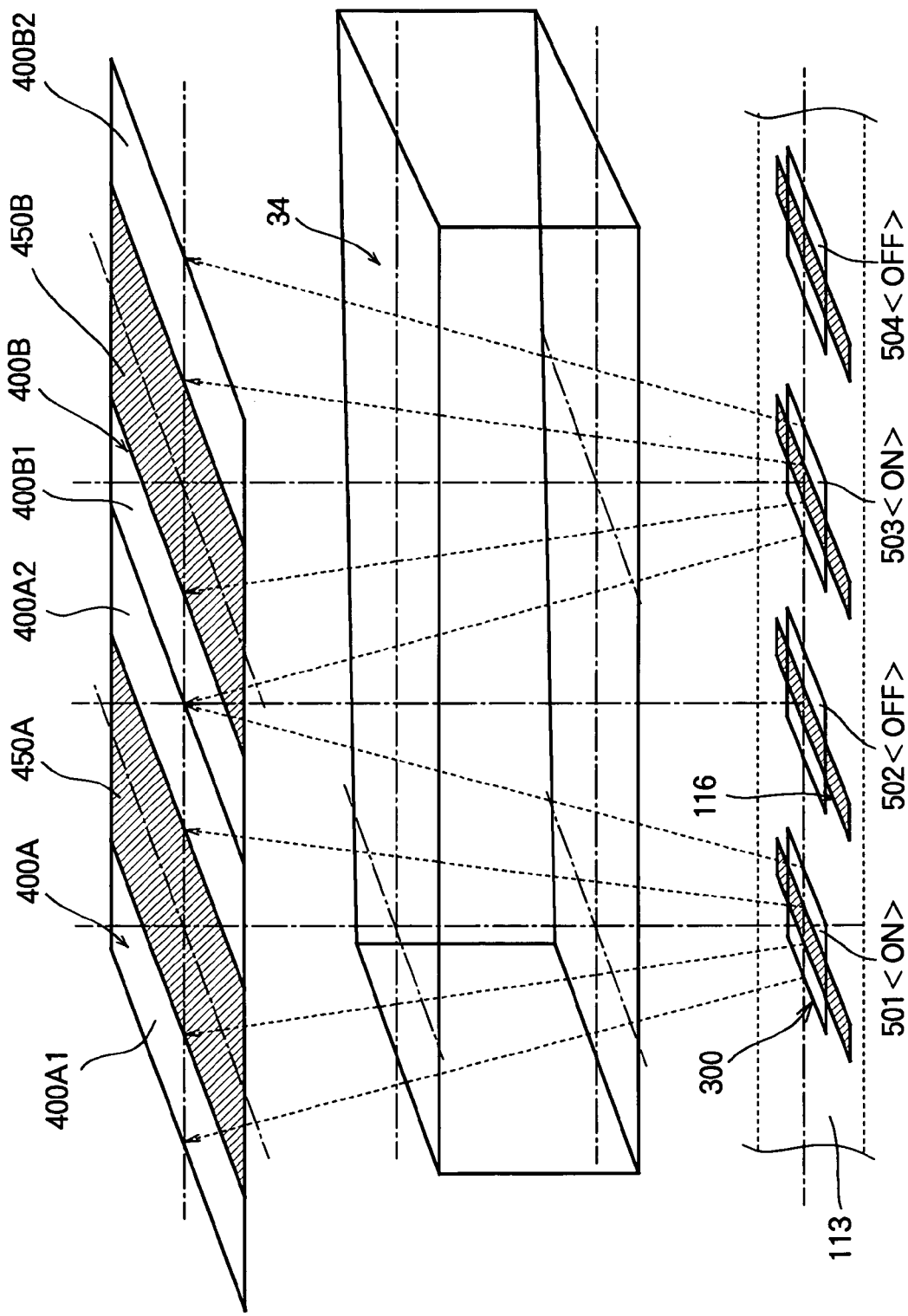

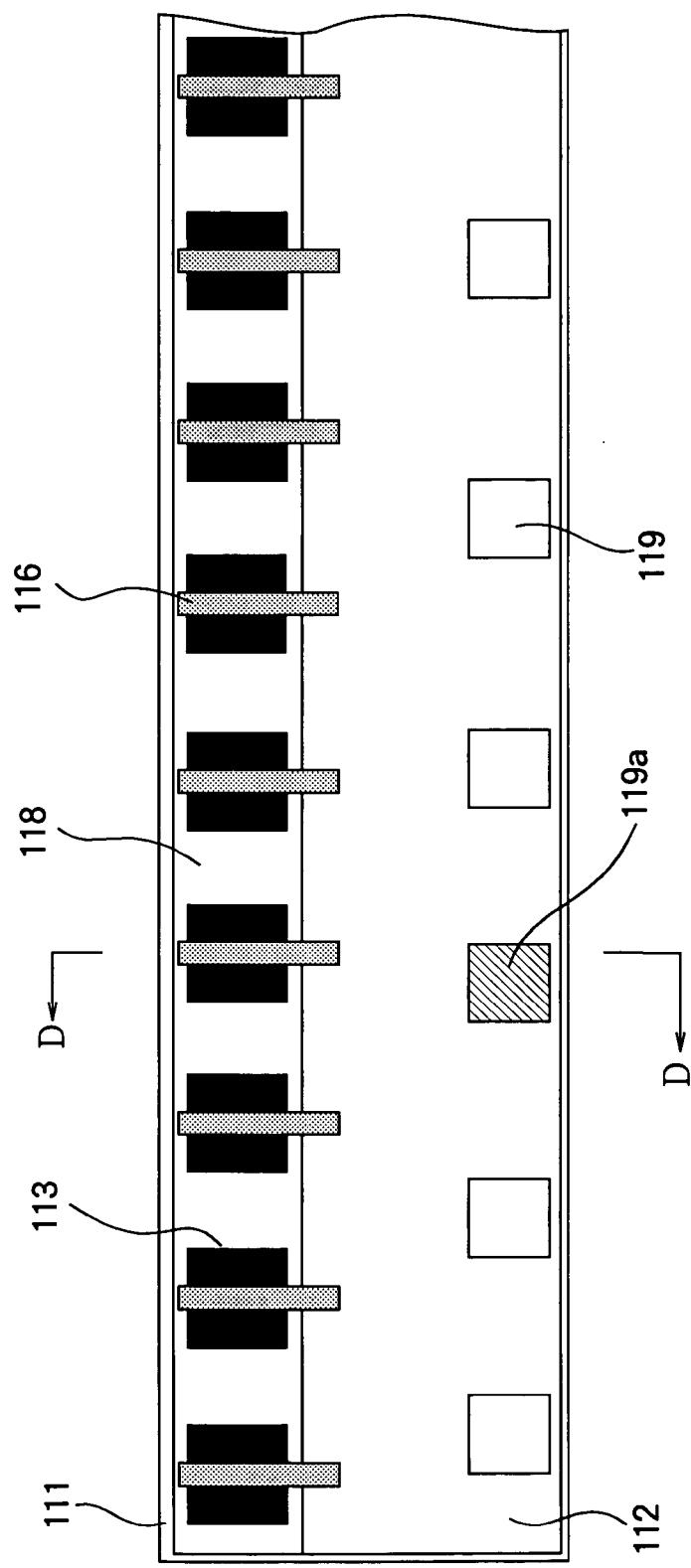
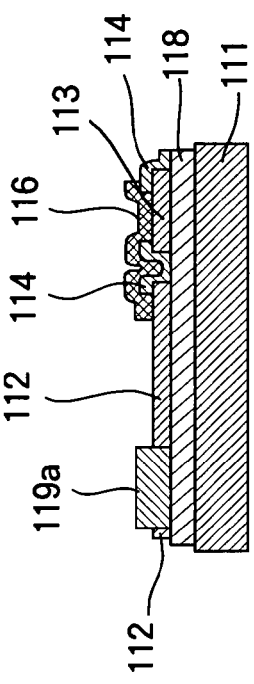

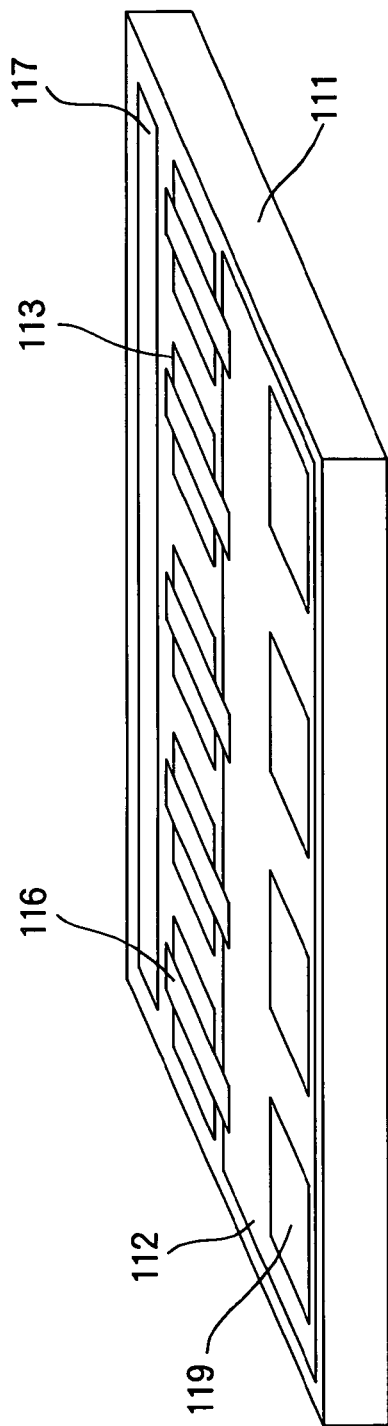
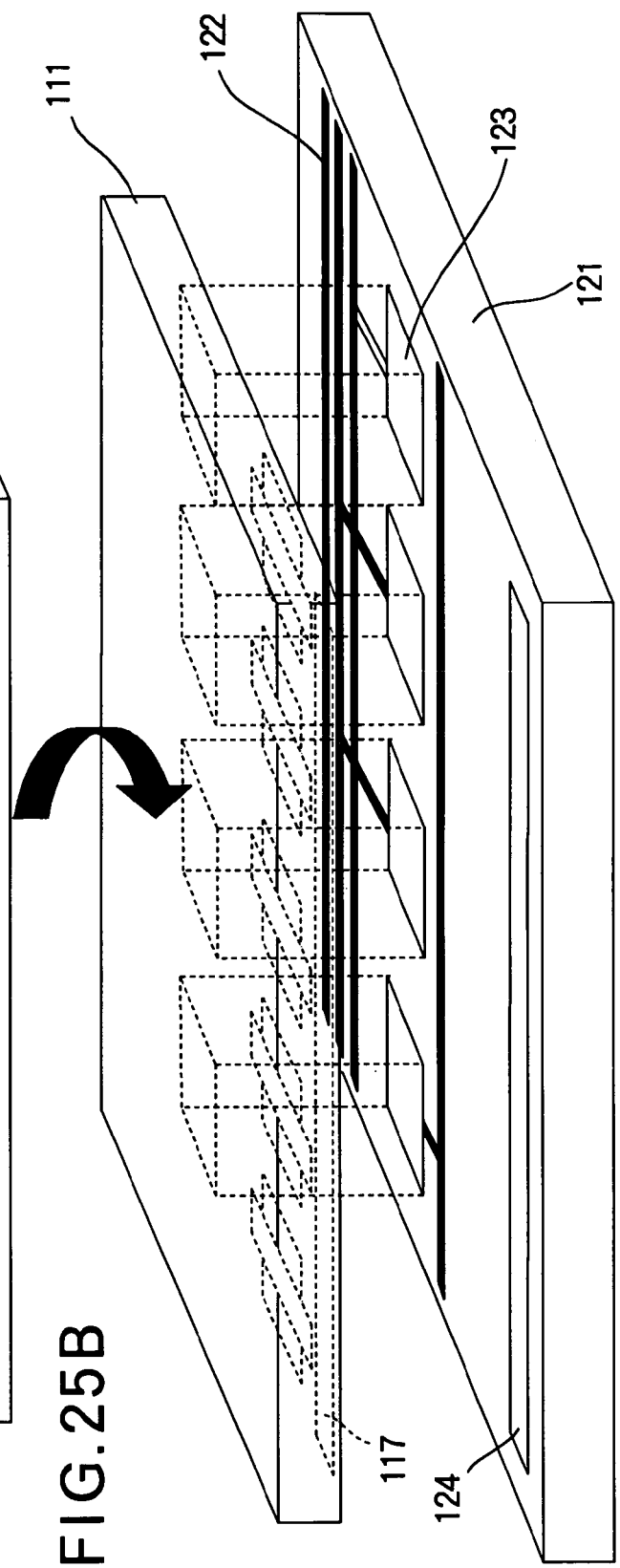
FIG.25A
FIG.25B

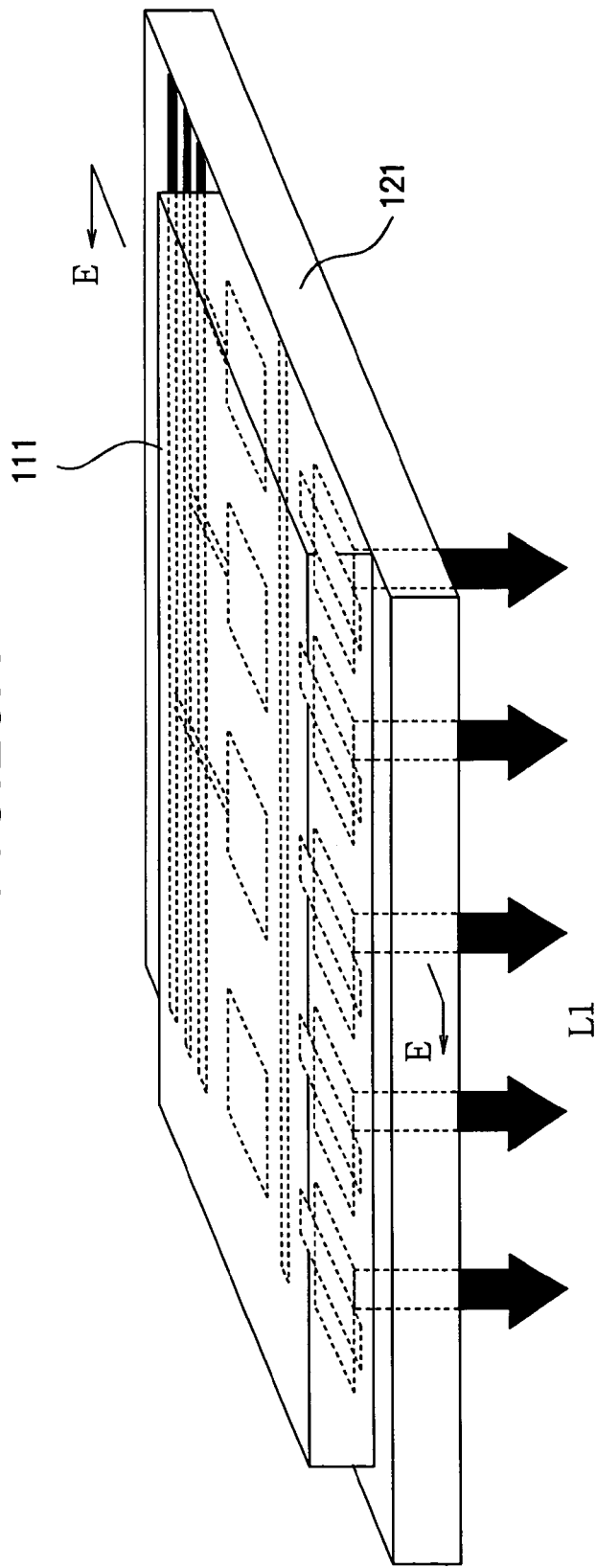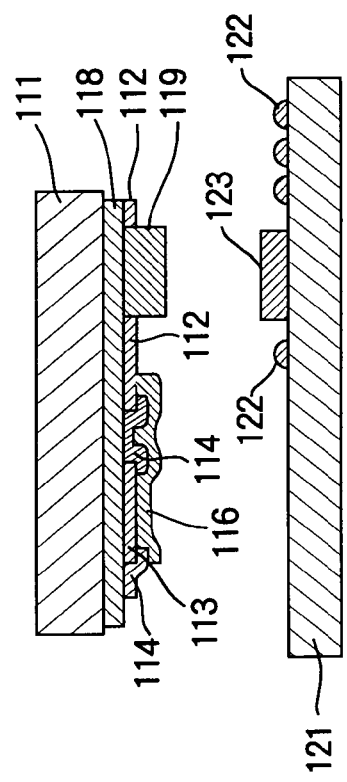
FIG.26A
FIG.26B

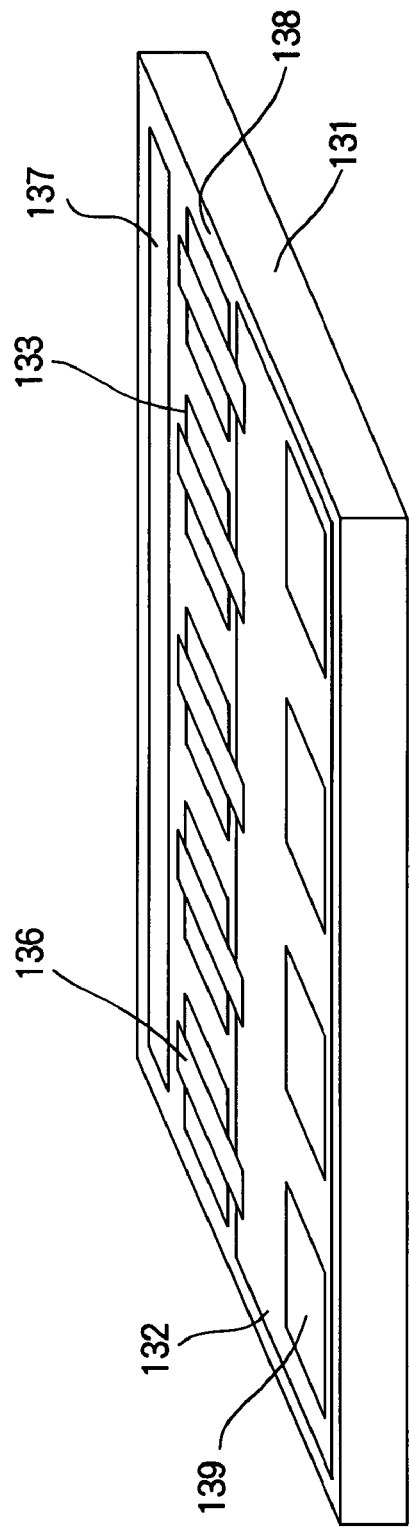
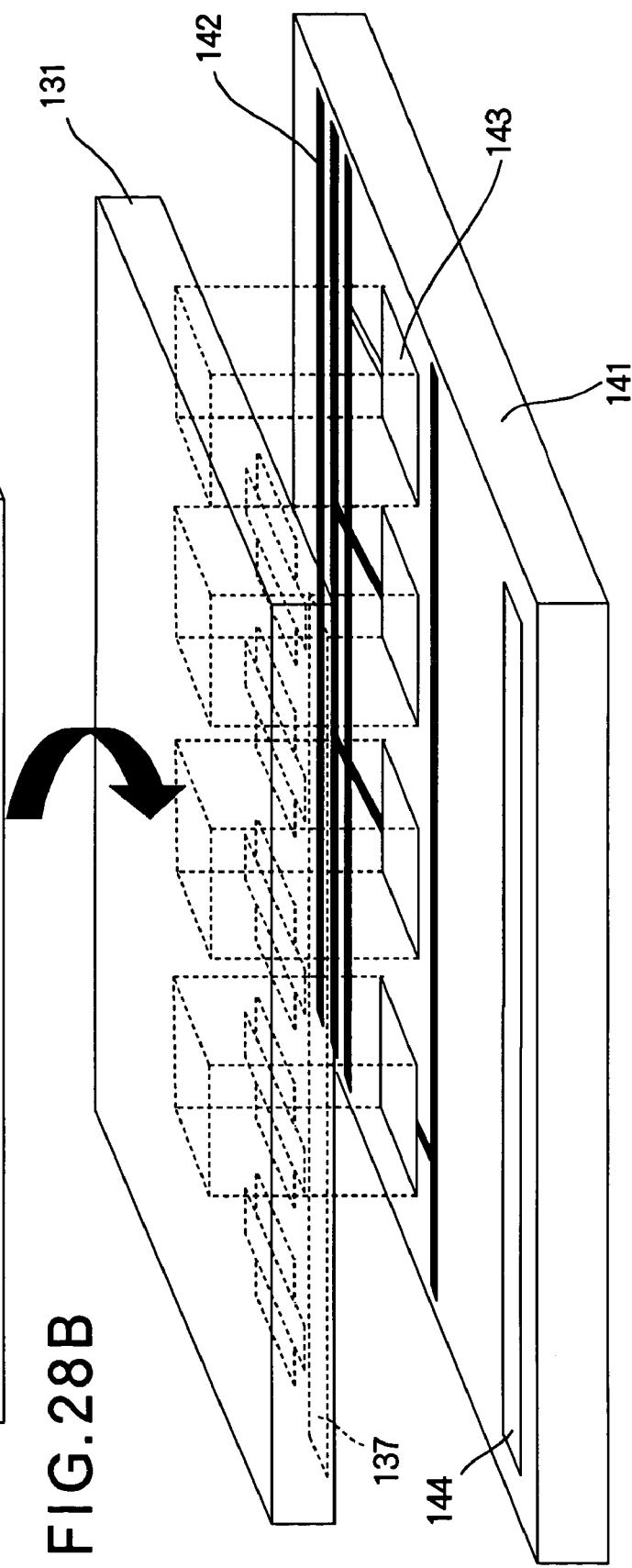
FIG.28A
FIG.28B

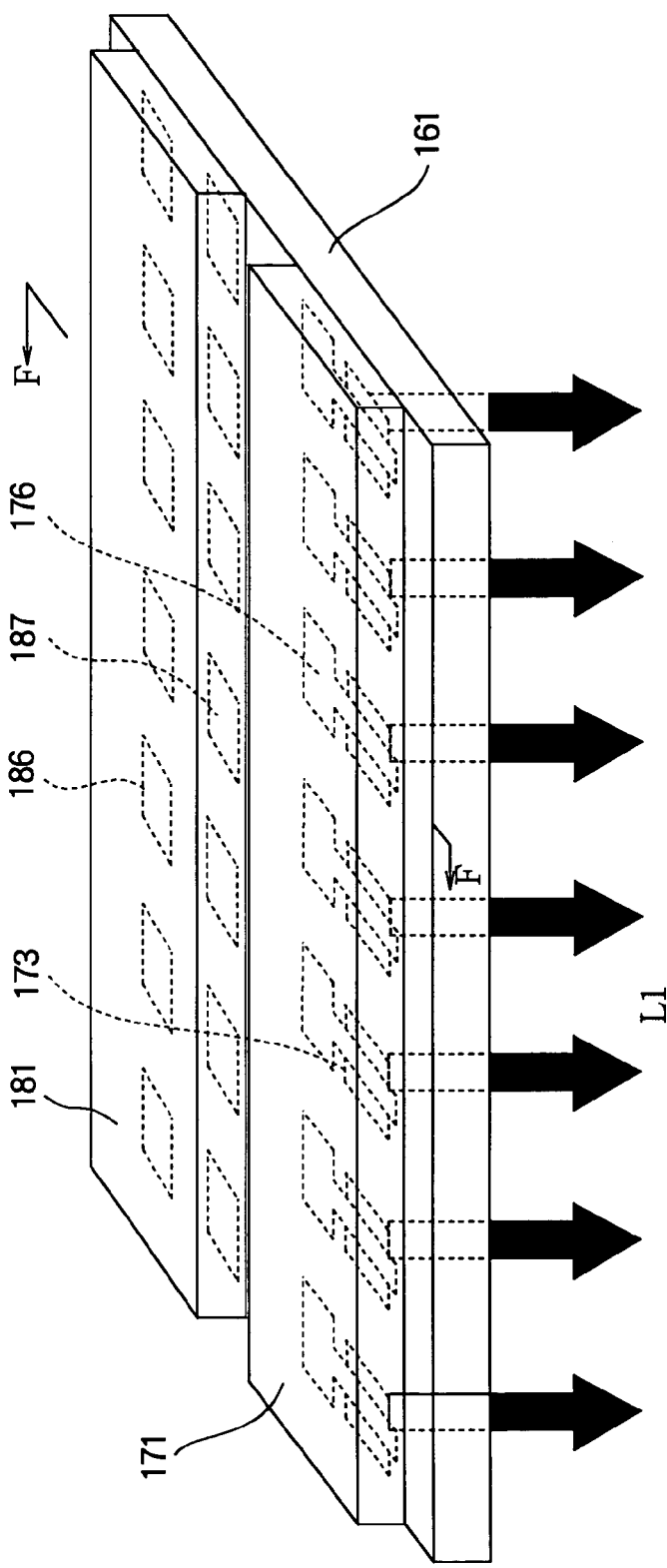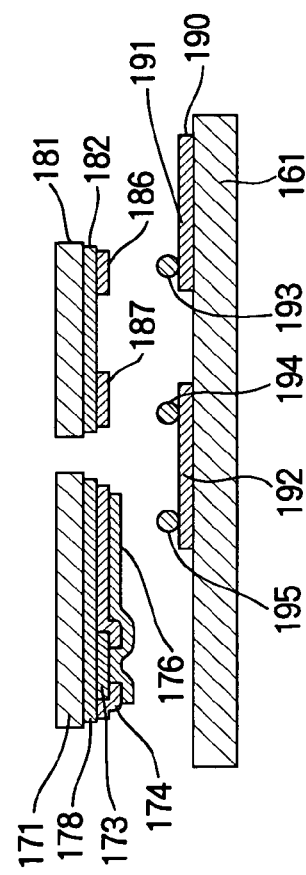

COMBINED SEMICONDUCTOR DEVICE, LED PRINT HEAD, AND IMAGE FORMING APPARATUS

BACKGROUND OF THE INVENTION

1. Field of the Invention

The present invention relates to a combined semiconductor device useful in, for example, an optical print head having an array of light-emitting diodes (LEDs).

2. Description of the Related Art

Electrophotographic printers and copiers using an array of LEDs as light sources for image formation typically have an LED unit comprising a plurality of LED array chips and their driver chips. The LED unit is one component of an LED print head that also includes a plurality of rod lenses for focusing the light emitted by the LEDs.

One conventional LED print head, shown in cross section in FIG. 37, comprises a mounting substrate 311 on which are mounted a plurality of LED array chips 312 and driver integrated circuit (IC) chips 313. These chips 312, 313 are electrically interconnected by bonding wires 314 through which driving current is supplied, and the driver IC chips 313 are electrically connected to the mounting substrate 311 by further bonding wires 315 through which control signals and power supply voltages are supplied. A lens holder 317 holds a plurality of rod-shaped lenses 318 in position above the light-emitting parts of the LED array chips 312, the lenses 318 being separated from the LED array chips 312 by a certain distance (h). The lens holder 317 also functions as an enclosure covering the LED array chips 312 and driver IC chips 313. The lenses 318 are held in place by a bead of adhesive material 319. The light emitted by the LED array chips 312 is focused by the lenses 318 onto a photosensitive drum disposed adjacent the LED print head 310. (The photosensitive drum is not shown, and only one LED array chip 312, driver IC chip 313, bonding wire 314, bonding wire 315, and lens 318 are visible.)

Another conventional LED print head (not illustrated) embeds a plurality of optical fibers in a glass base plate, extending through the glass in the thickness direction to form an optical fiber array as described in Japanese Patent No. 3156399. A row of LED array chips are mounted directly on the optical fiber array, embedded in a layer of transparent dielectric resin material. Electrodes formed on the LED array chips or metal projections formed on electrode areas on the LED array chips make contact with a conductive circuit layer which is disposed on the layer of transparent dielectric resin material.

A problem with the conventional LED print head shown in FIG. 37 is that each light-emitting element (LED) of each LED array chip 312 must have an electrode pad to which a bonding wire 314 can be connected. Wire bonding requires comparatively large pads, such as pads one hundred micrometers square (100 µm×100 µm). Referring to FIG. 38, the electrode pads 312c are much larger than the light-emitting elements 312a. The electrode pads 312c must typically be laid out in a staggered arrangement and connected to the light-emitting elements 312a by narrow electrode lines 312b, which take up further space between the front rank of electrode pads 312c. The space occupied by the electrode pads 312c is an impediment to the reduction of the size of the LED array chip 312.

Similarly, as shown in FIG. 39, a number of electrode pads equal to the number of bonding wires 314 must be provided on the surface of each driver IC chip 313 so that it can be connected by the bonding wires 314 to the driven LED array chip 312, and a number of electrode pads equal to the number of bonding wires 315 must be provided on the surface of the driver IC chip 313 so that it can be connected by the bonding wires 315 to the mounting substrate 311. The space occupied by these electrode pads is an impediment to the reduction of the size of the driver IC chip 313.

When an optical fiber array substrate is used, the electrodes or metal projections formed on the LED array chips and the matching electrodes formed in the conductive circuit layer are a similar impediment to the reduction of the sizes of the LED array chips and conductive circuit.

For the reasons described above, as long as electrode pads must be provided, there is a limit to the extent to which the chip size and material cost of the LED array chip 312 and driver IC chip 313 can be reduced. Significant reductions in material cost have been particularly difficult to achieve.

In the fabrication of the LED array chips 312, since the electrode pads 312c occupy a larger area than the light-emitting elements 312a, much more material is required for the non-light-emitting regions than for the light-emitting regions, resulting in extremely poor material usage efficiency. It has been difficult to solve this problem as long as electrode pads are provided on each chip.

To facilitate chip handling during die bonding, to avoid problems such as short-circuits between wires and chips during wire bonding, and to facilitate the formation of wire loops, the thickness of the LED array chips 312 needs to be comparable to that of the driver IC chips 313 (for example, about 300 µm to 350 µm), but this also leads to poor material usage efficiency. A sectional view of the light-emitting part of a typical LED array chip is shown in FIG. 40. A gallium arsenide phosphide (GaAsP) epitaxial layer 324 (referred to below as a GaAsP epi-layer 324) is formed on a gallium arsenide (GaAs) substrate 325, and a zinc diffusion region 321 is formed in the GaAs epi-layer 324. The zinc diffusion region 321 makes electrical contact with an electrode line 322 which is formed on an interlayer dielectric film 323 that covers the GaAs epi-layer 324 except in the area of the zinc diffusion region 321. An underside electrode 326 is formed on the lower surface of the GaAs substrate 325. Light is emitted from a pn junction at the diffusion boundary of the zinc diffusion region 321, but the zinc diffusion region 321 is only about 3 µm to 5 µm deep. In contrast, the GaAs epi-layer 324 is about 50 µm to 100 µm thick in order to reduce the defect density in the neighborhood of the pn junction, and the GaAs substrate 325 is about 250 µm to 300 µm thick in order to facilitate chip handling and match the thickness of the driver IC chip 313.

The 3-µm to 5-µm depth of the zinc diffusion region 321, which functions as the light-emitting region, is only a small fraction of the thickness of 300 µm or more of the LED array chip 312. Matching the thickness of the LED array chip 312 to the thickness of the driver IC chip 313 therefore leads to very inefficient material usage. The GaAs substrate 325 in particular is unrelated to the light-emitting function; it only supports the GaAs epi-layer 324 in which the light-emitting function resides. Nevertheless, the GaAs substrate 325 has to be several hundred micrometers thick to maintain fabrication yields and wire bonding yields, which impedes the reduction of chip thickness, material usage, and accordingly material cost.

Furthermore, the alignment between the light-emitting elements 312a and lenses 318 significantly affects the functioning and characteristics of the LED print head 310. Highly accurate alignment is required to center the lenses 318 on the optic axes of the light-emitting elements 312a in the LED array chip 312 as shown in FIG. 37 and to position the lenses 318 at the correct distance (h) from the LED array chip 312 while keeping them aligned parallel with the light-emitting elements 312a. Maintaining the necessary alignment when the lenses 318 are mounted in the lens holder 317 and the lens holder 317 is attached to the mounting substrate 311 is a difficult process requiring much time and labor.

SUMMARY OF THE INVENTION

An object of the present invention is to reduce semiconductor material costs in an LED print head.

Another object is to facilitate highly accurate alignment between light-emitting elements and lenses.

The present invention provides a combined semiconductor apparatus having a substrate, a thin semiconductor film, and a lens. The thin semiconductor film is attached to a first major surface of the substrate, either directly or by being attached to a supporting substrate which is attached to the first major surface. The thin semiconductor film includes a light-emitting element that emits light toward the first major surface of the substrate. The emitted light passes through the substrate, which is transparent to the emitted wavelength, and emerges from the second major surface of the substrate. The lens is attached to the second major surface of the substrate and focuses the emitted light. The first and second major surfaces of the substrate are flat and mutually parallel.

Instead of a single light-emitting element and a single lens, an array of light-emitting elements and an array of lenses may be attached to the substrate. Circuits for driving the light-emitting elements may also be formed on the substrate or the supporting substrate, or on a separate supporting substrate attached to the first major surface of the substrate. The light-emitting elements and the driving circuitry are interconnected by electrodes formed on the substrate and/or supporting substrate, rather than by wire bonding.

By reducing the light-emitting elements to thin semiconductor films without wire-bonding pads, the inventive combined semiconductor device saves semiconductor material and reduces associated material costs.

Eliminating the wire-bonding pads, and the need for a separate structure to hold the lenses, also reduces the size of the combined semiconductor device. When driving circuitry is placed on a supporting substrate, the size of the combined semiconductor device can be further reduced by placing interconnecting lines on the substrate, facing the driving circuitry on the supporting substrate.

The flatness and parallelism of the major surfaces of the substrate ensure that the lenses are positioned at the correct distance from the light-emitting elements, eliminating the need for a separate alignment step in this direction. Alignment in the directions parallel to the major surfaces of the substrate can be simplified by forming a trench in the second major surface and seating the lenses in the trench.

BRIEF DESCRIPTION OF THE DRAWINGS

In the attached drawings:

FIG. 20A is a plan view illustrating an exemplary supporting substrate with light-emitting elements and driving circuitry according to a third embodiment of the invention;

FIG. 20B is a sectional view through line C-C in FIG. 20A;

FIG. 21 is a schematic view showing how light from an array of light-emitting elements passes through an array of lenses and forms light spots;

FIG. 24A is a plan view illustrating another exemplary supporting substrate with light-emitting elements and driving circuitry according to the third embodiment;

FIG. 24B is a sectional view through line D-D in FIG. 24A;

FIG. 25A is a perspective view of the supporting substrate in FIG. 24A;

FIG. 25B is a perspective view illustrating face-down bonding of the supporting substrate in FIG. 25A to a transparent substrate;

FIG. 26A is a perspective view illustrating light emission after the supporting substrate in FIG. 25B has been bonded to the transparent substrate;

FIG. 26B is a partly exploded sectional view through line E-E in FIG. 26A;

FIG. 28A is a perspective view illustrating a transparent supporting substrate according to a fourth embodiment of the invention;

FIG. 28B is a perspective view illustrating face-down bonding of the transparent supporting substrate in FIG. 28A to a transparent substrate;

FIG. 32A is a perspective view illustrating a transparent substrate to which a first supporting substrate having light-emitting elements and a second supporting substrate having driving circuitry are bonded according to a fifth embodiment of the invention;

FIG. 32B is a sectional view through line F-F in FIG. 32A;

DETAILED DESCRIPTION OF THE INVENTION

Figure 1:
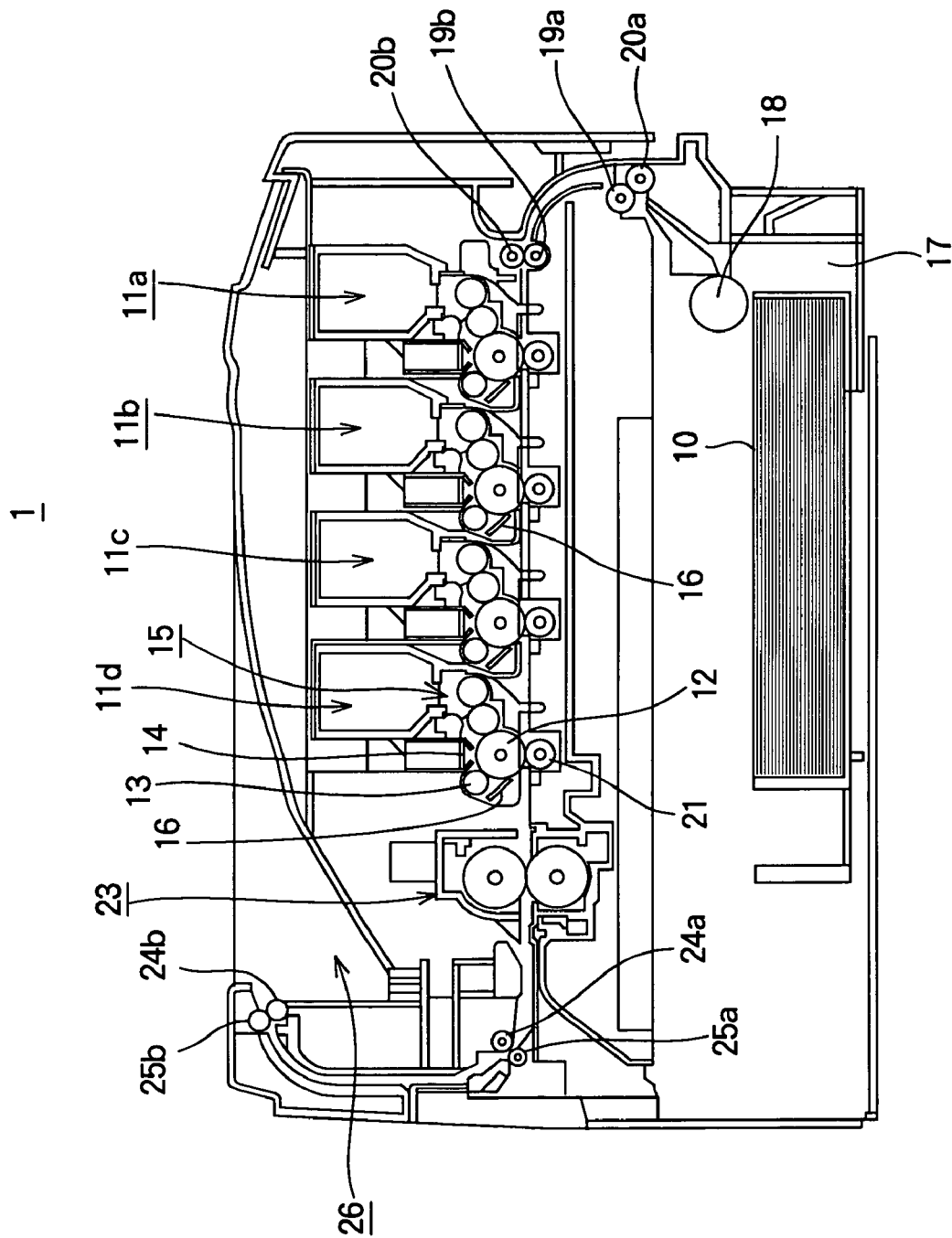
FIG. 1 is a schematic sectional view of an image forming apparatus in which the present invention can be employed.

Embodiments of the invention will now be described with reference to the attached drawings, in which like elements are generally indicated by like reference characters.

First Embodiment

Referring to FIG. 1, a first embodiment of the invention is an electrophotographic apparatus 1 for forming color images on printing media 10. The image forming apparatus 1 comprises four process units 11a-11d that form yellow, magenta, cyan, and black images, respectively. Each process unit includes a photosensitive drum 12 on which the image of the corresponding color is formed. Disposed around the photosensitive drum 12 are a charging unit 13 that supplies current to the photosensitive drum 12 to charge the surface thereof, an LED print head 14 that selectively illuminates the charged surface of the photosensitive drum 12 to form an electrostatic latent image, a developing unit 15 that supplies toner particles of the appropriate color to the surface of the photosensitive drum 12 to develop the electrostatic latent image, and a cleaning unit 16 that removes remaining toner from the photosensitive drum 12 after the developed image has been transferred to the printing media 10.

The printing media 10 are held as a stack of sheets in a cassette 17. A hopping roller 18 feeds the media 10 one sheet at a time toward a paired transport roller 19a and pinch roller 20a. After passing between these rollers, the media 10 travel to a registration roller 19b and pinch roller 20b, which feed the media toward the yellow process unit 11a. A full-color image is built up on the media 10 in four stages, the yellow process unit 11a printing a yellow image, the magenta process unit 11b a magenta image, the cyan process unit 11c a cyan image, and the black process unit 11d a black image.

In each process unit, the printing media 10 pass between the photosensitive drum 12 and a transfer roller 21 made of, for example, semi-conductive rubber. The transfer roller 21 is charged so as to create a potential difference between it and the photosensitive drum 12. The potential difference attracts the toner image from the photosensitive drum onto the printing media 10.

From the black process unit 11d, the printing media 10 travel through a fuser 23, in which a heat roller and back-up roller apply heat and pressure to fuse the transferred toner image onto the media. A first delivery roller 24a and pinch roller 25a then feed the media 10 upward to a second delivery roller 24b and pinch roller 25b, which deliver the printed media onto a stacker 26 at the top of the apparatus.

The photosensitive drums 12 and various of the rollers are driven by motors and gears not shown in the drawing. The motors are controlled by a control unit (not shown) that, for example, drives the transport roller 19a and halts the registration roller 19b until the front edge of a sheet of printing media 10 rests flush against registration roller 19b, then drives the registration roller 19b, thereby assuring that the sheet is correctly aligned during its travel through the process units 11a-11d. The control unit also controls the fuser 23 and delivery rollers 24a, 24b.

Figure 2:
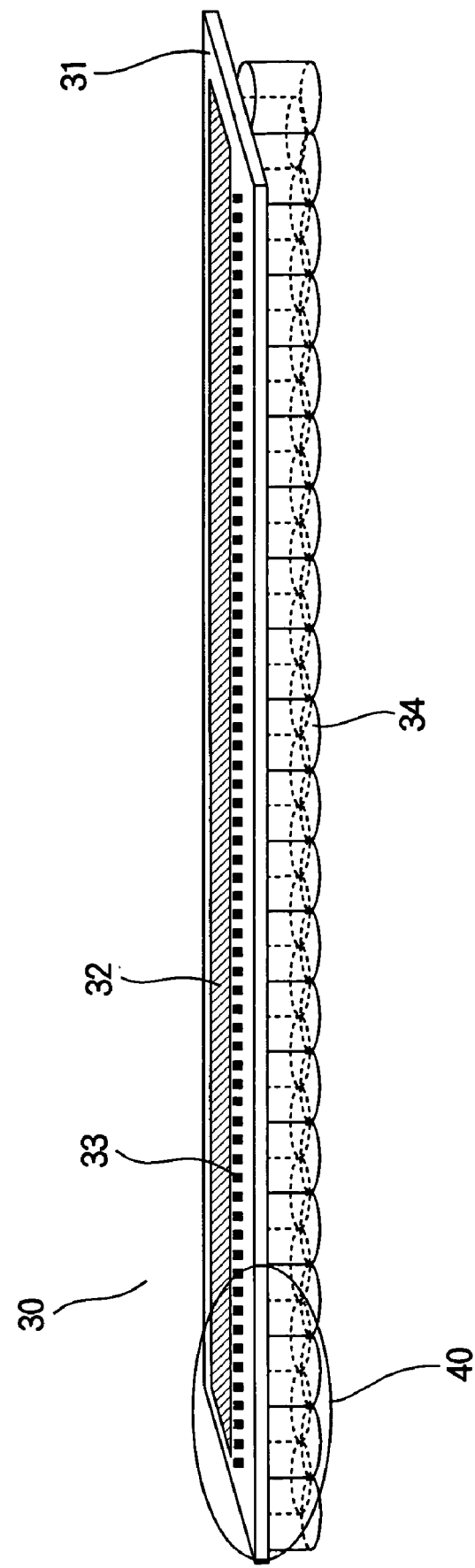
FIG. 2 is a schematic perspective view of a combined semiconductor device according to a first embodiment of the invention.

Referring to FIG. 2, each LED print head in the first embodiment includes a combined semiconductor device 30 comprising a transparent substrate 31, driving circuitry 32, a plurality of light-emitting elements 33, and a plurality of rod lenses 34. The transparent substrate 31 is a plate of a material such as glass that is transparent to the wavelength of light emitted by the light-emitting elements 33. The transparent substrate 31 has uniform thickness and flat, mutually parallel major surfaces. The driving circuitry 32 and light-emitting elements 33 are disposed on the first major surface of the transparent substrate 31 (the upper surface in FIG. 2, referred to below simply as the first surface). The rod lenses 34 are fastened to the second major surface of the transparent substrate 31 (the bottom surface in FIG. 2, referred to below simply as the second surface), and focus the light emitted by the light-emitting elements 33, as will be described later.

The driving circuitry 32 comprises, for example, polycrystalline silicon thin-film transistors (polysilicon TFTs) formed on the first surface of the transparent substrate 31 before the light-emitting elements 33 are attached thereto. Some of these transistors function as driving elements that drive the individual light-emitting elements 33. The driving circuitry 32 thus constitutes a thin semiconductor film formed on the transparent substrate 31, having driving elements that control the emission of light by the light-emitting elements 33.

The light-emitting elements 33 are attached to the first surface of the transparent substrate 31 in a linear array. Each light-emitting element 33 is a thin semiconductor film having a pn junction from which light is emitted when forward current is applied. The thin semiconductor film has a thickness of about 0.5 µm to 10 µm, and emits light from both its upper and lower surfaces. The following description of the first embodiment will assume that each of the light-emitting elements has a single light-emitting region and that the light-emitting regions of the light-emitting elements are disposed in a single line.

The rod lenses 34 focus the light emitted by the light-emitting elements 33 onto the surface of, for example, one of the photosensitive drums 12 in the electrophotographic apparatus shown in FIG. 1. The rod lenses 34 are arranged in an array generally parallel to the array of light-emitting elements. As shown in FIG. 1, the array of rod lenses 34 may be staggered. In general, a single rod lens 34 may focus light emitted by either one or a plurality of light-emitting elements 33, and the light emitted by a single light-emitting element 33 may be focused by either one or a plurality of rod lenses 34.

Figure 3:
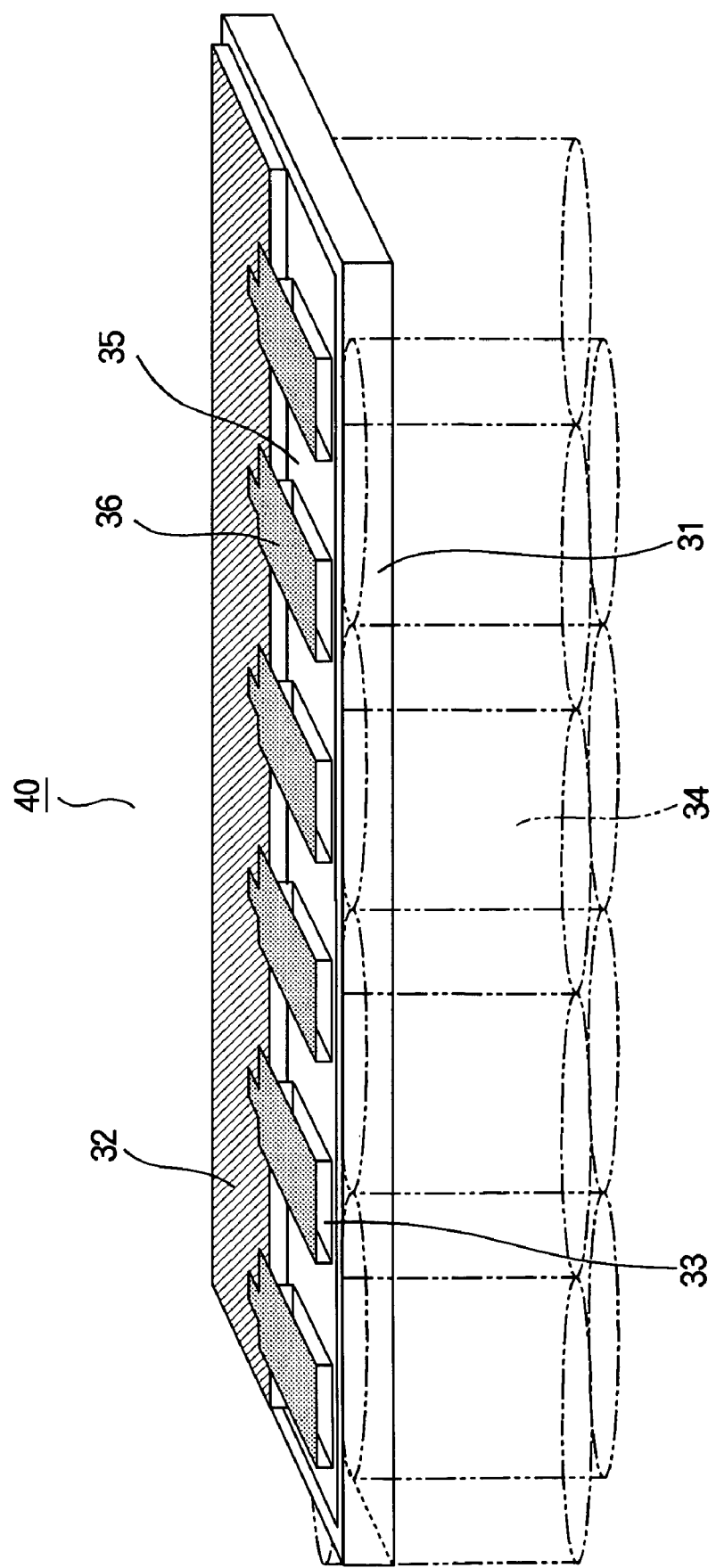
FIG. 3 is an enlarged view of an area in FIG. 2.

FIG. 3 is an enlarged view of an area 40 in the combined semiconductor device 30 shown in FIG. 2. The thickness of the transparent substrate 31 is chosen in relation to the refractive index of the glass of which the transparent substrate 31 is made so as to match the focal length of the rod lenses 34, so that by being fastened to the transparent substrate 31, the rod lenses 34 are automatically positioned correctly in the direction parallel to their optical axes, (orthogonal to the major surfaces of the transparent substrate 31), and require no positional adjustment or alignment in this direction.

The driving circuitry 32 is interconnected with the light-emitting elements 33 by a transparent conductive film 35 and a plurality of interconnecting electrodes 36. Accordingly, the interconnections between the light-emitting elements 33 and their driving circuits require no bonding wires and no bonding pads.

The transparent conductive film 35, which is made of a transparent conductive material such as indium tin oxide (ITO), is used to supply a common potential such as a ground potential to the light-emitting elements 33. The ground potential can also be supplied through suitable interconnection patterns to the driving circuitry 32. The transparent conductive film 35 may cover the entire first surface of the transparent substrate 31, as shown, or may be restricted to the areas below and between the light-emitting elements 33 and driving circuitry 32. The light-emitting elements 33 are attached to the transparent substrate 31 by being bonded to the transparent conductive film 35.

The interconnecting electrodes 36 are made of a conductive and reflective metal material. Each interconnecting electrode covers one light-emitting element 33 and extends onto an output terminal or pad (not visible) in the driving circuitry 32, from which current is supplied to drive the light-emitting element. The interconnecting electrode 36 also intercepts light emitted by the light-emitting element 33 in the upward direction in FIG. 3, so that the light is reflected back through the light-emitting element 33, transparent substrate 31, and rod lenses 34. Light emitted in both the upward and downward directions is thus ultimately delivered through the rod lenses 34 to, for example, one of the photosensitive drums 12 in FIG. 1.

Although there is no simple one-to-one or one-to-many correspondence between the light-emitting elements 33 and rod lenses 34 in FIGS. 2 and 3, the first embodiment may be modified to provide such a correspondence. When a separate lens is provided for each light-emitting element or light-emitting region, the lenses should be disposed so that each light-emitting element or region is centered on the optical axis of the corresponding lens. When a single lens covers a group of light-emitting elements or regions, the lenses should be disposed so that, for example, the optical axis of each lens passes through the center of the group. This modification also applies to second and the subsequent embodiments.

Next, an exemplary fabrication process for the combined semiconductor device shown in FIGS. 2 and 3 will be described with reference to FIG. 4, which is a perspective view illustrating an intermediate stage in the process, and FIG. 5, which is a plan view illustrating the formation of a plurality of the structures in FIG. 4.

Figure 4:
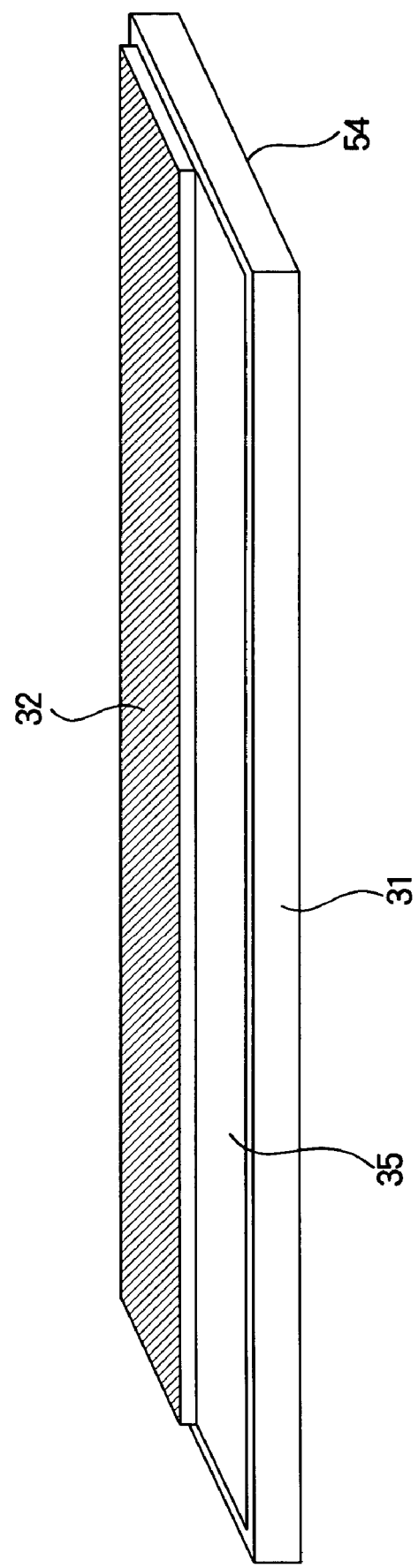
FIG. 4 is a perspective view illustrating a stage in an exemplary fabrication process for the combined semiconductor device in FIG. 2 and FIG. 3.

The structure shown in FIG. 4 includes the transparent substrate 31, transparent conductive film 35, and driving circuitry 32. The transparent substrate 31 is originally part of a large transparent (e.g., glass) plate 31a that is subdivided as in FIG. 5 to obtain a plurality of transparent substrates 31. Before the transparent plate 31a is subdivided, the transparent conductive film 35 is formed on the entire surface of the transparent plate 31a, and an amorphous silicon layer is formed on the entire surface of the transparent conductive film 35. The amorphous silicon layer is then recrystallized by an excimer laser or a continuous-wave laser to form a polysilicon layer, and the polysilicon layer is processed by well-known methods to form the thin-film transistors and other circuit elements of the driving circuitry 32. These circuit elements are formed in a plurality of predetermined regions adjacent to optical regions 37 in which the light-emitting elements will be attached later, and to dicing regions 38 in which the transparent plate 31a will be cut. In this process, electrical contact is formed between the transparent conductive film 35 and appropriate parts of the driving circuitry 32, and insulation is provided as necessary at other parts. The transparent plate 31a is then cut (diced) in the dicing regions 38 to obtain a plurality of transparent substrates 31, each having a transparent conductive film 35 on one surface, with driving circuitry 32 also formed on part of that surface. Finally, the light-emitting elements are attached to the optical regions 37.

Alternatively, the light-emitting elements may be attached to the optical regions 37 after the driving circuitry 32 has been formed, but before the transparent plate 31a is diced.

Figure 6:
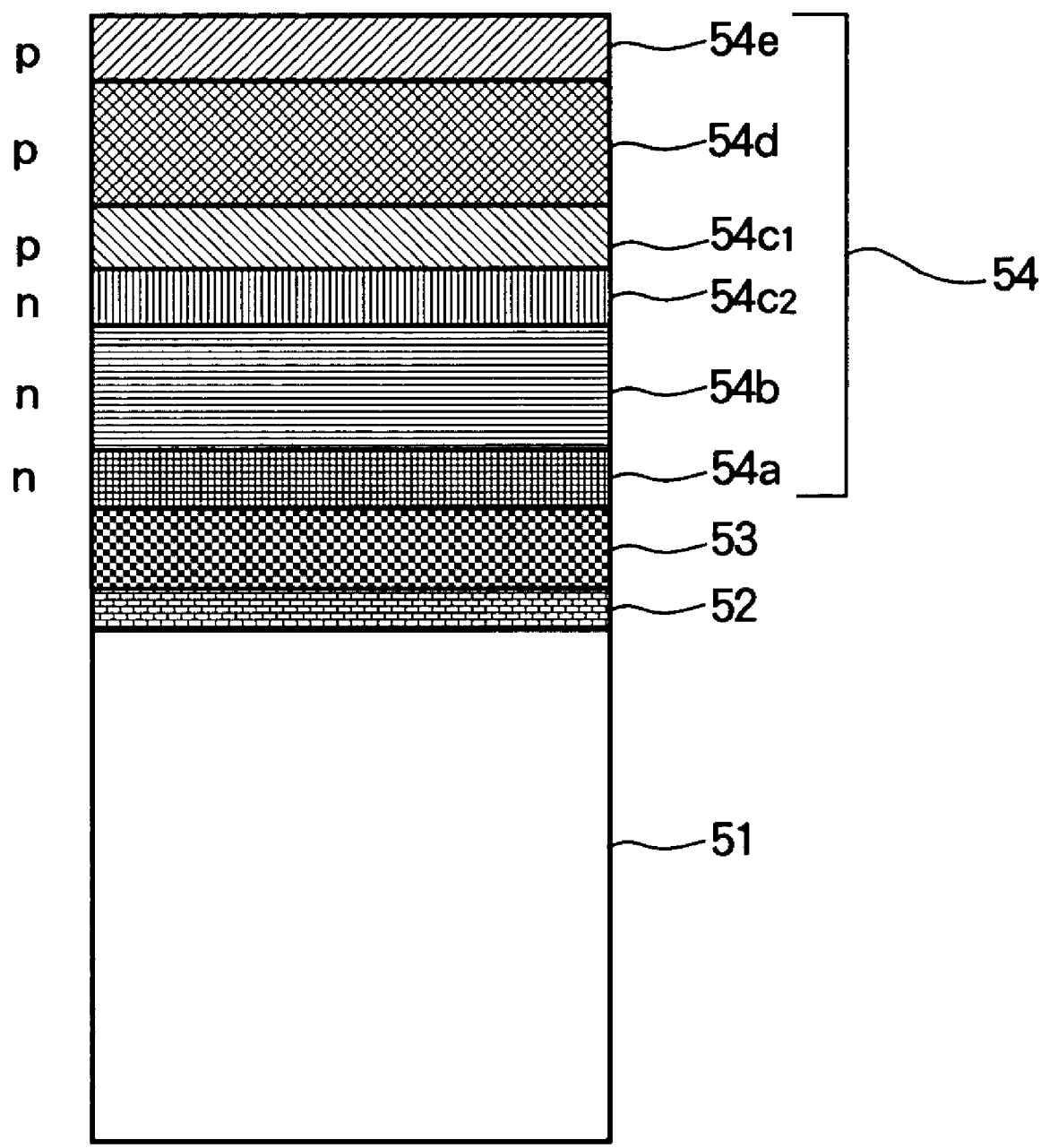
FIG. 6 is a sectional view of an exemplary semiconductor epitaxial layer having a light-emitting structure.

The light-emitting elements are formed on a separate semiconductor substrate having epitaxial layers with the structure shown, for example, in FIG. 6. The semiconductor substrate 51 and the lowest epitaxial layer or buffer layer 52 are both formed of, for example, GaAs. A separation layer 53 such as an aluminum arsenide (AlAs) layer is formed on the buffer layer 52 for use in separating the upper epitaxial layers from the semiconductor substrate 51 as will be described later.

The upper epitaxial layers form a thin semiconductor film 54 with a light-emitting structure. In FIG. 6, the upper epitaxial layers include, from bottom to top, a lower contact layer 54a of n-type GaAs, a lower cladding layer 54b of n-type $Al_xGa_{1-x}As$, a lower active layer 54c2 of n-type $Al_yGa_{1-y}As$, an upper active layer 54c1 of p-type $Al_yGa_{1-y}As$, an upper cladding layer 54d of p-type $Al_zGa_{1-z}As$, and an upper contact layer 54e of p-type GaAs. The parameters x, y, z are preferably selected so that x>y and z>y, e.g., x=0.35, y=0.15, and z=0.35. The thicknesses of the layers are, for example, 50 nm for the lower contact layer 54a, 0.5 µm for the lower cladding layer 54b, 0.5 μm for the active layer 54c, 0.5 μm for the upper cladding layer 54d, and 50 nm for the upper contact layer 54e. The active region 54c (upper active layer 54c1, lower active layer 54c2) does not necessarily need to have a stacked double layer structure comprising an n-type layer and a p-type layer, but may be a single layer formed of, for example, p-type $Al_yGa_{1-y}As$. The lower contact layer 54a and upper contact layer 54e are provided to form ohmic contacts, i.e., low resistivity contacts, with electrodes such as the transparent conductive film 35 and interconnecting electrodes 36 after attachment to the transparent substrate in the combined semiconductor device.

Next, a method of fabricating and attaching the light-emitting elements 33 shown in FIGS. 2 and 3 will be described.

Figure 7B:
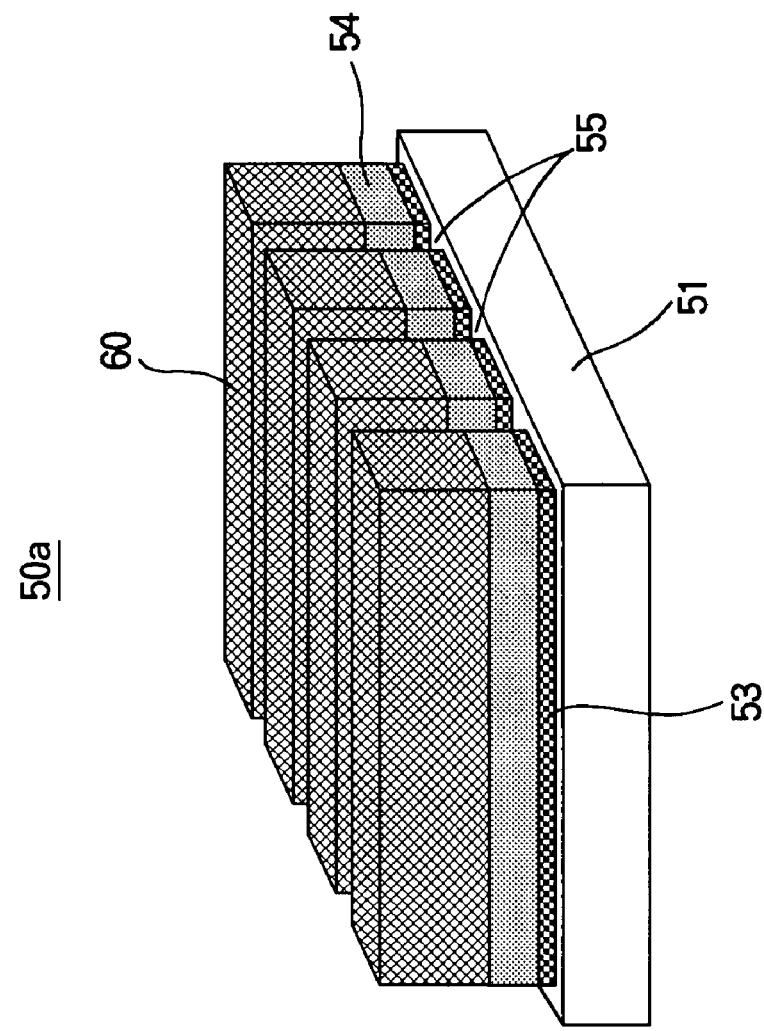
FIG. 7B is an enlarged perspective view of an area in FIG. 7A, showing additional supporting members attached to the thin semiconductor films.
Figure 7A:
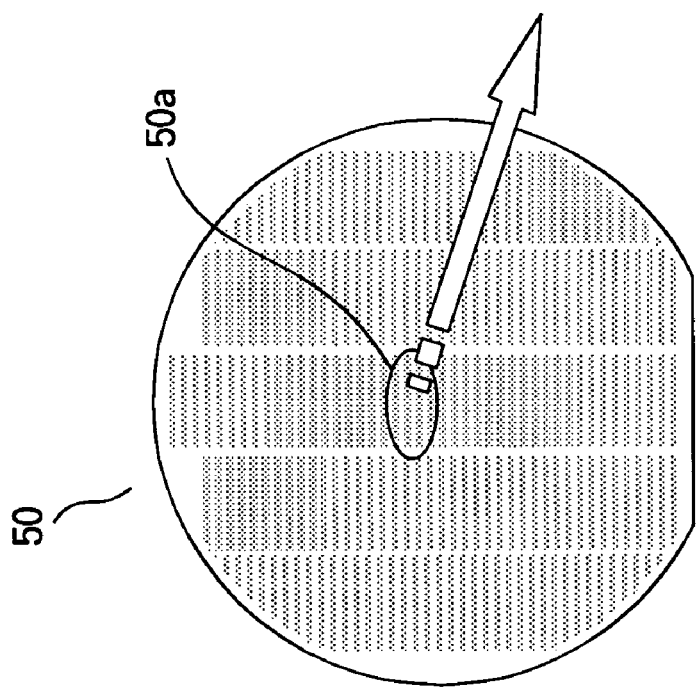
FIG. 7A is a plan view of a semiconductor wafer on which thin semiconductor films with the structure in FIG. 6 have been formed.

FIGS. 7A and 7B illustrate an exemplary step in which epitaxial layers are grown on a semiconductor substrate and divided to create thin semiconductor films that will be further subdivided to obtain the light-emitting elements 33. The semiconductor substrate 50 in FIG. 7A is, for example, a semiconductor wafer of the type on which semiconductor devices are commonly formed. The epitaxial layers comprise, for example, the layers shown in FIG. 6, including the thin semiconductor film 54 from which the light-emitting elements are obtained, the separation layer 53, and the buffer layer 52. FIG. 7B is an enlarged perspective view of the circled area 50a in FIG. 7A. The semiconductor substrate 51 in FIG. 7B is part of the larger semiconductor substrate 50 in FIG. 7A.

To obtain the structure shown in FIGS. 7A and 7B, first the buffer layer 52, separation layer 53, and thin semiconductor film 54 are epitaxially grown in this order on the entire surface of the semiconductor substrate 50; then a layer of a photoresist material is formed on the top surface, selectively exposed to light through a photomask, and developed to obtain a pattern of first supporting members 60. The AlGaAs and GaAs layers of the thin semiconductor film 54, masked by the first supporting members 60, are etched with a solution of phosphoric acid and hydrogen peroxide (phosphoric acid+hydrogen peroxide+deionized water) to divide the thin semiconductor film 54 into individual parts disposed below the first supporting members 60. As a result, a plurality of etched trenches 55 are formed. This etching step proceeds at least far enough to expose the separation layer 53, and may proceed through the separation layer 53 and buffer layer 52, as shown. Each part of the divided thin semiconductor film 54 will be referred to as a thin semiconductor film chip.

Figure 8:
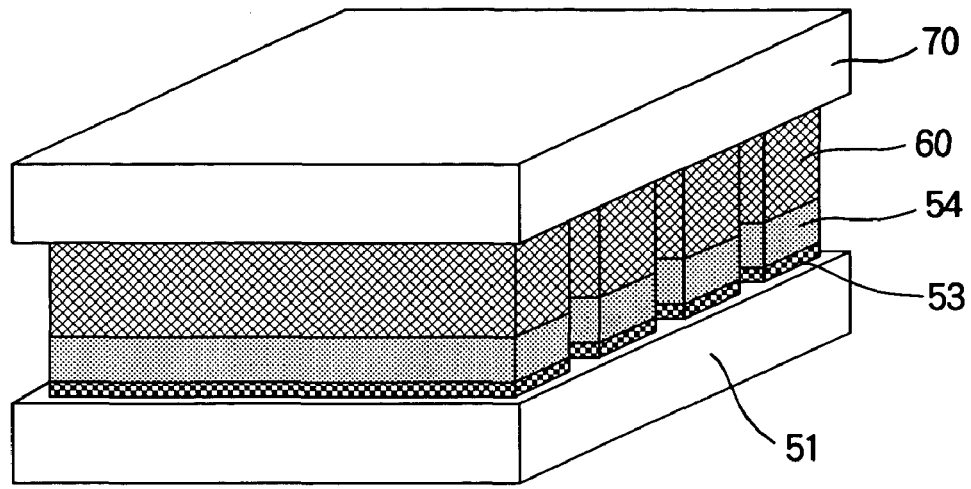
FIG. 8 is a perspective view illustrating an exemplary step in which a second supporting member is formed, joining the supporting members shown in FIG. 7B.

FIG. 8 illustrates an exemplary step in which a second supporting member 70 mutually connecting the plurality of first supporting members 60 is formed on the semiconductor epitaxial layer that has been formed on the semiconductor substrate. The second supporting member 70 is, for example, a dry film resist (a photosensitive polymer film) attached to the surfaces of the first supporting members 60 to prevent the thin semiconductor film chips 54f from scattering when, as will be described later, the thin semiconductor film 54 is separated from the substrate. A dry film resist can be laminated onto the first supporting members 60 by applying heat and pressure, and can be selectively removed by being exposed to light and developed. After formation of the second supporting member 70, the structure shown in FIG. 8 is dipped in, for example, a 10% hydrofluoric acid (HF) solution for an appropriate time. The separation layer 53 is selectively etched because its HF etching speed is much faster than that of the thin semiconductor film 54.

Figure 9:
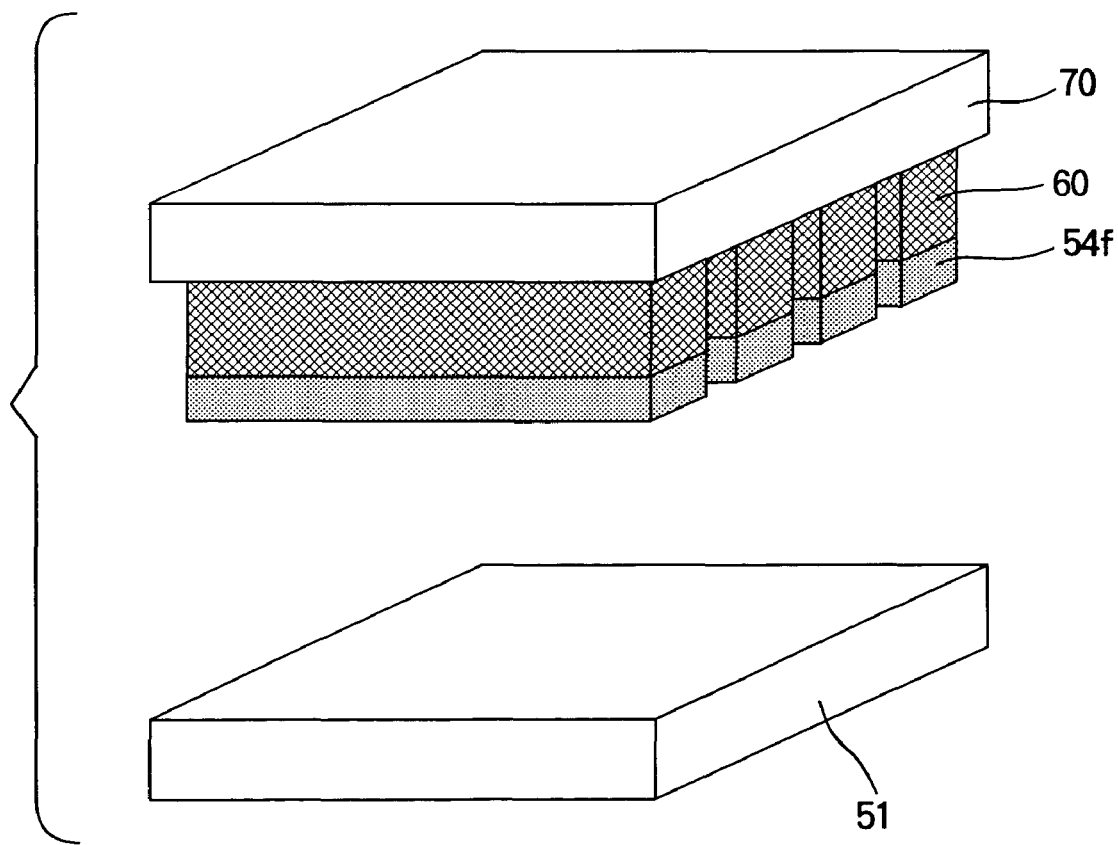
FIG. 9 is a perspective view illustrating an exemplary step in which the structure including the thin semiconductor films and the supporting members has been separated from the semiconductor wafer.

FIG. 9 illustrates the stage at which the structure including the second supporting member 70, first supporting members 60, and thin semiconductor film chips 54f has been separated from the semiconductor substrate 51. After being separated from the semiconductor substrate 51, the structure is transported to and temporarily placed on a different substrate (not shown) such as a silicon substrate, the second supporting member 70 being held in a suitable fixture (not shown).

Figure 10:
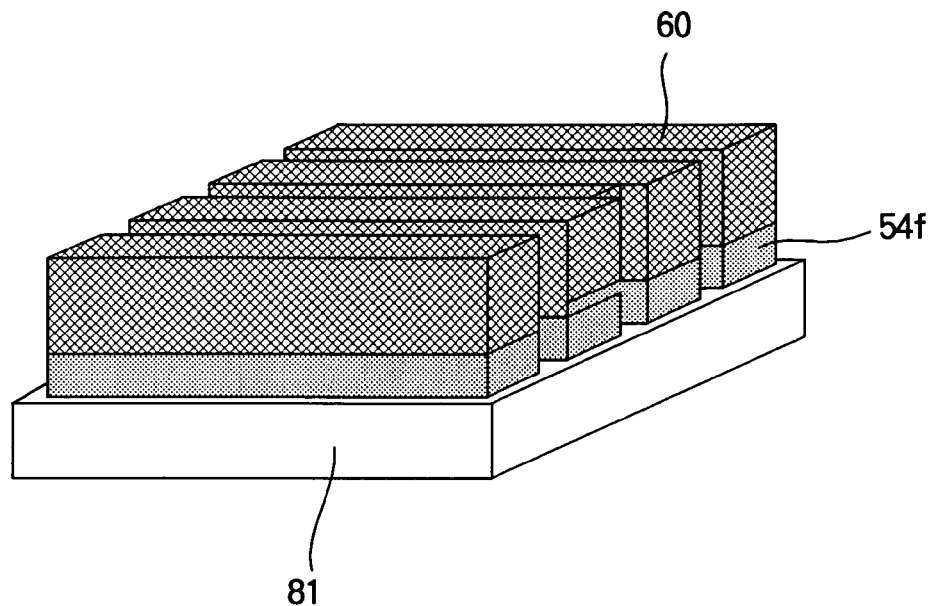
FIG. 10 is a perspective view illustrating an exemplary step in which the thin semiconductor films and supporting members have been placed temporarily on another substrate.

FIG. 10 shows the thin semiconductor film chips 54f and first supporting members 60 resting on the temporary substrate 81. The second supporting member 70 is removed by selective etching after the structure shown in FIG. 9 is placed on the temporary substrate 81.

Figure 5:
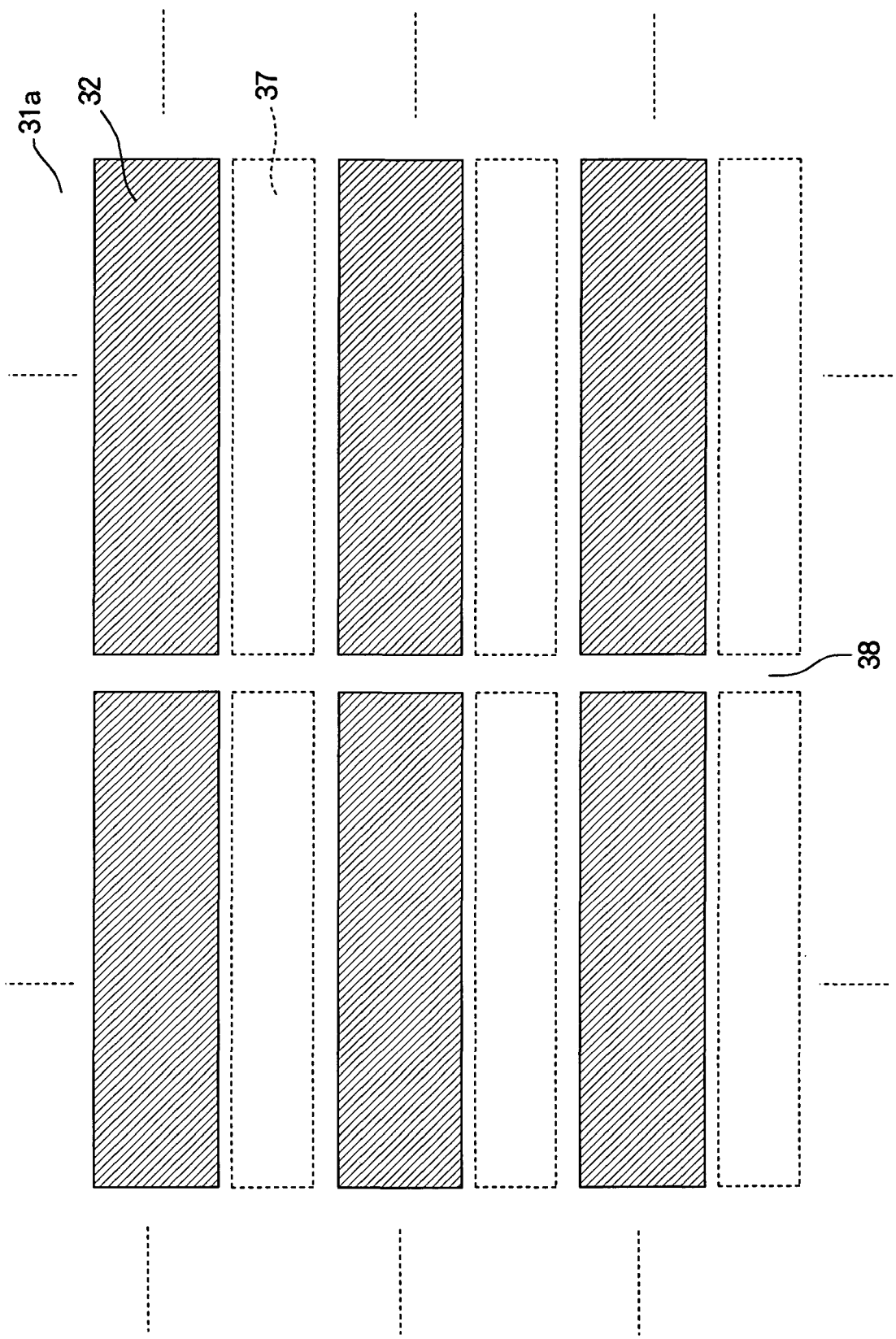
FIG. 5 is a plan view illustrating the formation of a plurality of the structures in FIG. 4 on a glass substrate.
Figure 11:
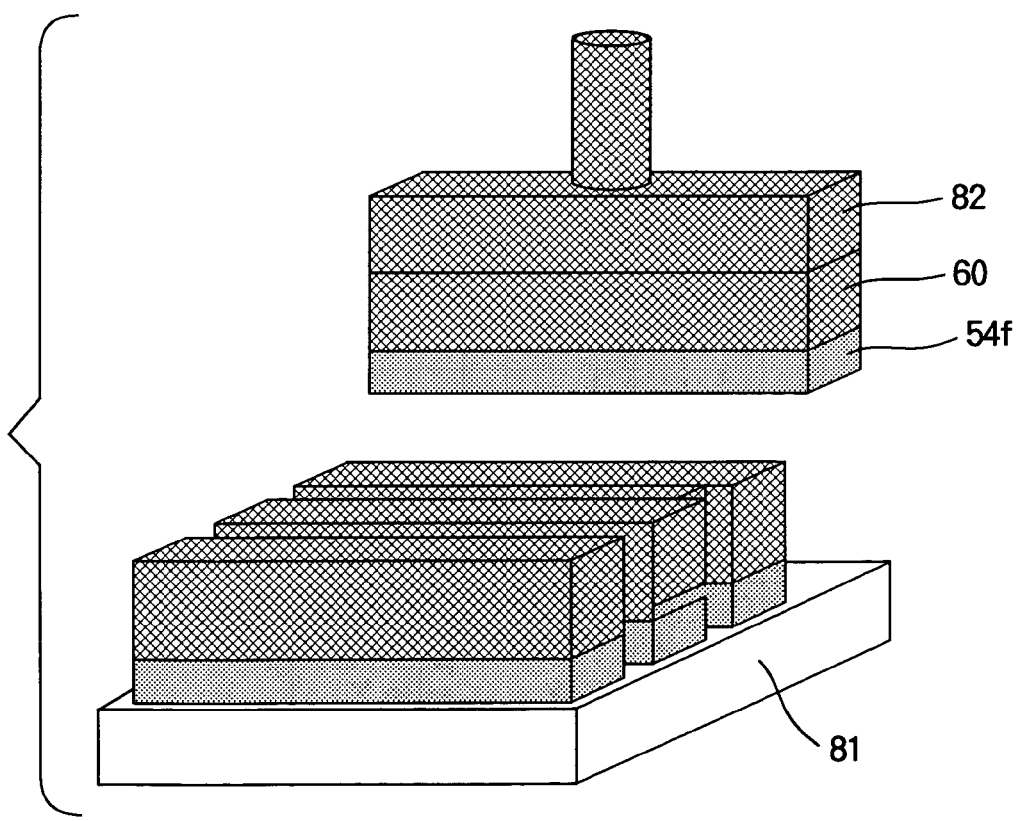
FIG. 11 is a perspective view illustrating a step in which the thin semiconductor films are picked up one by one from the temporary substrate.

Next, the plurality of thin semiconductor film chips 54f and first supporting members 60 on the temporary substrate 81 are picked up one by one using a holding tool 82 as shown in FIG. 11 and transferred to, for example, the optical region 37 of the transparent substrate 31 shown in FIG. 5. The result is partially shown in FIG. 12. The entire transparent substrate 31 has a more elongate shape than shown in FIG. 12 and may accommodate more than three thin semiconductor film chips 54f. The thin semiconductor film chips 54f are aligned longitudinally in a single row. The transparent conductive film 35 and driving circuitry 32 have already been formed on the transparent substrate 31 as described in connection with FIGS. 4 and 5. The pairs of thin semiconductor film chips 54f and first supporting members 60 are attached to the transparent substrate 31 by applying pressure and heat as necessary to achieve tight bonding by intermolecular forces.

After the pairs of thin semiconductor film chips 54f and first supporting members 60 are attached to the transparent substrate 31, the first supporting members 60 are removed. This removal may be accomplished by dipping the device in a solvent that decomposes or dissolves the first supporting members 60, or by dipping the device in a remover that enables the first supporting members 60 to be stripped away from the thin semiconductor film chips 54f.

Figure 13:
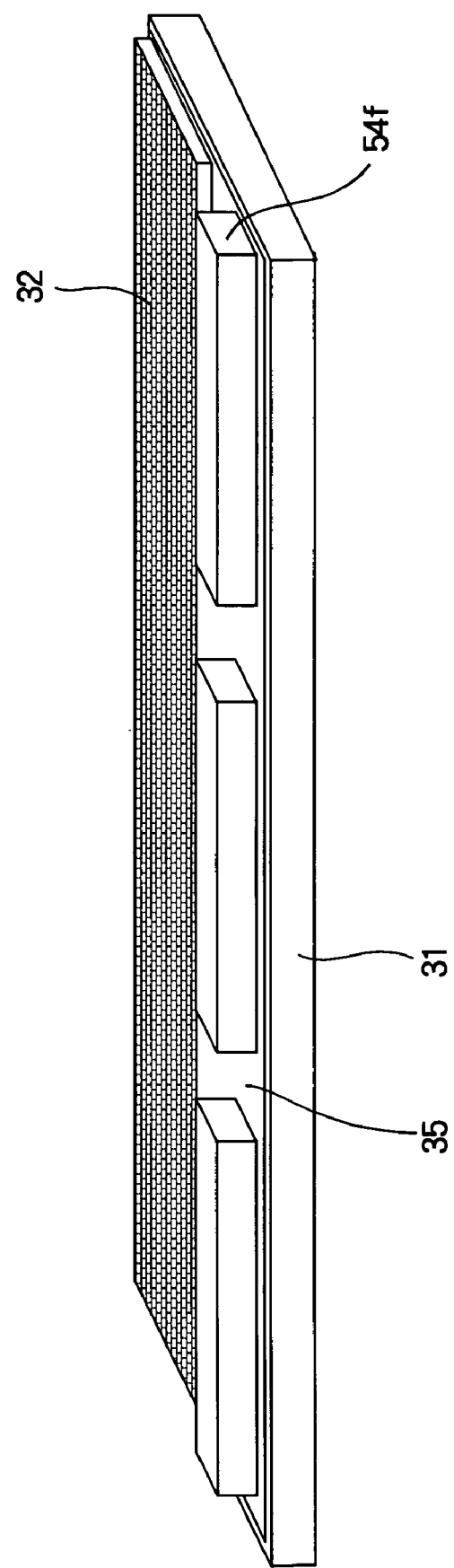
FIG. 13 is a perspective view illustrating the removal of the supporting members from the thin semiconductor films attached to the transparent substrate.
Figure 14:
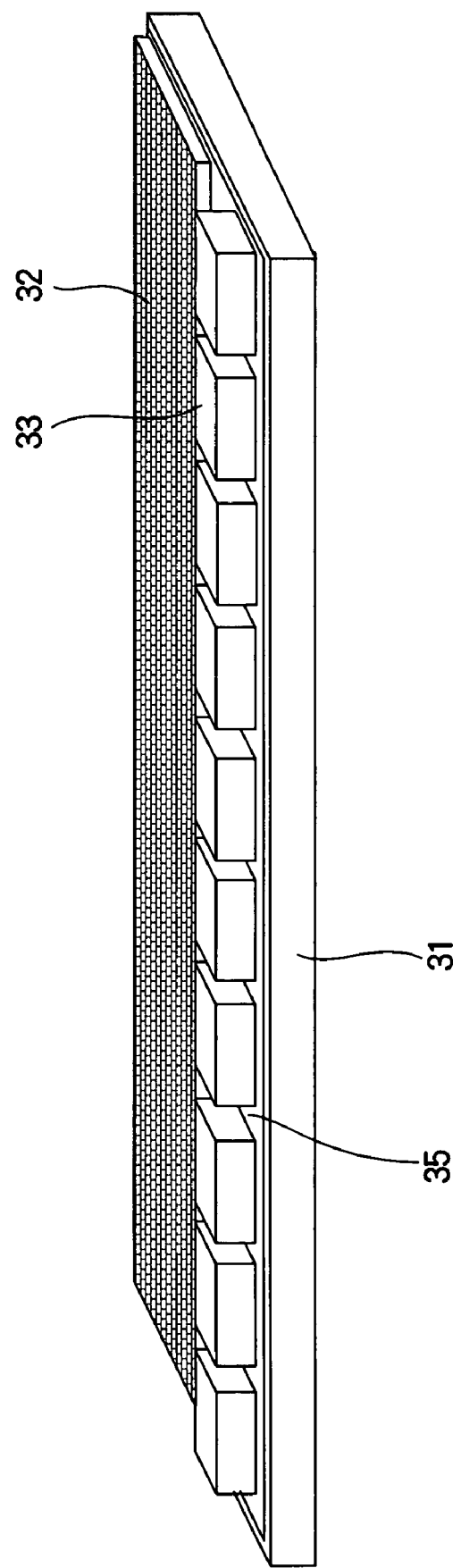
FIG. 14 is a perspective view illustrating the division of the thin semiconductor films on the transparent substrate into individual light-emitting elements.

FIG. 13 illustrates the stage at which the first supporting members 60 have been removed from the thin semiconductor film chips 54f on the transparent substrate 31. Each of the thin semiconductor film chips 54f on the transparent substrate 31 is now divided into equal-sized parts so as obtain the light-emitting elements 33 shown in FIG. 3. To isolate the elements, conventional photolithographic processes including photoresist coating, pattern exposure using masks (pattern transfer), developing, etching, and photoresist removal are performed. In the etching process, for example, a phosphoric acid/hydrogen peroxide solution can be used to form the isolation regions between the light-emitting elements. FIG. 14 illustrates the stage at which each thin semiconductor film chip on the transparent substrate 31 has been divided into individual light-emitting elements 33.

Figure 15A:
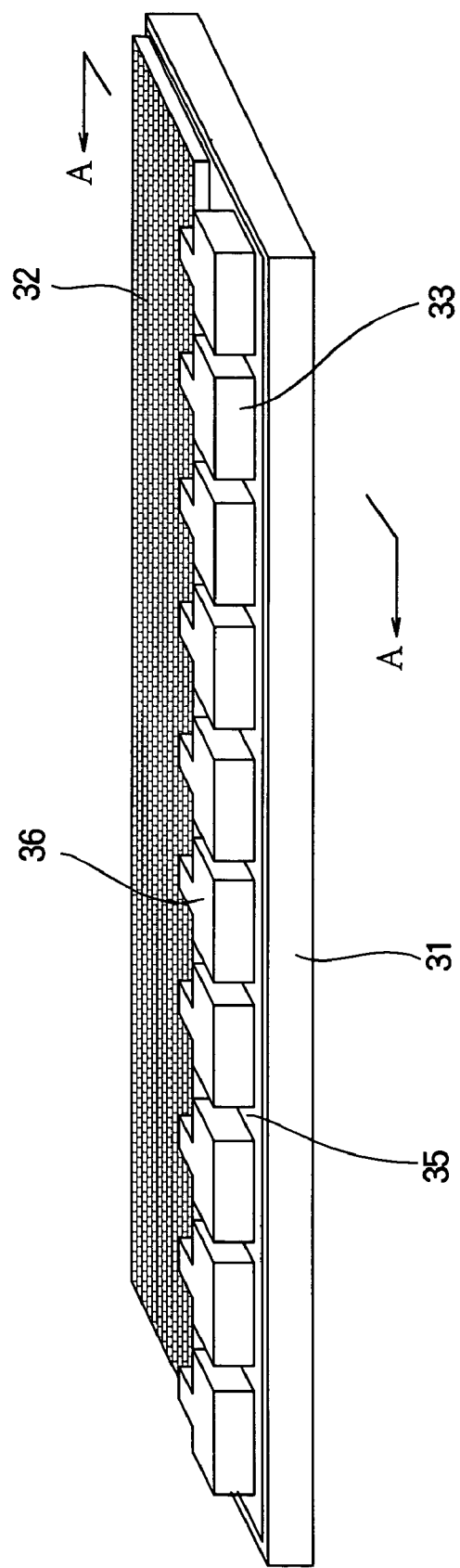
FIG. 15A is a perspective view illustrating the formation of electrodes connecting the light-emitting elements to driving circuitry on the transparent substrate.
Figure 15B:
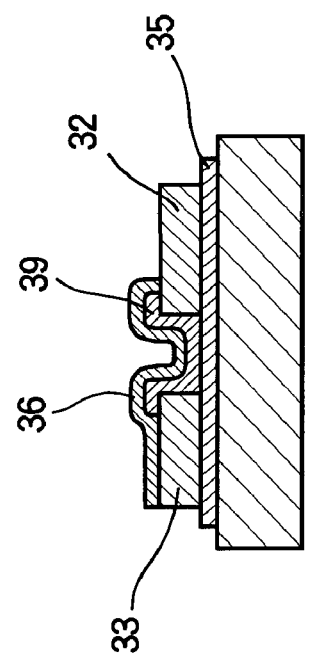
FIG. 15B is a sectional view through line A-A in FIG. 15A.

Next, the interconnecting electrodes 36 are formed to provide conductive connections between the upper surfaces of the light-emitting elements 33, as shown in a perspective view in FIG. 15A and a sectional view in FIG. 15B, FIG. 15B showing a section through line A-A in FIG. 15A. Conventional photolithographic processes can be used to form the interconnecting electrodes 36, because both the light-emitting elements 33 and driving circuitry 32 are thin films. The interconnecting electrodes can easily be formed from a metal film by using, for example, the lift-off method, which is a type of photolithographic process and includes steps such as photoresist coating, exposure, developing, conductive layer formation, and photoresist removal. Among the metal films that may be used for the interconnecting electrodes are films including gold, such as a multilayer film with titanium, platinum, and gold layers (a Ti/Pt/Au film), a multilayer film with nickel, germanium, and gold layers (an Ni/Ge/Au film), a single-layer gold-tin film (an AuSn film), or a single-layer gold-zinc film (an AuZn film), and films including aluminum, such as a single-layer aluminum film or a multilayer film with nickel and aluminum layers (an Ni/Al film), and various combinations of these films.

As shown in FIGS. 15A and 15B, the interconnecting electrodes 36 are formed after an interlayer dielectric film 39 has been formed on the transparent conductive film 35. The interlayer dielectric film 39 has openings through which the interconnecting electrodes 36 make electrical contact with the driving circuitry 32 and light-emitting elements 33. It is preferable for each interconnecting electrode 36 to cover the entire light-emitting region of the light-emitting element 33, thereby improving light emission efficiency by reflecting emitted light back toward the transparent substrate. Alternatively, after the interconnecting electrodes have been formed, an intermediate insulating layer or interlayer dielectric film may be deposited; then the light-emitting regions of the light-emitting elements may be covered with a separate light-reflecting layer such as, for example, a layer of metal.

Subsequently, as was shown in FIG. 3, the rod lenses 34 are fastened in tight contact with the second surface of the transparent substrate 31 using, for example, an adhesive, so that, for example, the optical axes of the rod lenses 34 are normal to the major surfaces of the transparent substrate 31.

In the first embodiment as described above, a semiconductor layer including $Al_xGa_{1-x}As$ ($0 \leq x \leq 1$), having an emission wavelength band of about 650 nm to 850 nm, has been described as an exemplary thin semiconductor film used for the light-emitting element 33, but light-emitting semiconductor materials having a different wavelength may be used as the thin semiconductor film: for example, materials including gallium nitride (GaN), aluminum indium gallium phosphide (AlInGaP), or indium gallium arsenide phosphide (InGaAsP) may be used.

In a variation of the first embodiment, the combined semiconductor device 30 has only a single light-emitting element and a single driver element, both disposed on the first surface of the transparent substrate, with a single lens provided on the second surface of the same transparent substrate.

In the description above, the lower side (the side facing the transparent substrate 31) of each light-emitting element 33 is connected to the transparent conductive film 35 and used as a common electrode (ground electrode) while the upper side (facing the interconnecting electrode 36) is used as an individually driven electrode, but the lower side of each light-emitting element 33 may be used as the individually driven electrode and the upper side as the common (ground) electrode.

The invention is not limited to any particular method of driving the array of light-emitting elements. Instead of the driving scheme described above, for example, a matrix driving scheme may be used by dividing the array into segments, providing a separate common electrode for each segment, and having each interconnecting electrode span the segments to drive one light-emitting element in each segment.

The combined semiconductor device of the first embodiment as described above constitutes the main part of the LED print head in an image forming apparatus. It includes both a group of thin-film driver elements and a group of thin-film light-emitting elements disposed on the first surface of a transparent substrate, the light-emitting elements being electrically connected to the corresponding driver elements by individual electrodes and other interconnection patterns formed on the thin-film elements and the transparent substrate. Accordingly, it is not necessary to provide the electrode pads that are conventionally placed near the light-emitting elements to connect the light-emitting elements to the driver elements by bonding wires, and near the driver elements to connect to the driver elements to the light-emitting elements and to conductive patterns on the substrate. As a result, since no space is taken up on the substrate by wire bonding electrode pads, and no space need be provided for bonding wires, the semiconductor device can be made smaller and the material costs of the substrate and thin semiconductor films can be reduced.

In the first embodiment, since the rod lenses are fastened to the second surface opposite of the transparent substrate, no lens holder is needed to hold the rod lens array, no space is needed for holding the rod lenses in the lens holder, and no clamp is needed to secure the structural elements including the lens holder to the substrate. Therefore, the semiconductor device can be made still smaller and material costs associated with the holder, clamp, and so on can be reduced.

In the first embodiment, the rod lenses are fastened with an adhesive or the like on the second surface of the transparent substrate. The transparent substrate has a constant thickness and its first and second surfaces are highly parallel and have a high degree of flatness, so the optical axis of each of the lenses can be accurately aligned with the optical axes of the light-emitting elements. The light emitted by the light-emitting elements is thus directed through a transparent substrate having a predetermined thickness to lenses aligned parallel with the thin-film light-emitting elements, disposed at a distance from the light-emitting elements that depends on the thickness of the transparent substrate and the planarity of its first and second surfaces. Consequently, the distance between the light-emitting elements and lenses can be controlled precisely; the stability of the positions to which light emitted from the light-emitting elements is focused can be maintained with extremely high precision; and the light-emitting elements and lenses can be aligned easily and with high precision.

Second Embodiment

In the first embodiment described above, a smaller semiconductor device is obtained by attaching thin-film light-emitting elements and thin-film driver elements to a transparent substrate and interconnecting them by means of electrodes, thereby eliminating the necessity of providing large wire bonding pads and bonding wires for both elements. Since the light-emitting elements are attached to the transparent substrate after the driver elements have already been formed, however, if the attachment of any one of the light-emitting elements fails, the entire device, including the transparent substrate and the driver elements, becomes defective. A possible consequence is reduced fabrication yields. In the second embodiment, described below, the light-emitting elements are attached to a supporting substrate separate from the transparent substrate and then the two substrates are bonded together, thereby limiting the impact of the quality of the attachment of the light-emitting elements on the quality of the combined semiconductor device.

Figure 16:
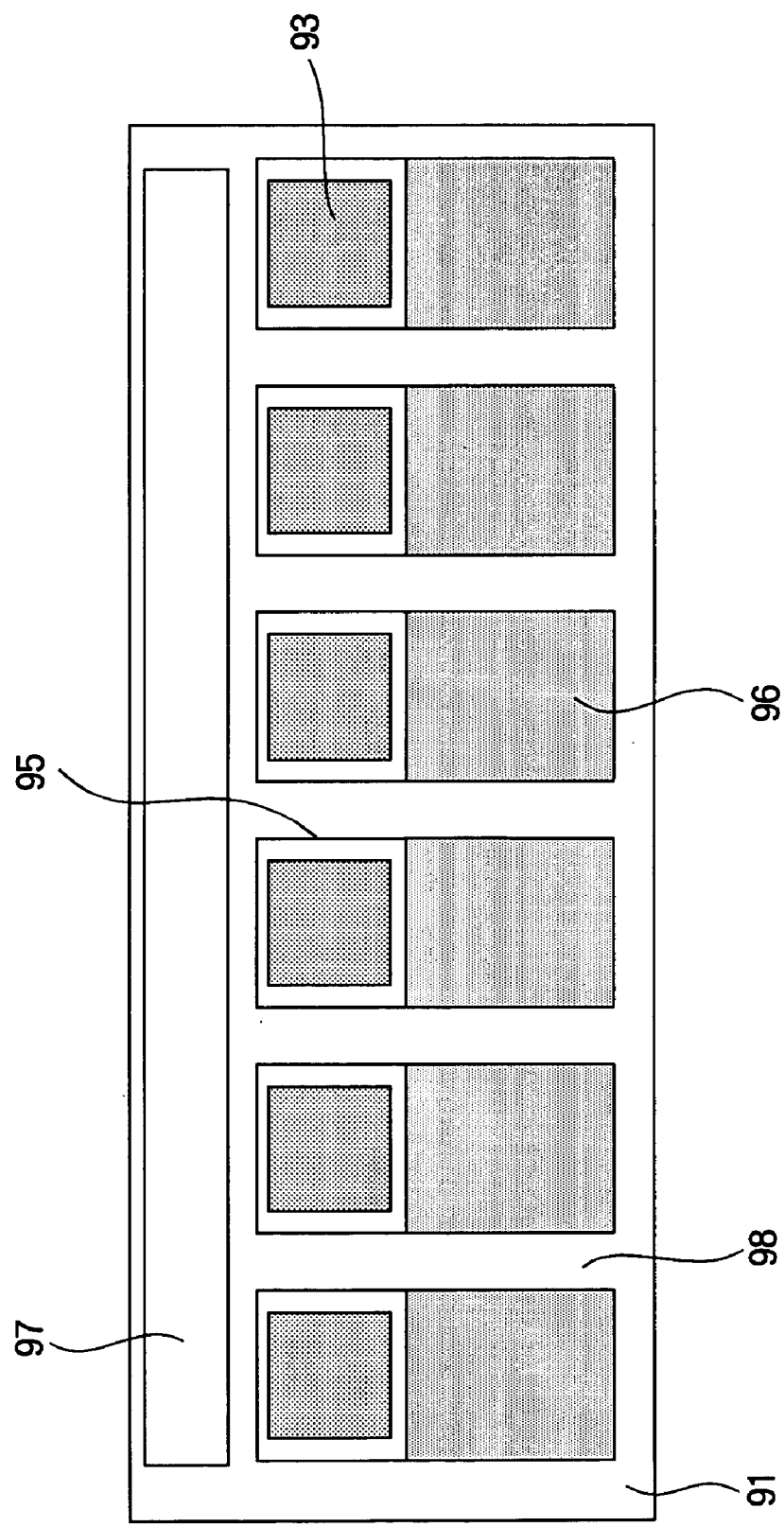
FIG. 16 is a plan view illustrating a supporting substrate to which the light-emitting elements are bonded in a second embodiment of the invention.

FIG. 16 is a plan view illustrating a supporting substrate to which the light-emitting elements are bonded. The supporting substrate 91 is, for example, a silicon (Si) substrate. The surface to which the light-emitting elements are bonded is coated with a metal layer 98, which functions as a reflective film that reflects the light emitted by the light-emitting elements. The metal layer 98 may be a single layer or multi-layer film comprising one or more metal materials such as palladium, platinum, germanium, nickel, gold, tin, and indium, or a multi-layer film comprising a single layer or multi-layer of one or more of the above materials and a layer of a material such as chrome, titanium, or the like.

The light-emitting elements 93 are similar to the light-emitting elements in the first embodiment, having light-emitting structures formed in a thin semiconductor film about 1.5 μm thick. The light-emitting elements 93 can be formed and bonded to the supporting substrate 91 by the same methods as in the first embodiment, so repeated descriptions will be omitted. The thin semiconductor film chips described in the first embodiment may be bonded one by one to the metal layer 98 on the surface of the supporting substrate 91 by the method illustrated in FIGS. 9 to 14, for example. The light-emitting elements are formed principally from AlGaAs materials, as in the first embodiment: for example, a layer of semiconductor $Al_xGa_{1-x}As$ may be used together with a layer of $(Al_yGa_{1-x})_yIn_{1-y}P$. Alternatively, a thin semiconductor film with layers of other semiconductor materials such as, for example, GaN/InGaN, AlInN, or the like, may be used.

After the light-emitting elements 93 have been bonded, an interlayer dielectric film, transparent conductive films 95, individual electrode pads 96, and a common electrode pad 97 are formed on the supporting substrate 91. The interlayer dielectric film (shown in FIG. 18B) has openings above the light-emitting elements 93 and common electrode pad 97. The transparent conductive films 95 electrically couple the light-emitting elements 93 to the individual electrode pads 96. The individual electrode pads 96 are formed on the transparent conductive films 95, which are formed on the interlayer dielectric film but make electrical contact with the light-emitting elements 93 through the openings in the interlayer dielectric film.

The transparent conductive films 95 comprise, for example, indium tin oxide (ITO), which is conductive and is transparent to the wavelength of emitted light. Each transparent conductive film 95 functions as an individual electrode for one light-emitting element 93. The transparent conductive films 95 are formed on the light-emitting surfaces of the light-emitting elements to form transparent conductive connections between these surfaces and the driving circuitry on the transparent substrate to which the supporting substrate will be bonded. The light output surfaces of the light-emitting elements are connected to the driving circuitry through the transparent conductive films 95, the individual electrode pads 96, and electrode pads to which the individual electrode pads 96 will be bonded on the transparent substrate.

Each individual electrode pad 96 is, for example, a multi-layer film having a top surface of gold, such as a Ti/Pt/Au, Ni/Ge/Au, AuZn/Au, or AuSn/Au film, or a top surface of aluminum, such as a single-layer aluminum film or a multi-layer Ni/Al or Ti/Al film. Whereas a conventional wire bonding pad must have a relatively large area such as 100 μm×100 μm or 100 μm×80 μm, the size of the individual electrode pads 96 can be smaller, such as 25 μm to 30 μm square.

The common electrode pad 97 parallels the row of light-emitting elements 93. The common electrode pad 97 is a multi-layer film having a top surface of gold, such as an AuZn/Au or AuSn/Au film, or a top surface of aluminum, such as a single-layer aluminum film or an Ni/Al or Ti/Al film. The common electrode pad 97 is formed on the metal layer 98, and is electrically connected to the common electrode (ground electrode) of each light-emitting element 93. The common electrode pad 97 can also be smaller than a conventional electrode pad: for example, from 25 μm to 30 μm in width instead of the conventional 100 μm.

Figure 17A:
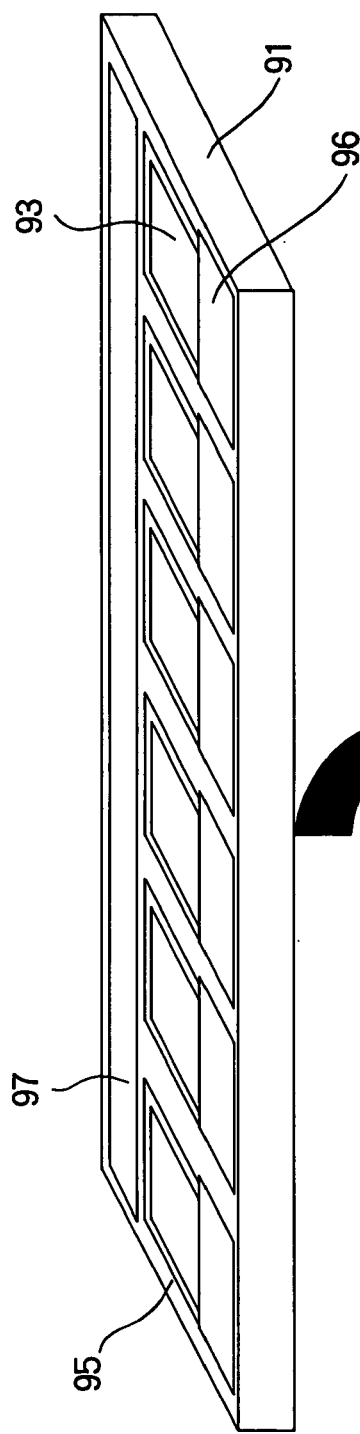
FIG. 17A is a perspective view of the supporting substrate in FIG. 16.
Figure 17B:
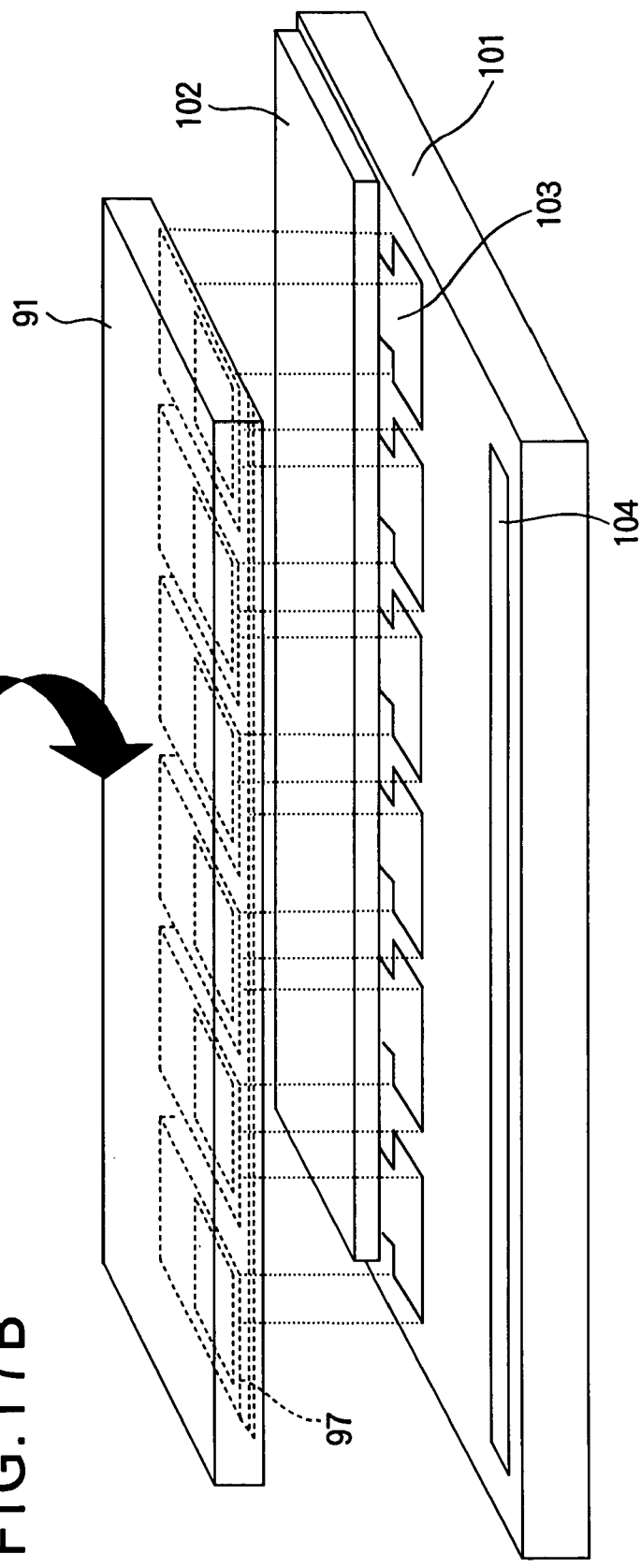
FIG. 17B is a perspective view illustrating face-down bonding of the supporting substrate in FIG. 17A to a transparent substrate.

FIGS. 17A and 17B are perspective views illustrating the bonding of the supporting substrate to the first surface of the transparent substrate. FIG. 17A shows the supporting substrate 91 as in FIG. 16; FIG. 17B shows the supporting substrate 91 turned over for face-down bonding to the first surface of the transparent substrate 101.

The structures of the transparent substrate 101 and driving circuitry 102 in FIG. 17B are nearly the same as in the first embodiment, but additional individual electrode pads 103 and a common electrode pad 104 are formed on the transparent substrate 101. The individual electrode pads 103 are connected to the output terminals or pads in the driving circuitry 102 that supply current to the light-emitting elements. The common electrode pad 104 supplies a common potential such as a ground potential.

Each individual electrode pad 103 is, for example, a multi-layer film having a top surface of gold, such as an AuZn/Au or AuSn/Au film, or a top surface of aluminum, such as an Ni/Al or Ti/Al film. The individual electrode pads 103 are disposed so as to face the individual electrode pads 96 on the supporting substrate 91 when the supporting substrate 91 is bonded face-down to the transparent substrate 101.

The common electrode pad 104 is, for example, a multi-layer film having a top surface of gold, such as an AuZn/Au or AuSn/Au film, or a top surface of aluminum, such as a single-layer aluminum film or a multi-layer Ni/Al or Ti/Al film. The common electrode pad 104 is disposed so as to face the common electrode pad 97 on the supporting substrate 91 when the supporting substrate 91 is bonded face-down to the transparent substrate 101.

To bond the supporting substrate 91 face-down to the transparent substrate 101, first the individual electrode pads 96 are aligned with the individual electrode pads 103 and the common electrode pad 97 with the common electrode pad 104, and then metal-metal eutectic crystal bonds are formed by applying heat and pressure, for example. When the electrode pads are directly bonded together by eutectic bonding, resulting variations in the distance between the transparent substrate 101 and light-emitting elements 93 on the supporting substrate 91 are small, so the desired distance (the design value) can be obtained with high precision. Eutectic bonding is possible between gold (Au) and gold or between gold and tin (Sn), so if one set of electrode pads has a gold surface, the mating electrode pads either may have a gold surface or may be made of tin.

When the supporting substrate 91 is bonded face-down to the transparent substrate 101, the well-known flip-chip bonding method may be used instead of eutectic bonding. In flip-chip bonding, bumps of a solder material are formed on the electrode pads, which are then bonded by applying heat after pad alignment.

The individual electrode pads 96, individual electrode pads 103, common electrode pad 97, and common electrode pad 104 are formed so that the distance between the supporting substrate 91 and transparent substrate 101 after bonding is greater than the distance between the surface of the metal layer 98 and the surfaces of the light-emitting elements 93, thereby preventing the light-emitting elements 93 from being directly pressed against the transparent substrate 101 during bonding.

Figure 18A:
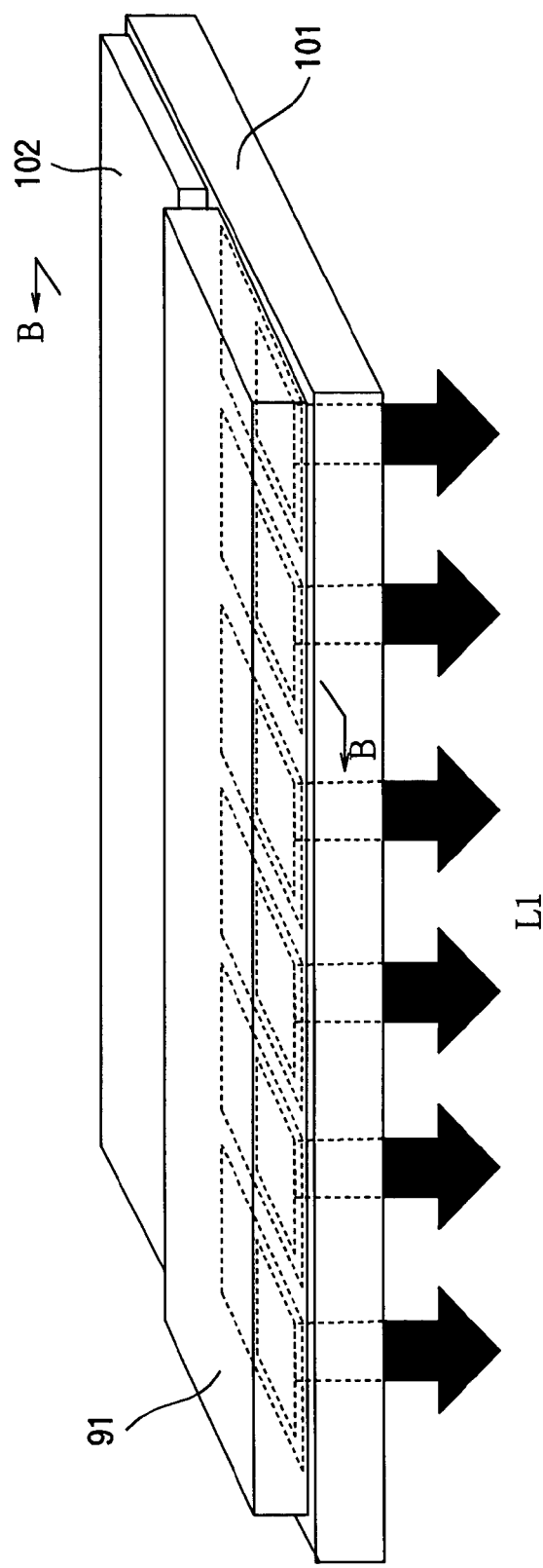
FIG. 18A is a perspective view illustrating light emission after the supporting substrate has been bonded to the transparent substrate in FIG. 17B.
Figure 18B:
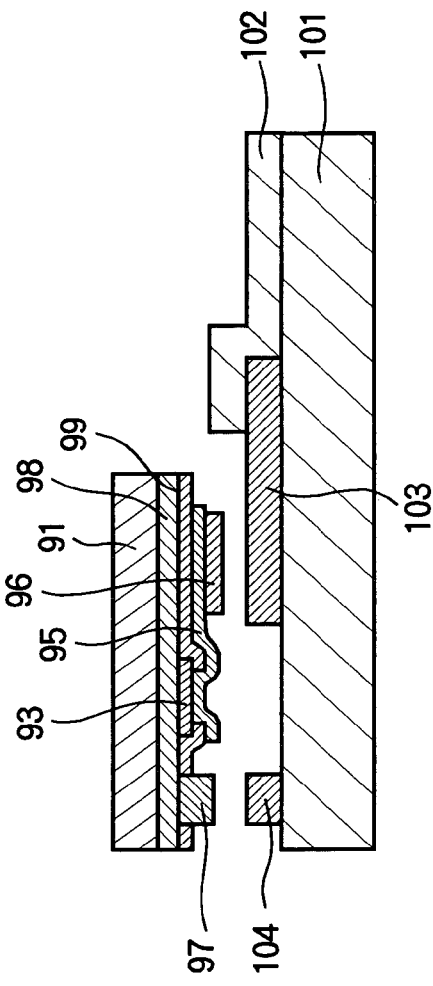
FIG. 18B is a partly exploded sectional view through line B-B in FIG. 18A.

FIG. 18A is a perspective view illustrating the stage at which the supporting substrate 91 has been bonded to the transparent substrate 101 by face-down bonding. FIG. 18B is a section through line B-B in FIG. 18A, showing the supporting substrate 91 slightly separated from the transparent substrate 101 for clarity. Light L1 emitted by the light-emitting elements 93 on the supporting substrate 91 passes through the transparent conductive film 95 and transparent substrate 101 to the second surface (bottom surface in FIG. 18A) of the transparent substrate 101 and is output therefrom.

If interconnecting members such as the common electrode pad 104 on the transparent substrate 101 must cross areas through which emitted light passes, these interconnecting members may be made of a transparent conductive material instead of a metal material. Other interconnecting members are preferably formed from a metal material such as one of the metal materials mentioned above or another metal material including gold or aluminum (for example, a Ti/Pt/Au film). All such metal interconnecting members can be formed by using the lift-off method mentioned above.

Figure 19:
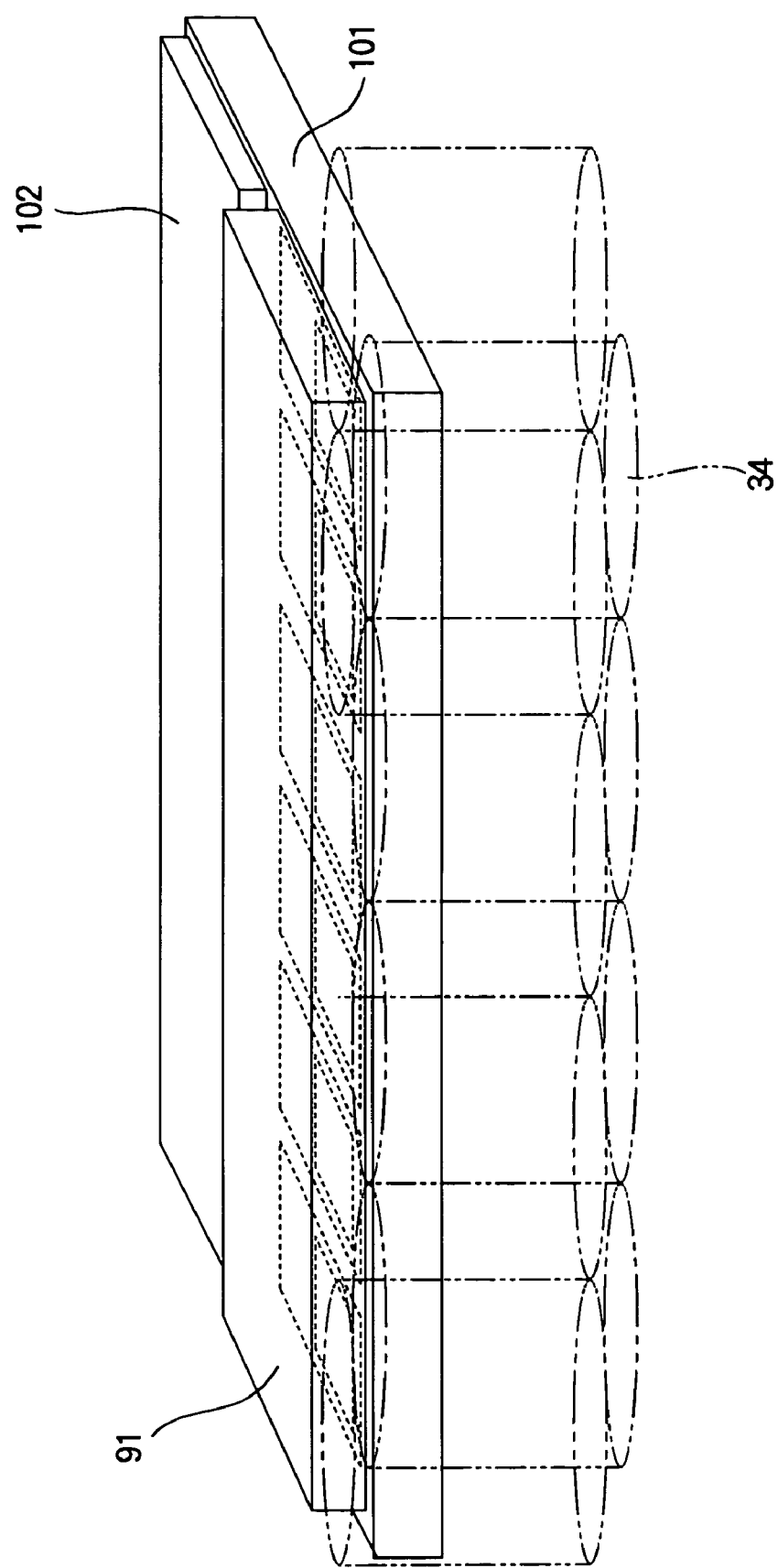
FIG. 19 is a perspective view illustrating the stage at which lenses have been fastened to the transparent substrate in FIG. 18A.

FIG. 19 is a perspective view illustrating the stage at which rod lenses have been fastened to the transparent substrate 101 in FIG. 18A. As in the first embodiment, the thickness of the transparent substrate 101 is chosen so as to match the focal length of the rod lenses 34, taking the refractive index of the glass of which the transparent substrate 101 is made into consideration. More precisely, the sum of the thickness of the transparent substrate 101 and the slight gap between the transparent substrate 101 and the light-emitting elements 93 matches the focal length of the rod lenses 34.

In FIG. 19, as in FIG. 3, the rod lenses 34 are disposed in a staggered array, not in any simple one-to-one or one-to-many correspondence with the positions of the light-emitting elements 93, so each rod lens 34 may focus light emitted by either one or more than one light-emitting element 93, and the light emitted by each light-emitting element 93 may be focused by either one or more than one rod lens 34.

In the second embodiment, the supporting substrate 91 to which the light-emitting elements 93 are bonded is fabricated separately from the transparent substrate 101 on which the driving circuitry is formed. After the light-emitting elements have been attached and the driving circuitry formed, the supporting substrate 91 and transparent substrate 101 can be tested separately before the supporting substrate 91 is bonded to the transparent substrate 101. Defective attachment of a light-emitting element therefore affects only the subassembly including the supporting substrate and not the entire assembly including the transparent substrate and driving circuitry. Fabrication yields may therefore be increased as compared with the first embodiment.

Although the light-emitting elements no longer sit directly on the first surface of the transparent substrate, the eutectic bonding or flip-chip bonding process that attaches the supporting substrate to the transparent substrate places the light-emitting elements at a constant distance from the first surface of the transparent substrate, and therefore at a constant distance from the rod lenses. Accordingly, the rod lenses are automatically positioned correctly in their optical axis direction, and no additional process is required for alignment in this direction.

Third Embodiment

In the second embodiment described above, since the light-emitting elements are disposed on the supporting substrate and the driving circuitry is disposed on the transparent substrate, electrode pads are necessary to interconnect the light-emitting elements with the driving circuitry. Although these electrode pads are smaller than conventional wire bonding pads, it would be desirable to eliminate them completely, to reduce the size of the transparent substrate. In the third embodiment described below, this is done by placing both the light-emitting elements and the driver elements on the supporting substrate.

FIG. 20A is a plan view illustrating the upper surface of an exemplary supporting substrate 111 on which the light-emitting elements and driver elements are disposed, and FIG. 20B is a section through line C-C in FIG. 20A. The supporting substrate 111 in FIGS. 20A and 20B is, for example, a silicon substrate, the surface of which is covered by a metal layer 118. The metal layer 118 may be a single-layer film or a multi-layer film including palladium, platinum, germanium, nickel, gold, tin, and/or indium, or having a multi-layer structure comprising this single layer film or multi-layer film and a film including chrome or titanium.

The driving circuitry 112 comprises, as in the first embodiment, a plurality of driver elements disposed in an array to individually drive the light-emitting elements 113, and is formed in a thin semiconductor film on the supporting substrate 111 before the light-emitting elements 113 are bonded thereto. The driving circuitry 112 is thus a thin semiconductor film formed on the supporting substrate 111, having driver elements that control the emission of light by the corresponding light-emitting elements.

The light-emitting elements 113 are formed in a thin semiconductor film having a thickness of about 1.5 µm, for example, as in the second embodiment, and are directly bonded to the metal layer 118 on the supporting substrate 111. The light-emitting elements 113 are formed and bonded by the same method as in the second embodiment.

The individual light-emitting elements 113 are connected to the driving circuitry 112 by individual electrodes 116. A common electrode pad 117 made of, for example, gold, is connected to the metal layer 118, through which it also electrically connected to the common electrodes (ground electrodes) of the light-emitting elements. Input pads 119 supply power and signals to the driving circuitry 112.

The top surfaces of the individual electrodes 116, common electrode pad 117, and input pads 119 may be formed of gold or aluminum as described above. When the top surface is formed of gold, a multi-layer film such as Ti/Pt/Au, Ni/Ge/Au, AuSn/Au, or AuZn/Au can be used. When the top surface is formed of aluminum, a single-layer aluminum film or a multi-layer Ni/Al or Ti/Al film can be used. The individual electrodes 116, common electrode pad 117, and input pads 119 can be easily formed, as in the first embodiment, by a lift-off method (a type of photolithographic process), using films including gold such as a Ti/Pt/Au film or films including aluminum such as a single-layer aluminum film. An interlayer dielectric film 114 shown in FIG. 20B is formed as necessary in regions such as the regions between the driving circuitry 112 and light-emitting elements 113 on the metal layer 118.

The individual electrodes 116 cross the light-emitting surfaces of the light-emitting elements 113, so these electrodes 116 may also be made of a transparent conductive film such as an indium tin oxide (ITO) film which is transparent to the wavelength of light emitted by the light-emitting elements. If the individual electrodes 116 are made of gold or aluminum, which is more conductive but is not transparent, the individual electrodes 116 must not block too much of the light-emitting surface of the light-emitting elements 113. Specifically, the light-emitting area covered by an individual electrode 116 is preferably less than half of the total light-emitting area of the light-emitting element 113. The reason for this will be described below.

FIG. 21 is a schematic view showing how light from the array of light-emitting elements 113 passes through the array of the rod lenses 34 and reaches an image formation area on, for example, the surface of the photosensitive drum 12 in FIG. 1.

The four light-emitting elements 113 shown in FIG. 21 are numbered in sequence from 501 to 504, and will be referred to below for brevity as LEDs. In the third embodiment, the LEDs are driven in an alternating pattern in which even-numbered LEDs and odd-numbered LEDs are driven alternately. Thus while LEDs 501 and 503 are driven, LEDs 502 and 504 are turned off, as shown, and while LEDs 502 and 504 are driven, LEDs 501 and 503 are turned off. In this driving pattern, accordingly, the light emitted by LEDs 501 and 503 forms a pair of mutually adjacent light spots 400A and 400B.

The individual electrodes 116 cross a light-emitting regions 300 of the LEDs 501 to 504, passing through a central part of each light-emitting region 300 from one end to the other end. When the light emitted by the LEDs 501 and 503 in the turned-on state passes through the rod lenses 34 and forms light spots 400A, 400B, blocking areas 450A, 450B are also formed as shadows of the individual electrodes 116; each blocking area crosses a light spot, passing through its central part from one end to the other end.

The light spots 400A (emitted by LED 501) and 400B (emitted by LED 503) shown in FIG. 21 are, for example, light images that would be obtained by a charge coupled device (CCD) sensor operating at maximum sensitivity (or with minimum light sensitivity threshold). The image formation area on, for example, the surface of the photosensitive drum 12 is typically less sensitive than this, so the size of the spots actually written on the image formation area is somewhat smaller.

Figure 22:
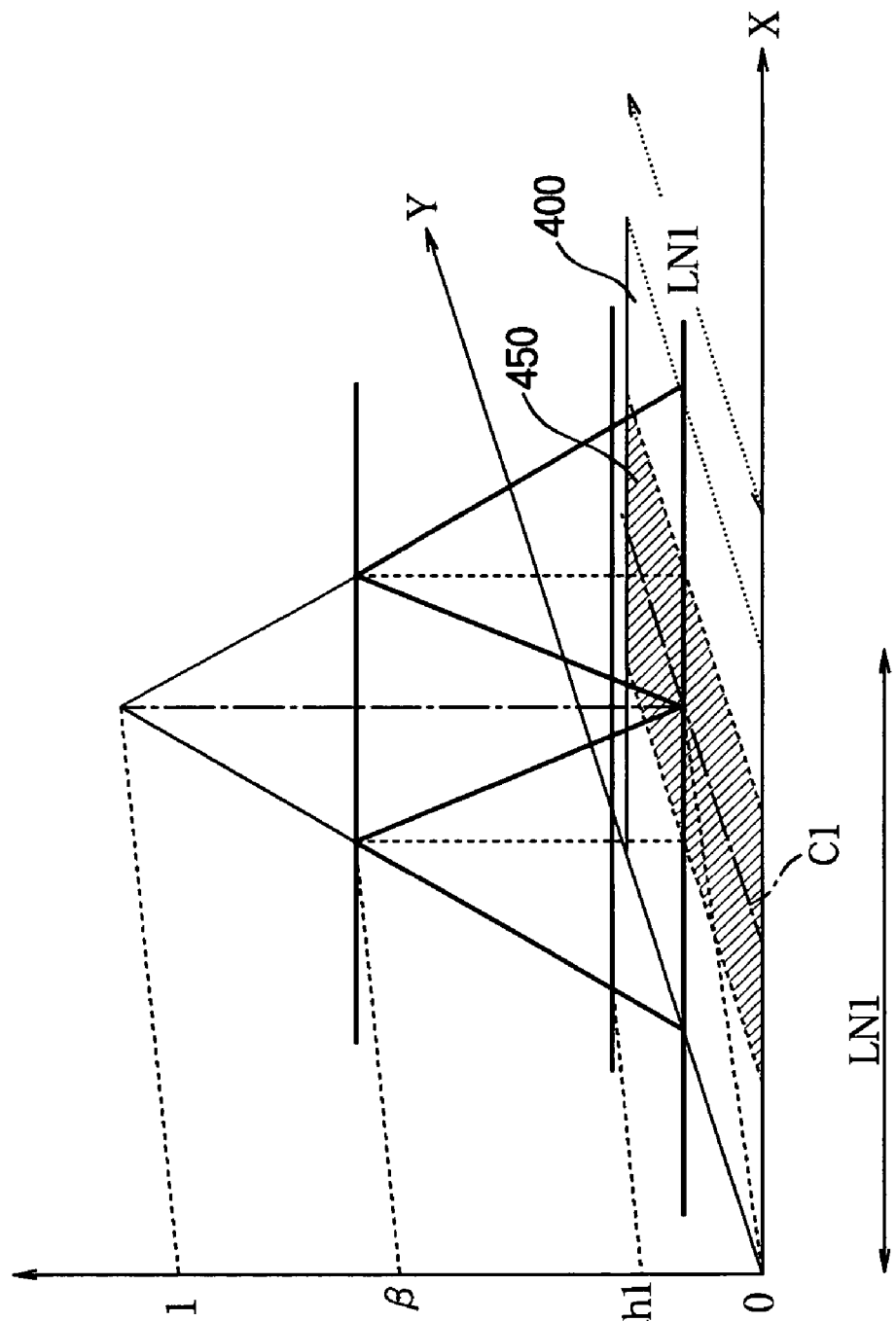
FIG. 22 is a schematic view illustrating a relative light intensity profile across a light spot in FIG. 21.

FIG. 22 schematically illustrates the light intensity (relative value) that would be observed if light spot 400A or 400B were to be scanned by a CCD sensor in a direction perpendicular to the blocking area caused by the individual electrode 116. The X-axis and Y-axis in FIG. 22 indicate transversal and longitudinal positions in the light spot 400, respectively; the vertical axis indicates the light intensity at arbitrary points on a transversal line passing through the center of the light spot 400. Reference character LN1 indicates the size of the light spot 400 in both the X-direction and Y-direction. Line C1 is the center line of both the blocking area 450 and the light spot 400. Reference characters th1 and β indicate the photosensitivity threshold of a photosensitive member and the light intensity at the edge of the individual electrode 116, respectively.

The distribution shown in FIG. 22 is a hypothetical one in which it is assumed that, absent the individual electrode 116, the emitted light intensity would be maximum the center of the light-emitting region 300 of the light-emitting element (LED 501 or 503) shown in FIG. 21, and would decrease linearly with increasing distance from the center. Since the individual electrode 116 is present, the maximum light intensity occurs at the edges of the blocking area 450 parallel to the center-line C1, and decreases linearly from those edges toward the center line C1.

Figure 23A:
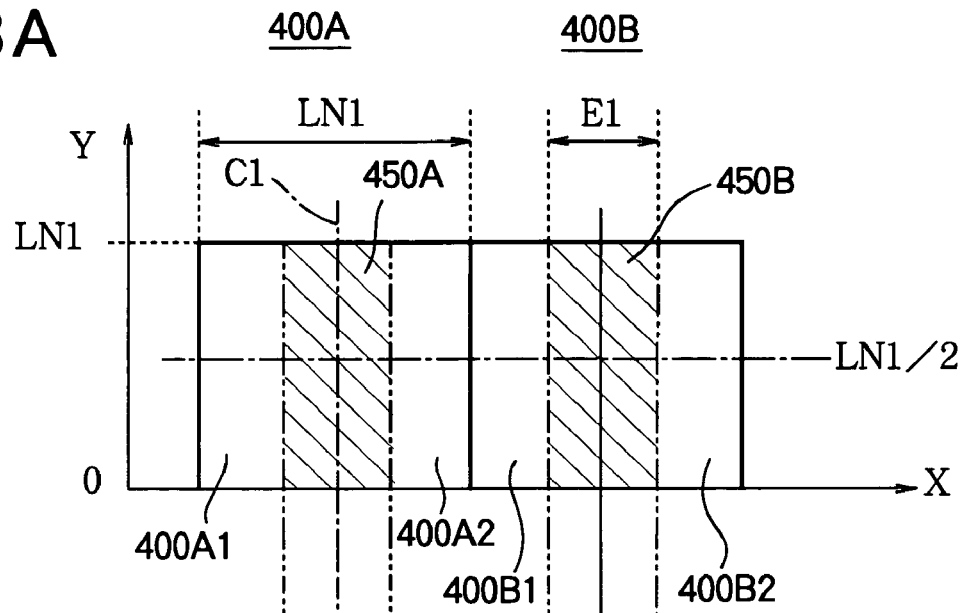
FIG. 23A is a plan view illustrating the shapes of a pair of light spots in the X-Y plane in FIG. 22.
Figure 23B:
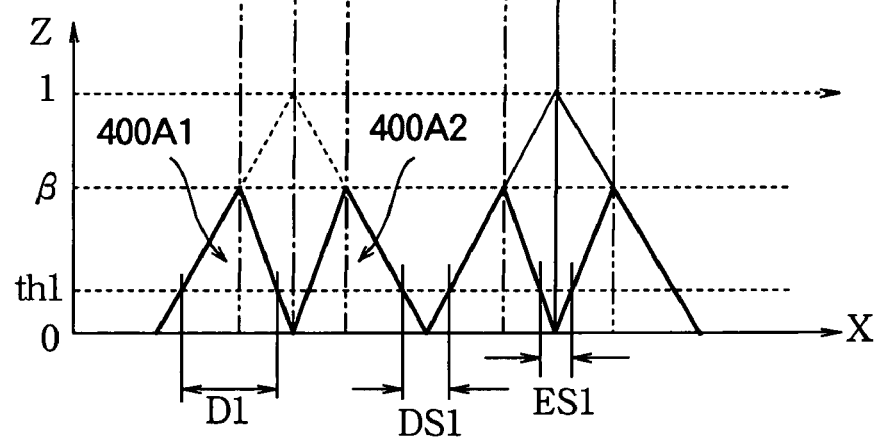
FIG. 23B illustrates light intensity profiles across the light spots in FIG. 23A.

FIGS. 23A and 23B illustrate the light intensity distribution in further detail. FIG. 23A shows the two adjacent light spots 400A, 400B in the X-Y plane in FIG. 22. FIG. 23B shows the light intensity distribution observed on the line Y=LN1/2 under the alternate driving scheme shown in FIG. 21.

In FIG. 23A, reference character LN1 indicates the full size of the light spots 400A, 400B in the X-direction and Y-direction; E1 indicates the width in the X-direction of the light blocking areas 450A, 450B due to the individual electrodes 116. Reference character th1 indicates the photosensitivity threshold of the photosensitive drum 12 or other photosensitive member on which the spots are formed; ES1 indicates the width of the parts of the light blocking areas 450A, 450B in which the light intensity is below the sensitivity threshold th1; D1 indicates the width of the pair of regions in the light spots 400A, 400B in which the light intensity is above the sensitivity threshold th1; DS1 indicates the space between the light spots 400A and 400B in which the light intensity is below the sensitivity threshold th1; and β indicates the light intensity at the edges of the blocking areas 450A, 450B.

For example, if the normalized sensitivity threshold th1 is 0.25 and width of the individual electrode 116 is one-third the width of the light-emitting region of the light-emitting element, then $E1 = \frac{1}{3} \times LN1$ in FIG. 23A, and D1, DS1, and ES1 can be calculated as follows:

$$D1 = 0.3125 \times LN1$$

$$DS1 = 0.25 \times LN1$$

$$ES1 = 0.125 \times LN1$$

From the above equations, the following relationship is obtained.

$$DS1 > ES1 \; (DS1 = 2 \times ES1)$$

This implies that the light blocking width ES1 in the blocking area 450 caused by the individual electrode 116 is half of the space DS1 between the light spots 400A and 400B. This is sufficiently narrow for regions 400A1 and 400A2 to appear as a single light spot 400A, separated from the adjacent light spot 400B. Similarly, regions 400B1 and 400B2 appear as a single light spot 400B, separated from the adjacent light spot 400A.

If, for example, the width of the individual electrode 116 is increased to half the width of the light-emitting element, i.e., $E1 = \frac{1}{2} \times LN1$ in FIG. 23A, then D1, DS1, and ES1 are calculated as follows:

$$D1 = 0.25 \times LN1$$

$$DS1 = 0.25 \times LN1$$

$$ES1 = 0.25 \times LN1$$

From the above equations, the following relationship is obtained.

$$DS1 = ES1$$

This implies that the space DS1 between the light spots 400A and 400B is equal to the light blocking width ES1 in the blocking area 450 caused by the individual electrode 116. Accordingly, light spots 400A and 400B appear as four equally separated spots, representing regions 400A1, 400A2, 400B1, and 400B2 in FIG. 23A.

Next, the above specific examples will be described more generally with reference to FIGS. 21 to 23 and equations. If the coverage ratio of the area of the individual electrode 116 to the area of the light-emitting region 300 is denoted by Rs, the light intensity at an edge of the individual electrode 116 by β, and the maximum light intensity at the center of the light-emitting region 300 by LSmax, the above-defined LN1, E1, ES1, D1, and DS1 are given by the following equations:

$$E1 = LN1 \times Rs$$

$$\beta = (1 - Rs) \times LSmax$$

$$D1 = (1 - th1/\beta) \times LN1/2$$

$$ES1 = Rs \times (th1/\beta) \times LN1$$

$$DS1 = (1 - Rs) \times th1/\beta \times LN1$$

Conditions in which the space DS1 between the light spots 400A and 400B becomes at least larger than the light blocking width ES1 in the blocking area 450 (ES1<DS1) will now be considered.

First, the condition for ES1 and DS1 to be equal can be obtained from the above equations as follows:

$$Rs \times (th1/\beta) = (1-Rs) \times th1/\beta$$

Substitution of $\beta=(1-Rs)$ LSmax into the above equation gives $2Rs=1$, thus $Rs=\frac{1}{2}$.

This is the coverage Rs at ES1=DS1, but not the required coverage that satisfies ES1<DS1 and can prevent light spots from being separated by the blocking areas 450 caused by the individual electrode 116. It can be easily seen that the coverage ratio Rs must be smaller than the coverage ratio at ES1=DS1, i.e., Rs must be less than one-half (Rs<½=0.5), to satisfy ES1<DS1.

Next, the effect of the coverage of the individual electrode 116 on electrical properties will be considered.

The current $I_f$ supplied to each LED is assumed to be 3 mA, and the voltage drop $\Delta V_f(C)$ caused by contact resistance is assumed to be 0.15 V or less, which is negligible from a practical point of view. If the contact resistance between the interconnect metal and contact layer of the light-emitting element is, for example, $1 \times 10^{-5} \Omega$ cm$^2$, the necessary area S(C) for the contact is $2 \times 10^{-7}$ cm$^2$ or more. In this case, if the contact region has a square shape, the size of each side of the square must be at least 4.5 μm.

The following further assumptions will be made:

(1) The size of the light spot 400 after passing through the rod lens 34 is twice the size of the light-emitting region in the light-emitting element.

(2) The odd-numbered and even-numbered light-emitting elements 113 are driven alternately, bringing adjacent light spots into contact with each other.

From the above assumptions (1), (2), if the array pitch of the light-emitting elements is denoted P(LED), the maximum longitudinal or transversal size of the light-emitting region is P(LED)/2. Therefore, the relationship between the area of the contact region S(C) and the minimum coverage Rs(min) can be given as follow:

$$Rs(min) = S(C) / [P(LED)/2]^2$$

where, the area of the contact region S(C) has the following value according to the above assumption.

$$S(C) = 4.5 \times 4.5 \text{ μm}$$

Array pitches for typical resolutions (dots per inch or dpi) are given as follow:

$$P(LED)1 = 84.8 \text{ μm (300 dpi)}$$

$$P(LED)2 = 42.4 \text{ μm (600 dpi)}$$

$$P(LED)3 = 21.2 \text{ μm (1200 dpi)}$$

If the minimum coverages corresponding to these resolutions are denoted Rs(min)1, Rs(min)2, and RS(min)3, they are calculated as follows:

$$Rs(min)1 = 0.106 \text{ (300 dpi)}$$

$$Rs(min)2 = 0.212 \text{ (600 dpi)}$$

$$Rs(min)3 = 0.425 \text{ (1200 dpi)}$$

It can be appreciated from the above results that the minimum Rs(min) occurs in the case of the 300 dpi resolution. Therefore, when electrical properties are taken into consideration, the coverage Rs of the individual electrode 116 has to have a value greater than 0.1 (Rs>0.1).

Consequently, when both light-emitting and electrical properties are taken into consideration, it is preferable for the coverage Rs of the individual electrode 116 to fall within the following range.

$$0.1 < Rs < 0.5$$

FIG. 24A is a plan view illustrating the upper surface of another exemplary supporting substrate on which the light-emitting elements and a group of driver elements are disposed. FIG. 24B shows a section through line D-D in FIG. 24A. The structures in FIGS. 24A and 24B are the same as in FIGS. 20A and 20B except that in FIGS. 24A and 24B, the common electrode pad 117 is eliminated to reduce the width of the supporting substrate 111, and one of the input pads 119 is used as a common electrode pad 119a. The common electrode pad 119a may be directly connected to the metal layer 118 on the silicon substrate, as shown in FIG. 24B.

Figure 12:
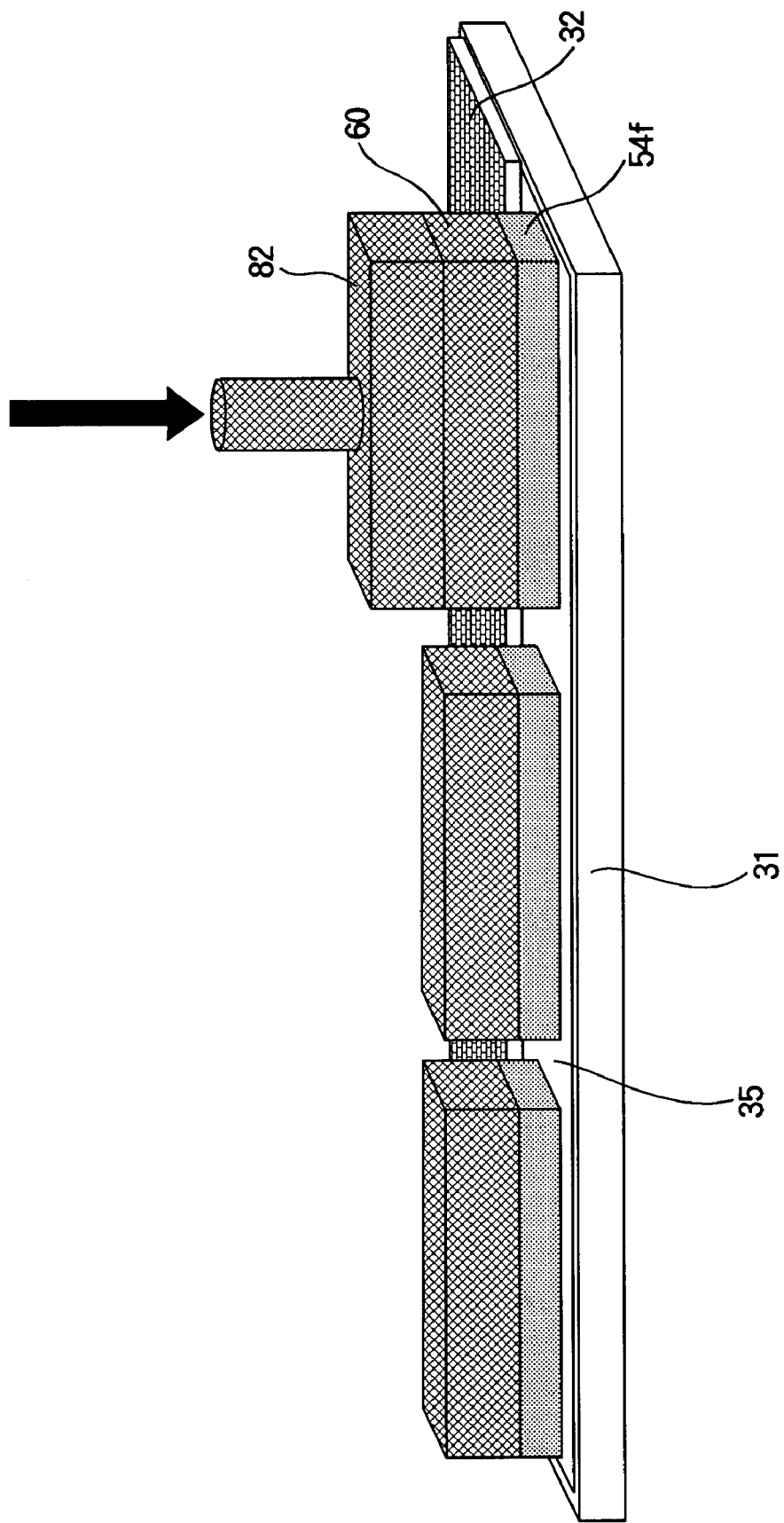
FIG. 12 is a perspective view showing the thin semiconductor films and supporting members being attached to a transparent substrate.

To form the structure described above on the supporting substrate, first the driving circuitry 112 is formed on the supporting substrate 111. In the example shown in FIGS. 24A and 24B, the driving circuitry 112 is disposed outside the area occupied by the common electrode pad 119a, which is connected to the metal layer 118. Next, the light-emitting elements 113 are directly bonded onto the metal layer 118. More specifically, thin semiconductor film chips 54f of the type shown in FIGS. 11-13 are bonded onto the metal layer 118, and are then divided into separate light-emitting elements as shown in FIG. 14. The interlayer dielectric film 114 is then formed at locations where electrical isolation is necessary, such as between the driving circuitry 112 and light-emitting elements 113 on the metal layer 118, and the individual electrodes 116 are formed on the interlayer dielectric film 114. The common electrode pad 117 or 119a and input pads 119 are also formed at this time.

FIGS. 25A and 25B are perspective views showing how the supporting substrate is bonded to the first surface of the transparent substrate. FIG. 25A shows the supporting substrate 111 shown in FIGS. 20A and 20B; FIG. 25B illustrates how the supporting substrate 111 is bonded by face-down bonding to the first surface of the transparent substrate 121.

An interconnection layer is formed on the first surface of the transparent substrate 121. As shown in FIG. 25B, the interconnection layer includes interconnecting lines 122 that supply the driving circuitry 112 on the supporting substrate 111 with power and signals for driving the light-emitting elements, and electrode pads 123 for supplying power (or a ground potential) to the light-emitting elements 113. The interconnecting lines 122 and electrode pads 123 can be easily formed from a metal film including gold, such as a Ti/Pt/Au film, by the above-mentioned lift-off method. Alternatively, a transparent conductive film may be used for the interconnecting lines 122 if they need to pass across an area through which emitted light passes.

At least some of the interconnecting lines 122 on the transparent substrate 121 are formed in the region that faces the driving circuitry 112 when the supporting substrate 111 is bonded face-down to the transparent substrate 121. This enables the area of the transparent substrate 121 to be reduced.

The electrode pads 123 are paired with the input pads 119 on the supporting substrate 111, and are formed at locations facing the corresponding input pads 119 when the supporting substrate 111 is bonded by face-down bonding. If the supporting substrate 111 has a common electrode pad 117 as shown in FIGS. 25A and 25B, a facing common electrode pad 124 is formed on the transparent substrate 121, and the two common electrode pads 117, 124 are joined when the supporting substrate 111 is bonded by face-down bonding. The top surfaces of the electrode pads 117 or 119a, 123, and 124 and the input pads 119 can be formed of gold or aluminum as in the embodiments described above. In the case of gold, a multi-layer film can be used, such as a Ti/Pt/Au, Ni/Ge/Au, AuSn/Au, or AuZn/Au film. In the case of aluminum, a single-layer aluminum film or a multi-layer film such as an Ni/Al or Ti/Al film can be used.

When the supporting substrate 111 is bonded to the transparent substrate 121 by face-down bonding, necessary alignments between the input pads 119 and electrode pads 123 and between the common electrode pads 117 and 124 are carried out, and then, for example, a metal-metal eutectic crystal is formed by applying heat and pressure to achieve eutectic bonding as in the second embodiment. The input pads 119, electrode pads 123, and common electrode pads 117 and 124, or 119a, are formed in such a way that the resulting distance between the supporting substrate 111 and transparent substrate 121 after bonding is greater than the distance between the surface of the metal layer 118 and the surface of the light-emitting elements 113, to prevent the light-emitting elements 113 from directly pressing against the transparent substrate 121 during bonding. In this embodiment, as in the second embodiment, flip-chip bonding may also be used in place of eutectic bonding.

A perspective view of the supporting substrate 111 bonded face-down to the transparent substrate 121 is shown in FIG. 26A. A sectional view through line E-E in FIG. 26A is shown in FIG. 26B. Light L1 emitted by the light-emitting elements 113 on the supporting substrate 111 in FIG. 26A passes through the transparent substrate 121, and is output from the second surface (bottom surface in the drawing) thereof.

Figure 27:
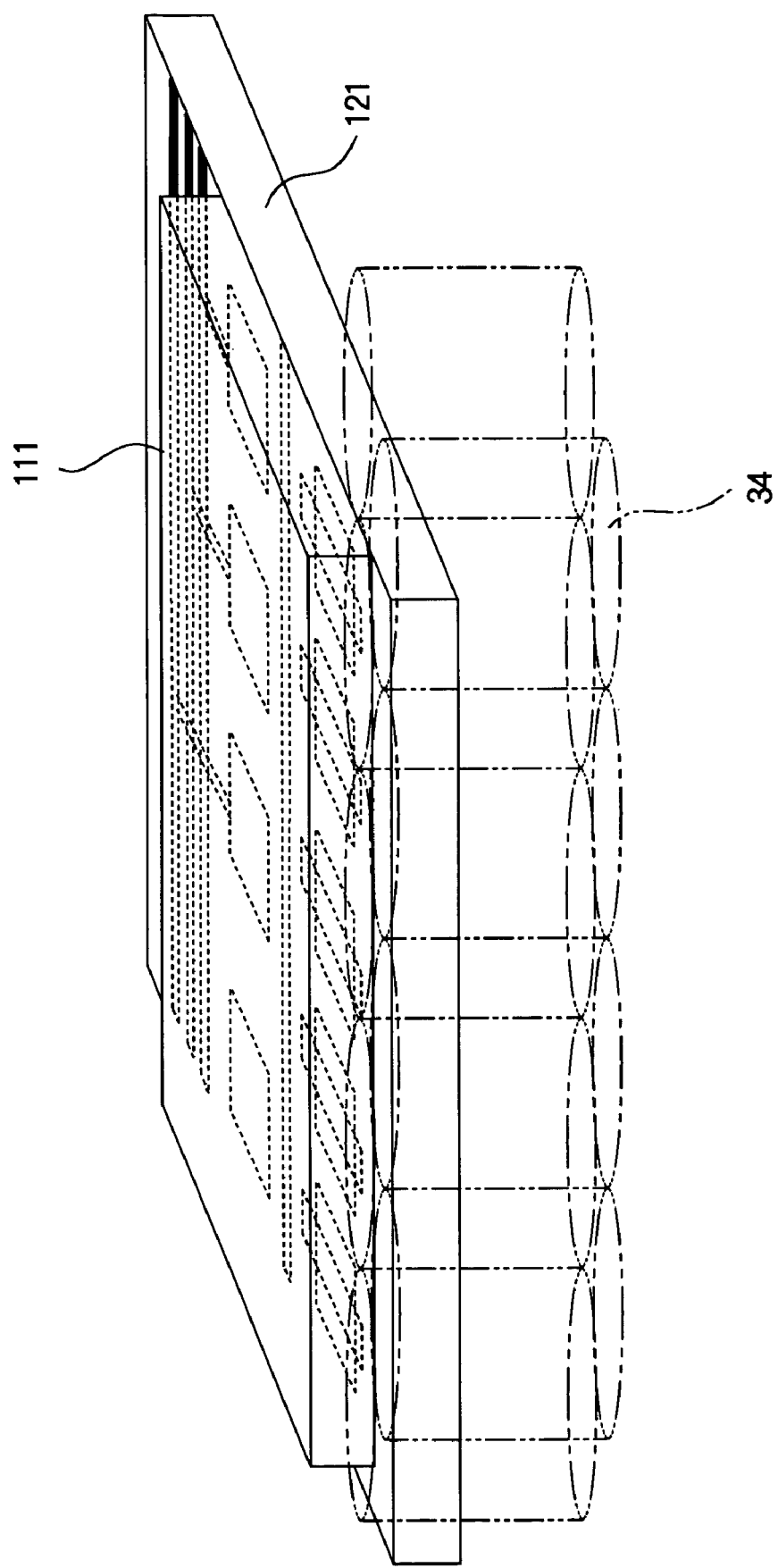
FIG. 27 is a perspective view illustrating the stage at which lenses have been fastened to the transparent substrate in FIG. 26A.

FIG. 27 is a perspective view illustrating the stage at which lenses have been attached to the transparent substrate 121 in FIGS. 26A and 26B. As in the first embodiment, the thickness of the transparent substrate 121 is chosen so as to match the focal length of the rod lenses 34, taking the refractive index of the glass of which the transparent substrate 121 is made into consideration; the rod lenses 34 are fastened to the second surface of the transparent substrate 121 in, for example, a staggered array. As in the preceding embodiments, each rod lens 34 may focus light emitted by either one or more than one light-emitting element 113, and the light emitted by each light-emitting element 113 may be focused by either one or more than one rod lens 34.

According to the third embodiment, the supporting substrate 111 and transparent substrate 121 are fabricated separately, the driving circuitry 112 being formed on the supporting substrate 111, the light-emitting elements 113 being bonded to the supporting substrate 111, and the interconnecting lines 122 and electrode pads 123 for supplying power and signals to the driving circuitry 112 being formed on the transparent substrate 121. After both substrates have been fabricated and tested, the supporting substrate 111 is directly bonded face-down to the transparent substrate 121 by eutectic bonding or flip-chip bonding. The light-emitting elements 113 and their driving circuitry 112 are interconnected without the need for a large number of electrode pads, and at least some of the interconnecting lines 122 on the transparent substrate 121 face the driving circuitry 112. Consequently, in addition to the effects of the second embodiment, the area needed for interconnections can be reduced, enabling the combined semiconductor device to be further reduced in size.

Fourth Embodiment

In the embodiments described above, most of the light output through the transparent substrate and lenses is emitted from one of the two light-emitting surfaces of each thin-film light-emitting element, but the light emitted from the other light-emitting surface is reflected back and is also output through the transparent substrate and lenses. In the following fourth embodiment, two other modes of operation will be described: in one mode, light emitted from the two surfaces of the thin-film light-emitting element is output in opposite directions; in the other mode, one surface of the thin-film light-emitting element is used as a light source and the other surface is used as a photodetector.

Referring to FIGS. 28A and 28B, in the fourth embodiment, as in the third embodiment, the light-emitting elements 133 and their driving circuitry 132 are disposed on a supporting substrate 131 that is bonded face-down to the first surface of a main transparent substrate 141. The supporting substrate has 131 is made of sapphire, which is transparent to the wavelength of light emitted by the light-emitting elements. Individual electrodes 136, a common electrode pad 137, a metal layer 138, and input pads 139 are also formed on the transparent supporting substrate 131, and interconnecting lines 142, electrode pads 143, and a common electrode pad 144 are formed on the transparent substrate 141 as in the third embodiment.

The metal layer 138 is disposed between the light-emitting elements 133 and supporting substrate 131, but has openings through which can light pass. These openings (not shown) are disposed below, for example, the central parts of the light-emitting elements 133. The ratio of coverage of the lower surface of the light-emitting elements 133 by the metal layer 138 is, for example, similar to the coverage ratio of the upper surface of the light-emitting elements 133 by the individual electrodes 136. Alternatively, a transparent conductive film may be used in place of the metal layer 138.

The other structures in the fourth embodiment and the fabrication and bonding methods are the same as in the third embodiment, so repeated descriptions will be omitted.

The transparent supporting substrate 131 is made of sapphire instead of glass because the thermal resistance of a supporting substrate 131 made of glass would not be not high enough to allow the fabrication of CMOS integrated circuits thereon, whereas sapphire makes it possible to fabricate CMOS integrated circuits with the well-known silicon on sapphire (SOS) structure.

Figure 29:
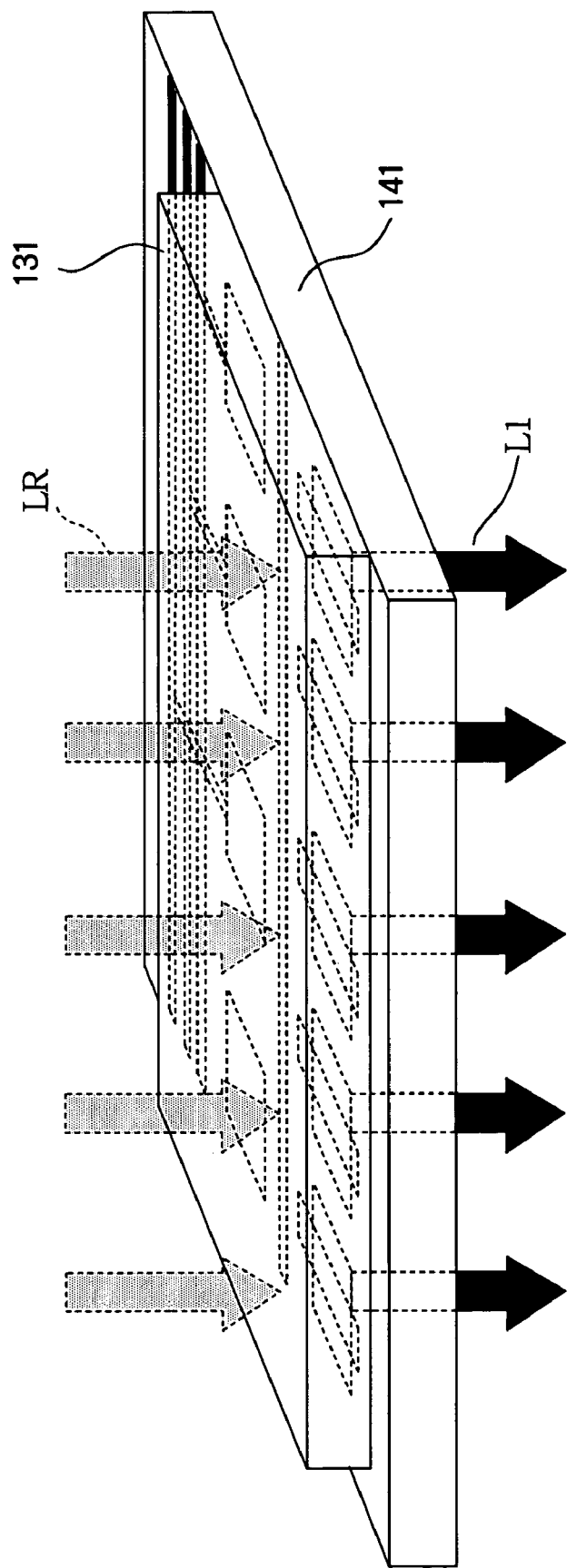
FIG. 29 is a perspective view illustrating one mode of operation after the substrates in FIG. 28B have been bonded.

Referring to FIG. 29, in one possible mode of operation of the fourth embodiment, the light-emitting elements 133 receive light LR incoming through the transparent supporting substrate 131. The light-emitting elements may be reverse-biased to detect the incoming light LR, or forward-biased to emit light L1 as in the third embodiment. When reverse biased, the light-emitting elements 133 output electrical signals to signal processing circuits that are formed in addition to the driving elements in the driving circuitry on the supporting substrate 131.

Figure 30:
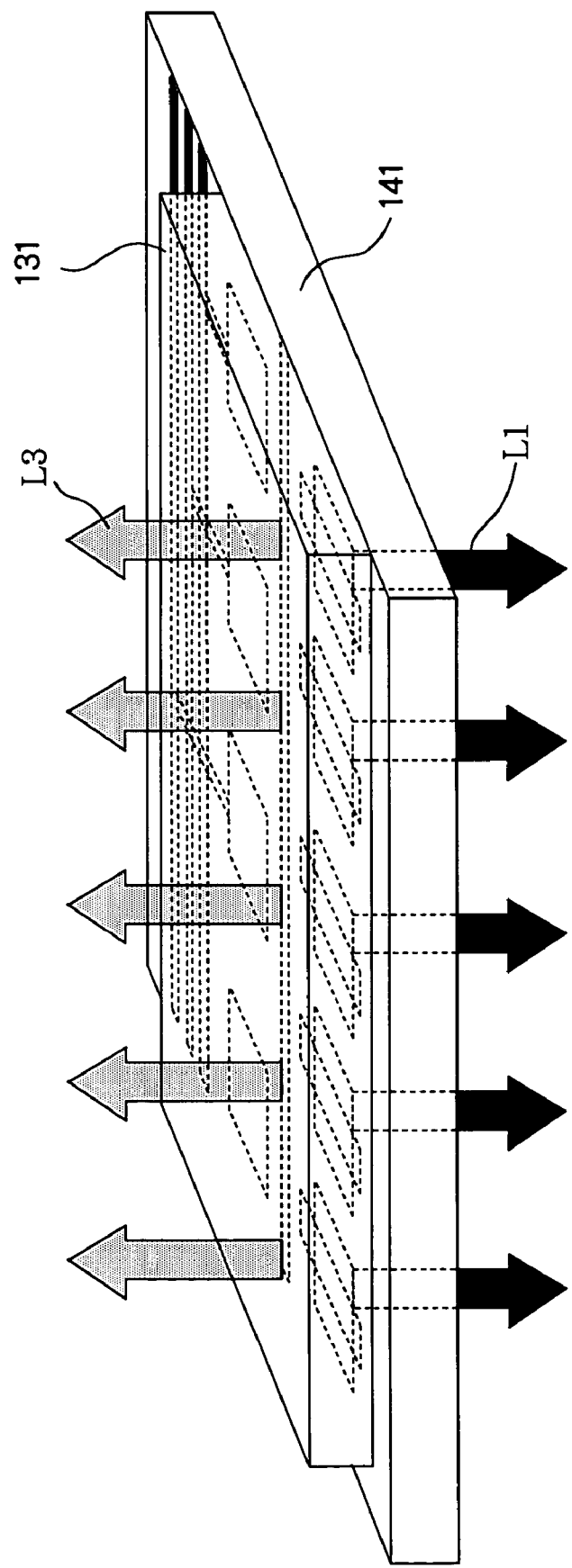
FIG. 30 is a perspective view illustrating another mode of operation after the substrates in FIG. 28B have been bonded.

Referring to FIG. 30, in another possible mode of operation of the fourth embodiment, light L3 output from the light-emitting elements 133 through the supporting substrate 131 is used to write dots on a photosensitive member (not shown) different from the photosensitive member that receives light L1 emitted through the main transparent substrate 141.

Figure 31:
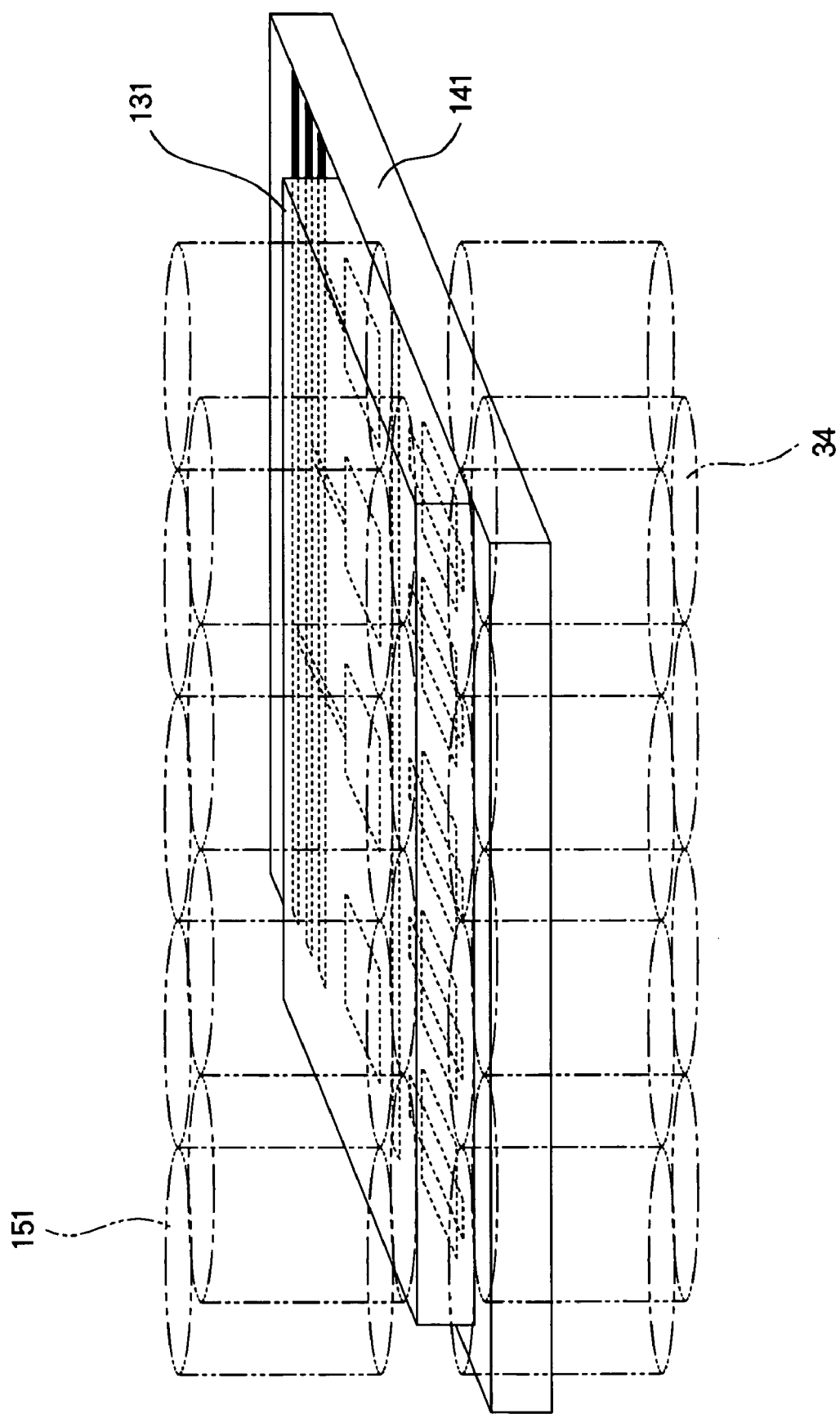
FIG. 31 is a perspective view showing lenses attached to the substrates in FIG. 28B.

Referring to FIG. 31, in the fourth embodiment rod lenses are fastened to both substrates 131, 141. The rod lenses 151 fastened to the supporting substrate 131 focus light in the same way as the rod lenses 34 fastened to the transparent substrate 141, except that the light may be either incoming or outgoing.

When the combined semiconductor device of the fourth embodiment is used for receiving light as shown in FIG. 29, for example, the same device can both emit light to write dots onto a photosensitive drum and receive light to scan a document or read other optical data. When light is output in both directions as shown in FIG. 30, for example, one combined semiconductor device can write dots on two photosensitive drums disposed on opposite sides of the device. Nor is the fourth embodiment limited to the reading and writing of data; the fourth embodiment may also be used to send and receive multi-bit optical signals by connecting optical fibers to the ends of lenses.

As described above, according to the fourth embodiment, the supporting substrate 131 on which the light-emitting elements 133 are mounted is formed of sapphire, which is transparent to the wavelength of emitted light, and additional rod lenses 151 are fastened to the supporting substrate 131. Therefore, in addition to the effects of the third embodiment, the combined semiconductor device can emit light in two directions, or emit light in one direction and receive light from the opposite direction.

Fifth Embodiment

In the first and second embodiments, the driving circuitry is disposed on the main transparent substrate, whereas in the third and fourth embodiments, to reduce the size of the main transparent substrate, the driving circuitry is disposed on the same supporting substrate as the light-emitting elements. It is also possible to reduce the size of the main transparent substrate by placing the driving circuitry on a second supporting substrate different from the first supporting substrate on which the light-emitting elements are disposed. In the fifth embodiment described below, this is done and the first and second supporting substrates are both bonded to the transparent substrate.

Referring to FIG. 32A, the transparent substrate 161 to which the supporting substrates are attached is made of a material such as glass that is transparent to the wavelength of light emitted by the light-emitting elements.

The first supporting substrate 171 is, for example, a GaAs substrate on which the light-emitting elements 173 are disposed. Referring to FIG. 32B, the first supporting substrate 171 is covered by a metal layer 178 to which the light-emitting elements 173 are bonded. The metal layer 178 is covered by an interlayer dielectric film 174 having openings through which electrodes 176, formed on the interlayer dielectric film 174, make electrical contact with the light-emitting elements 173. After making contact with the light-emitting elements 173, the electrodes terminate in small electrode pads. The light-emitting elements 173 are formed as described in the first embodiment, by etching a stack of semiconductor epitaxial layers having a pn-junction to separate the layer into individual light-emitting elements.

The second supporting substrate 181 is, for example, a silicon substrate having a surface with a thin semiconductor film 182 in which driving circuitry is formed to control the emission of light by the corresponding light-emitting elements. The driving circuitry has input electrode pads 186 for receiving power, control signals, and data signals, and output electrode pads 187 for output of driving current to the light-emitting elements.

Figure 33:
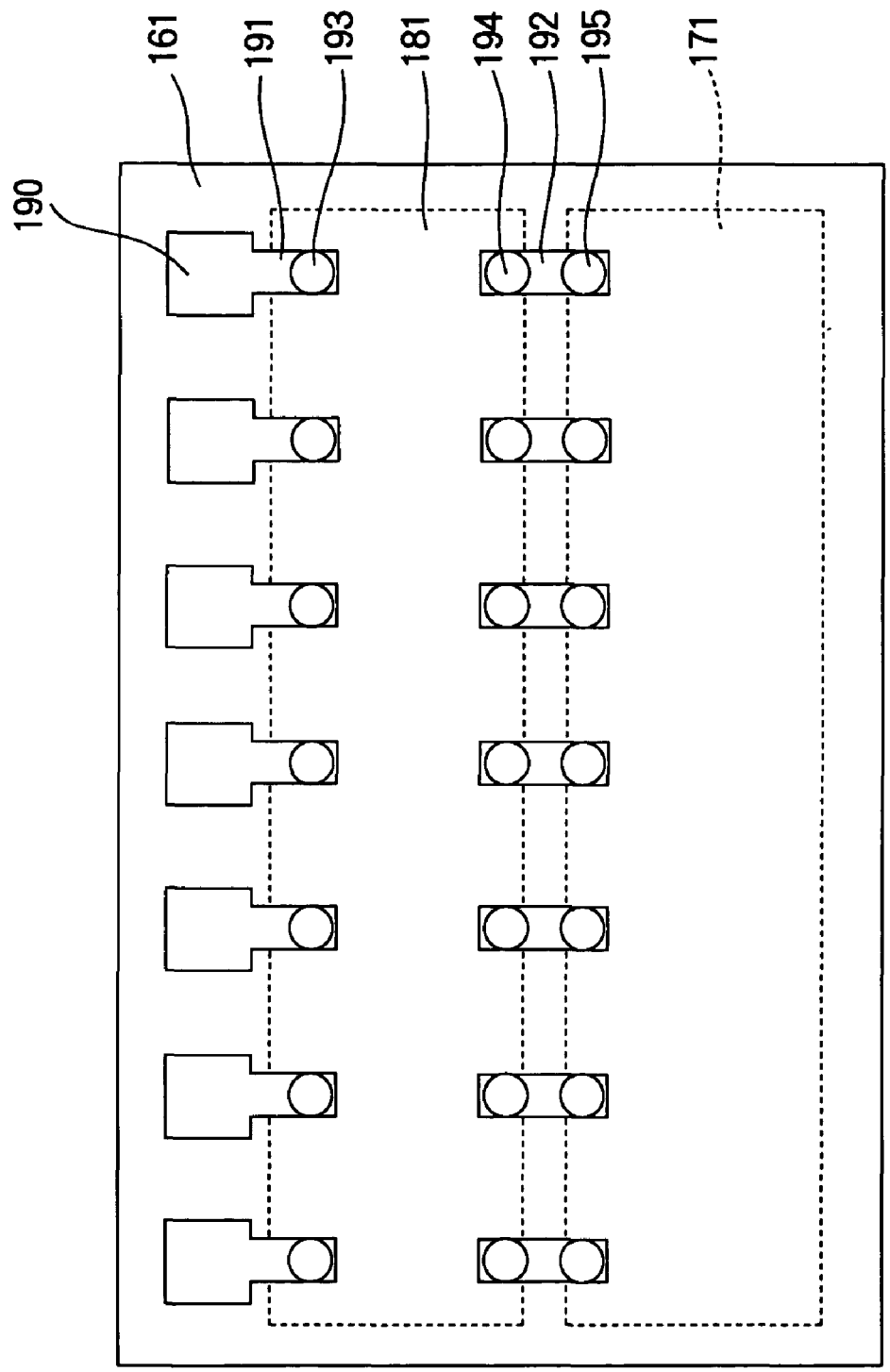
FIG. 33 is a plan view illustrating electrode patterns on the transparent substrate in FIG. 32A.

The transparent substrate 161 has electrode patterns shown in sectional view in FIG. 32B and plan view in FIG. 33. These electrode patterns include input electrode pads 190 for supplying control signals and power to the driving circuitry on the supporting substrate 181, metal interconnection lines 191 for connecting the input electrode pads 190 to positions facing the input electrode pads 186 on the second supporting substrate 181, metal interconnection lines 192 for connecting positions facing the output electrode pads 187 on the second supporting substrate 181 to positions facing the terminal pads of the electrodes 176 on the first supporting substrate 171, and conductive pads or bumps such as gold pads or solder bumps 193, 194, 195 formed at the positions facing the terminal pads of the electrodes 176 and the input and output electrode pads 186, 187.

The metal interconnection lines 191 and 192 are formed from a metal film including gold or aluminum. The metal film including gold may be a multi-layer film such as a Ti/Pt/Au, Ni/Ge/Au, AuSn/Au, or AuZn/Au film. The metal film including aluminum may be a single aluminum film or a multi-layer film such as an Ni/Al or Ti/Al film.

When the first supporting substrate 171 and second supporting substrate 181 are bonded to the transparent substrate 161 by flip-chip bonding, for example, the conductive pads or bumps 193, 194, 195 establish low-resistance electrical contact between the interconnection lines 191, 192 and the input electrode pads 186, output electrode pads 187, and electrodes 176 on the supporting substrates 171, 181.

The sizes of the input and output electrode pads 186, 187 are about 30 μm×30 μm, which is much smaller than the size of a conventional wire bonding pad (about 100 μm×100 μm). The terminal pads of the electrodes 176 are also smaller than conventional wire bonding pads.

When the first supporting substrate 171 is bonded to the transparent substrate 161 by face-down bonding, for example, the terminal pads of the electrodes 176 on the first supporting substrate 171 are aligned with the conductive pads or bumps 195 on the transparent substrate 161 and heat is applied, whereby the facing metal surfaces are bonded by direct bonding or eutectic bonding.

When the second supporting substrate 181 is bonded to the transparent substrate 161 by face-down bonding, for example, the output electrode pads 187 on the second supporting substrate 181 are aligned with the conductive pads or bumps 194, the input electrode pads 186 are aligned with the conductive pads or bumps 193, and heat is applied, whereby the facing metal surfaces are bonded by direct bonding or eutectic bonding.

Figure 34:
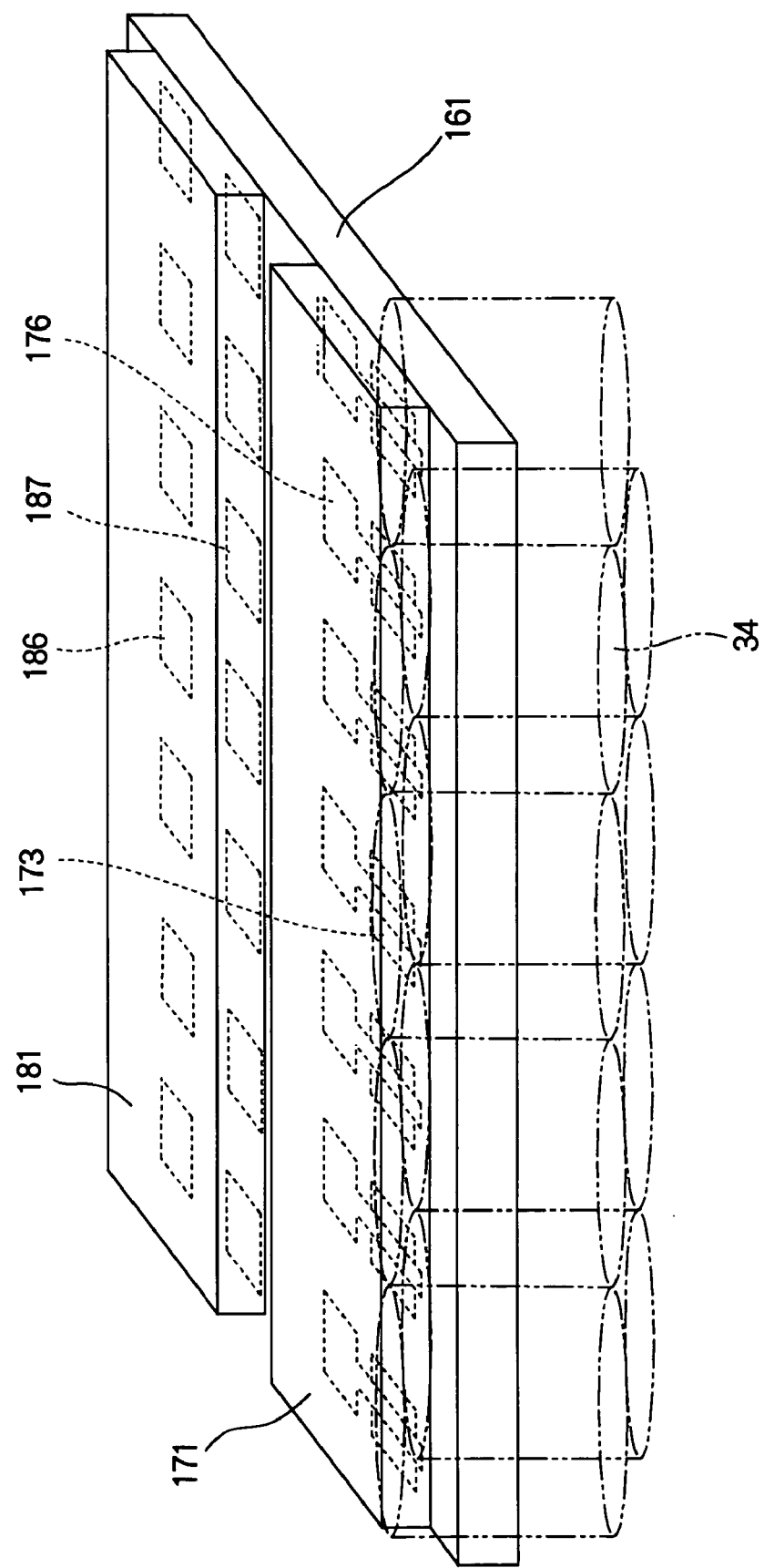
FIG. 34 is a perspective view showing lenses fastened to the transparent substrate in FIG. 32A.

FIG. 34 is a perspective view showing the lenses attached to the second surface of the transparent substrate 161 shown in FIG. 32A.

As in the first embodiment, the thickness of the transparent substrate 161 matches the focal length of the rod lens 34, taking the refractive index of the glass material of the transparent substrate 161 into consideration, and the rod lenses 34 are fastened to the second surface of the transparent substrate 161 to form, for example, a staggered array similar to the one in FIG. 3.

As described above, according to the fifth embodiment, a first supporting substrate bearing the light-emitting elements and a second supporting substrate bearing the driving circuitry are bonded to the transparent substrate by flip-chip bonding to make direct metal-to-metal bonds. Consequently, in addition to the effects of the first embodiment, tighter bonds can be formed. In comparison with the fourth embodiment, different materials can be used for the substrates of the light-emitting elements 173 and their driving circuitry 182, the fabrication of which can accordingly be simplified.

Sixth Embodiment

Figure 35:
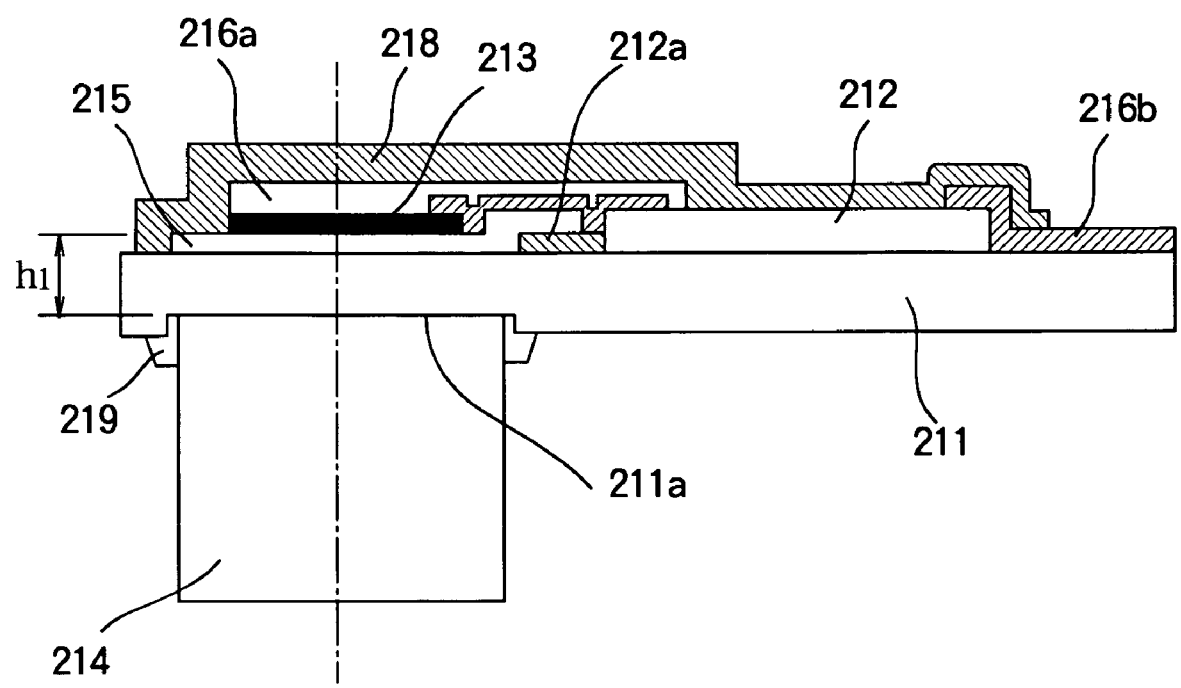
FIG. 35 is a sectional view illustrating a combined semiconductor device according to a sixth embodiment of the invention.

FIG. 35 is a sectional view illustrating a sixth embodiment of the invention. The transparent substrate 211, driving circuitry 212, light-emitting elements 213, rod lenses 214, and transparent conductive film 215 in FIG. 35 are similar to the transparent substrate 31, driving circuitry 32, light-emitting elements 33, rod lenses 34, and transparent conductive film 35 in the first embodiment, so repeated descriptions will be omitted.

A trench 211a is formed on the second surface of the transparent substrate 211 to facilitate the alignment of the rod lenses 214. An interconnecting member 212a electrically connects the driving circuitry 212 with the transparent conductive film 215. Individual interconnecting lines 216a corresponding to the interconnecting electrodes 36 in the first embodiment electrically connect the light-emitting elements 213 with the driving circuitry 212. Interconnecting leads 216b electrically connect the driving circuitry 212 to external circuits such as circuits outside the LED print head in which the combined semiconductor device is used. A protective film or passivation film 218 protects and electrically isolates the internal structure. A fastening material 219 such as an adhesive tightly secures the rod lenses 214 to the transparent substrate 211.

In the combined semiconductor device of the sixth embodiment, the floor of the trench 211a is parallel with the first surface of the transparent substrate 211. Since the second surface of the transparent substrate 211 is parallel to the first surface and the transparent substrate 211 has a constant thickness, its first and second (upper and lower) surfaces are mutually parallel, so the floor of the trench 211a is also parallel with the second surface of the transparent substrate 211. The trench 211a is formed by etching the second surface down to a predetermined depth. The trench 211a enables the optical axes of the rod lenses 214 to be accurately aligned with the optical axes of the light-emitting elements 213. The rod lenses 214 are then secured to the floor of the trench 211a by the fastening material 219. The distance $h_1$ between the rod lenses 214 and the light-emitting elements 213 is equal to the combined thickness of the transparent substrate 211 and transparent conductive film 215, minus the depth of the trench 211a. The combined thickness and trench depth can be precisely controlled, so the rod lenses 214 can be placed at a precise distance from the light-emitting elements 213 without the need for a separate alignment process.

The trench 211a is positioned and formed with photolithographic accuracy, e.g., ±0.5 μm. The alignment marks (not shown) for the light-emitting elements 213 on the first surface of the transparent substrate 211 are also formed with photolithographic accuracy, e.g., ±0.5 μm. Accordingly, in the sixth embodiment, the optical axes of the light-emitting elements 213 and the rod lenses 214 can be accurately aligned without difficulty.

In the sixth embodiment, as in the first embodiment, the distance between the light-emitting elements and the rod lenses can be precisely controlled, and the positions to which the light emitted by the light-emitting elements is focused can be determined with extremely high accuracy. In addition, accurate alignment of the lens axes with the light-emitting elements is simplified.

Seventh Embodiment

Figure 36:
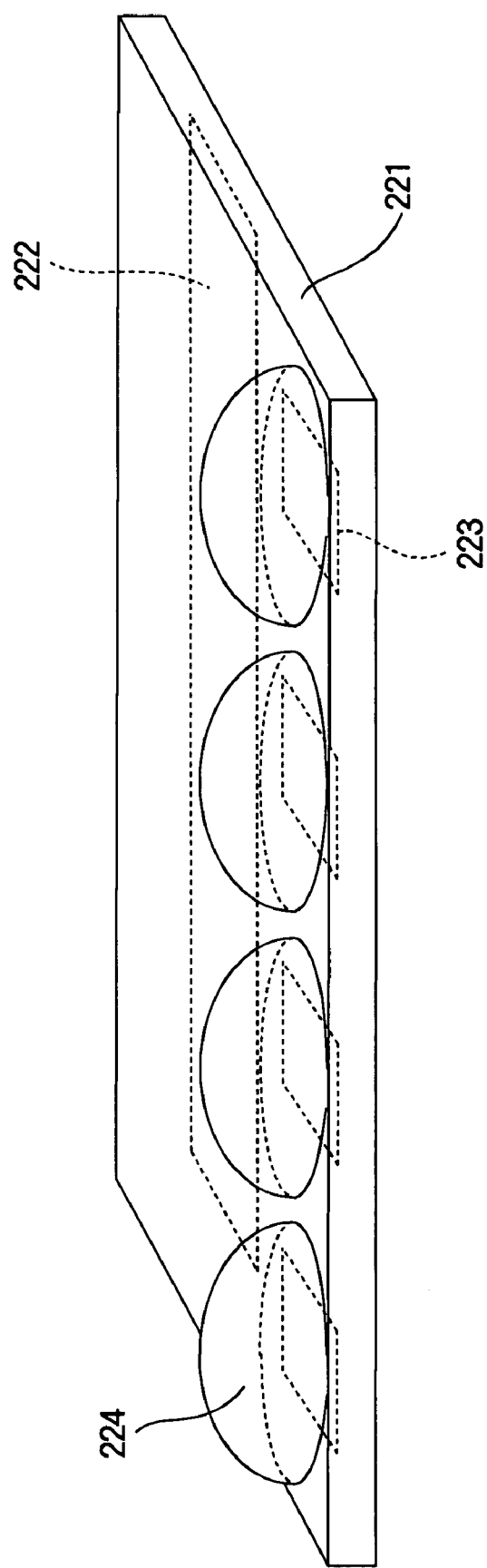
FIG. 36 is a perspective view illustrating a combined semiconductor device according to a seventh embodiment of the invention.
Figure 37:
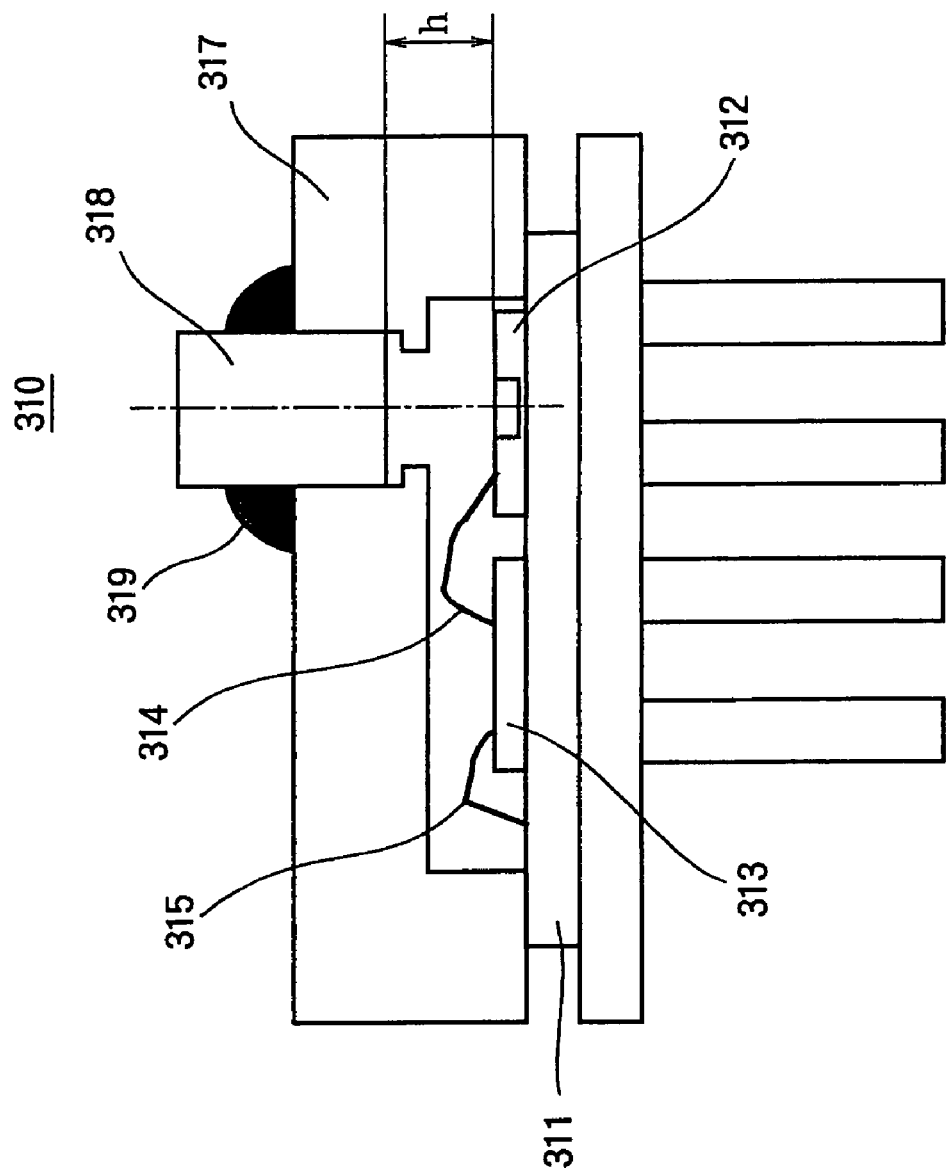
FIG. 37 is a schematic sectional view showing an example of a conventional LED print head.
Figure 38:
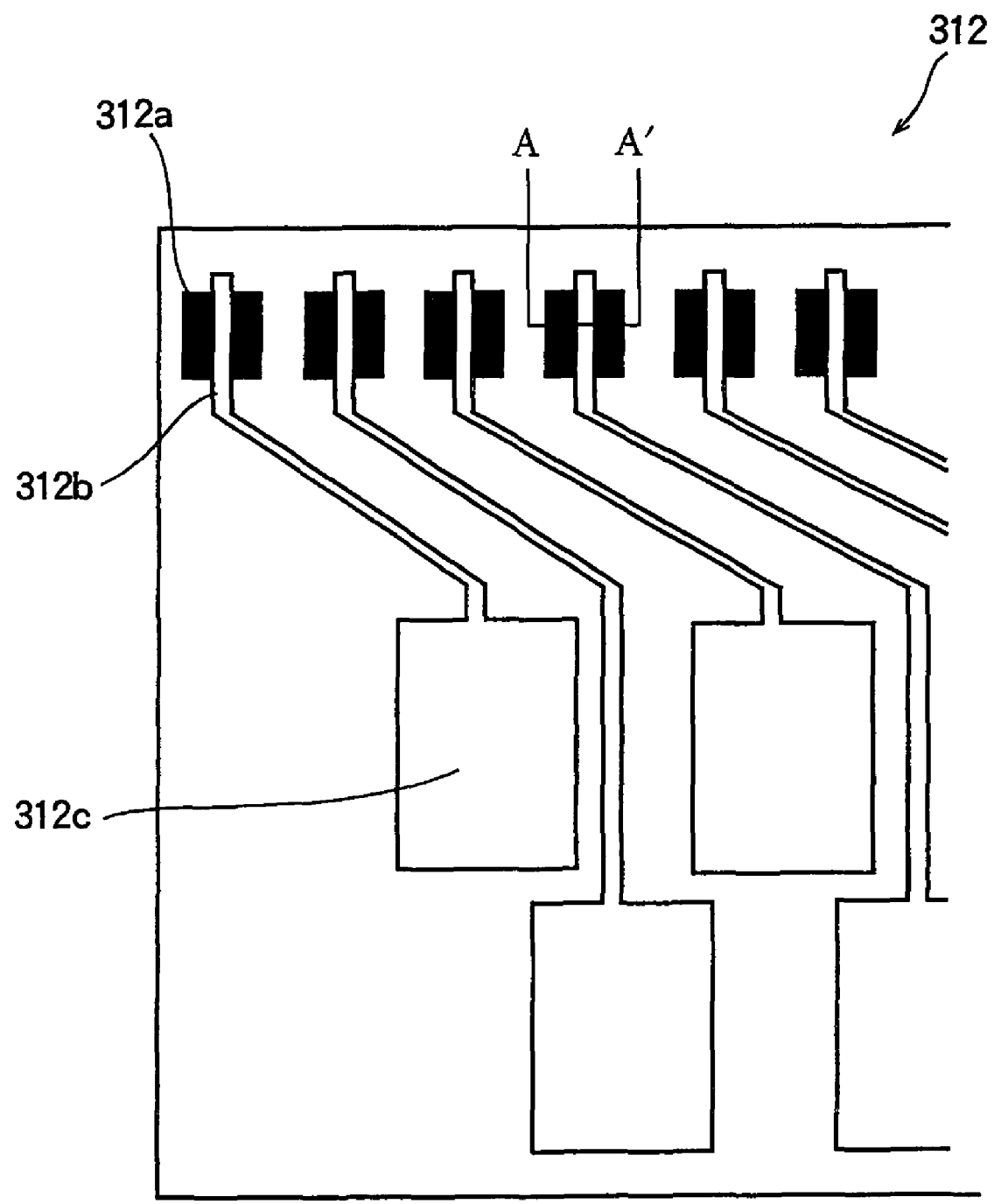
FIG. 38 is a partial plan view of the LED array chip in FIG. 37.
Figure 39:
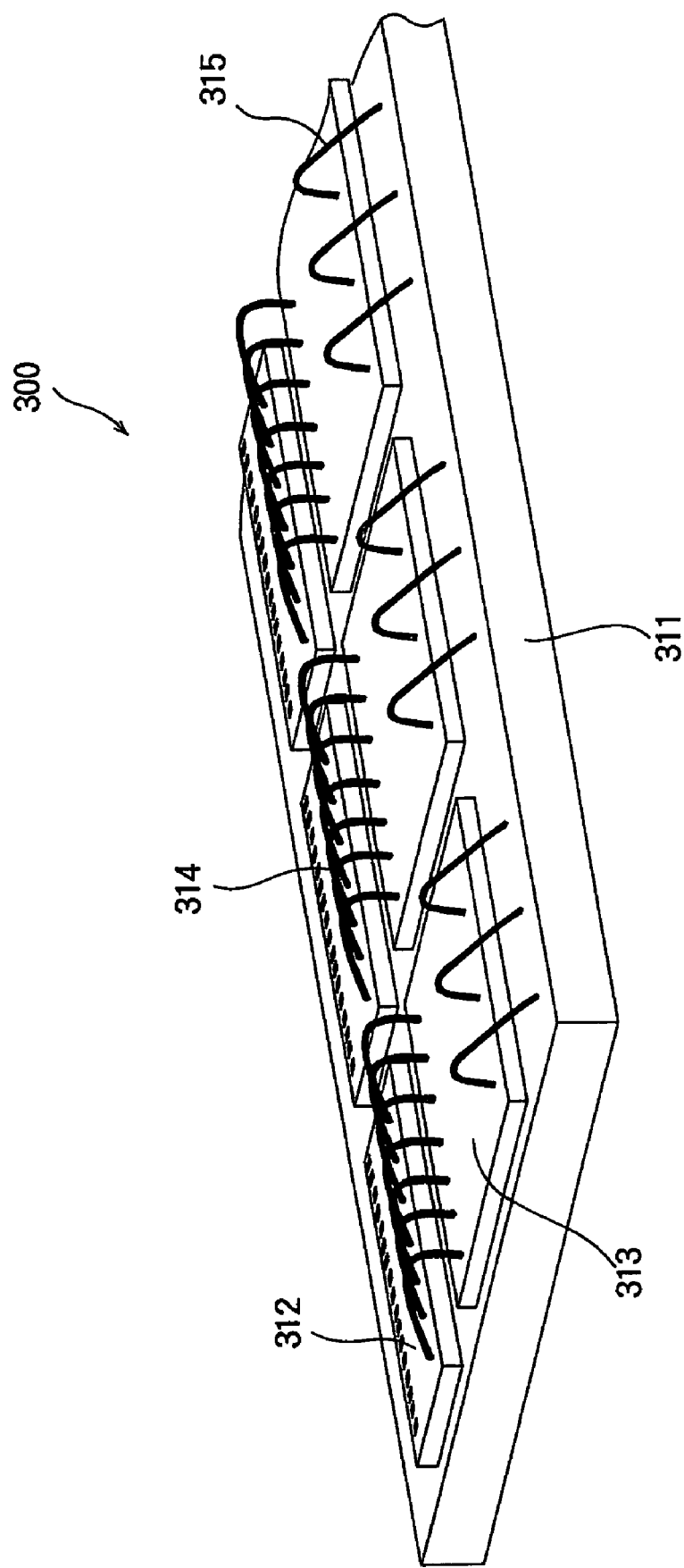
FIG. 39 is a perspective view illustrating wire bonding interconnections in FIG. 37.

FIG. 36 is a perspective view illustrating a seventh embodiment of the invention.

The transparent substrate 221, driving circuitry 222, and light-emitting elements 223 in FIG. 36 are similar to the transparent substrate 31, driving circuitry 32, and light-emitting elements 33 in the first embodiment, so repeated descriptions will be omitted. The lower surface in FIG. 36 is the first surface on which the driving circuitry 222 and light-emitting elements 213 are formed, and the upper surface is the second surface.

The seventh embodiment includes lenses 224 formed directly on the second surface of the transparent substrate 221 by molding a polymer material or by a photolithography and etching process. The lenses 224 shown in the drawing are spherical lenses, but aspherically curved lenses or cylindrical lenses may be used instead. The light-emitting elements are disposed on the optical axes of the lenses. The lenses of the seventh embodiment form a microlens array corresponding to the array of light-emitting elements.

As described above, in the seventh embodiment, since the lenses can be formed directly on the transparent substrate, the processes of aligning the lenses, bringing the lenses into tight contact with the substrate, and securing them with a fastening material such as an adhesive can be omitted. In addition, each light-emitting element can be centered on the optical axis of the corresponding lens 2224.

In a variation of the seventh embodiment, each lens 224 focuses the light emitted by a group of mutually adjacent light-emitting elements 223, and the optical axis of the lens 224 passes through the center of the group.

When the invention is practiced in an LED head or image forming apparatus, as described above, the combined semiconductor device can be reduced in size and material cost, can facilitate the alignment between the light-emitting elements and lenses, and can reduce the number of steps in the alignment process, whereby the LED head or image forming apparatus can also be reduced in size and cost.

In the preceding embodiments, the light-emitting elements that write dots onto the photosensitive drum of an image forming apparatus or read data have been described as being arranged in a single line, but the present invention is not limited to this arrangement. For example, a single light-emitting element or a number of light-emitting elements smaller than the number in an LED head may be used for multi-bit optical communication or the like by joining glass fibers or the like to the tips of the lenses. Alternatively, when the invention is used in image forming apparatus, the light-emitting elements may be arranged in multiple lines, with offsets so that the dots formed by one line of light-emitting elements fill gaps between the dots formed by another line of light-emitting elements.

Figure 40:
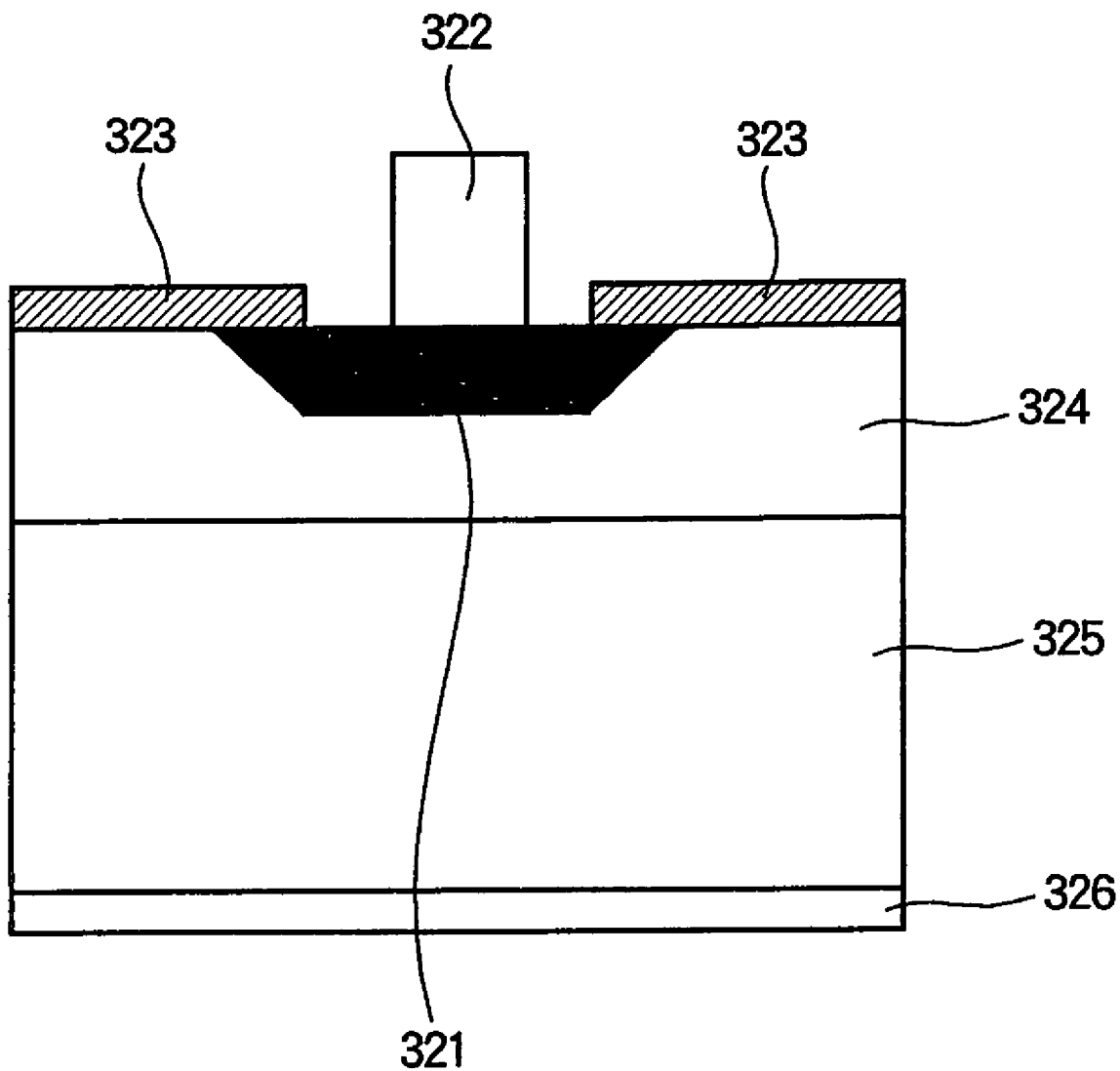
FIG. 40 is a sectional view illustrating a conventional LED array chip.

In the above embodiments, the light-emitting elements have been described as being formed by etching a semiconductor epitaxial layer structure to divide and subdivide it into individual elements, each of which has a single light-emitting region, but the light-emitting elements may also be have the structure shown in FIG. 40, for example, in which an impurity is selectively diffused into the epitaxial layer. This structure can be used to form a plurality of light-emitting regions in a single light-emitting element, in which case a separate driving element needs to be disposed in correspondence to each light-emitting region. In this case too, the light-emitting regions may be arranged in either a single line or multiple lines. For example, a second line of light-emitting regions may fill in the gaps between the light-emitting regions in a first line.

The bonding method in the above embodiments has been described as bonding thin semiconductor film chips one by one, but a plurality of thin semiconductor film chips may be bonded to the supporting substrate or transparent substrate in one step.

Those skilled in the art will recognize that further variations are possible within the scope of the invention, which is defined in the appended claims.

What is claimed is:

1. A combined semiconductor device comprising:
   a first substrate having a first surface and a second surface, the first surface and the second surface being mutually parallel and disposed on mutually opposite sides of the first substrate, the first substrate being transparent to light of a certain wavelength;
   a transparent conductive film provided on the first surface of the first substrate;
   an array of thin semiconductor films disposed on the transparent conductive film, each thin semiconductor film of the array including a first film surface attached to the transparent conductive film on the first surface of the first substrate and a second film surface facing away from the first substrate, the transparent conductive film being sandwiched between the first substrate and the array of thin semiconductor films and being in direct contact with the first film surfaces of the thin semiconductor films of the array, each thin semiconductor film of the array having a light-emitting region which emits light of said certain wavelength through the first substrate, one of the thin semiconductor films of said array of thin semiconductor films being a first thin semiconductor film having a thickness of substantially 0.5 to 10 micrometers, the first thin semiconductor film including the light-emitting region emitting light of said certain wavelength through the first substrate so that the light emerges from the second surface of the first substrate;
   an interconnecting electrode made of conductive and reflective film metal material covering the second film surface of the first thin semiconductor film so as to reflect light emitted by the light-emitting region back through the first thin semiconductor film toward the first substrate; and
   a lens disposed in contact with the second surface of the first substrate to focus the light emitted from the light-emitting region through the first substrate onto a predetermined surface, wherein the thickness of the first substrate is chosen in relation to a refractive index of the first substrate so as to match a focal length of the lens.

2. The combined semiconductor device of claim 1, further comprising a second thin semiconductor film disposed on the transparent conductive film on the first surface of the first substrate, the second thin semiconductor film including a driving element for controlling emission of light by the light-emitting region.

3. The combined semiconductor device of claim 2, wherein the second thin semiconductor film comprises thin-film transistors formed on the first substrate.

4. The combined semiconductor device of claim 2, wherein the first thin semiconductor film is electrically connected to the second thin semiconductor film by the interconnecting electrode.

5. The combined semiconductor device of claim 1, wherein said lens is a rod lens, further comprising an array of rod lenses disposed on and attached to the second surface of the first substrate to focus the light emitted through the first substrate by the light-emitting regions in the array of thin semiconductor films, said rod lens being one of the rod lenses in the array of rod lenses.

6. The combined semiconductor device of claim 1, wherein said lens is a first lens, further comprising an array of second lenses disposed on and attached to the second surface of the first substrate to focus the light emitted through the first substrate by the light-emitting regions in the array of thin semiconductor films, the lenses of the array of second lenses being disposed in a plurality of rows, the first lens being one of the lenses in the array of second lenses.

7. The combined semiconductor device of claim 1, wherein the second surface of the first substrate has a trench aligned with the light-emitting region in the first thin semiconductor film, the lens being disposed in the trench.

8. The combined semiconductor device of claim 1, further comprising a second thin semiconductor film disposed on the transparent conductive film on the first surface of the first substrate, the second thin semiconductor film including driving elements for controlling emission of light by the light-emitting regions in the array of thin semiconductor films.

9. The combined semiconductor device of claim 1, wherein the transparent conductive film comes in an electrical contact with the first thin semiconductor film.

10. The combined semiconductor device of claim 1, wherein said lens is fastened to the first substrate.

11. The combined semiconductor device of claim 1, wherein said lens is formed directly on the second surface of the first substrate.

12. The combined semiconductor device of claim 1, wherein the first thin semiconductor film is attached to the transparent conductive film on the first substrate by intermolecular force.

13. The combined semiconductor device of claim 2, wherein the first and second thin films are attached to the transparent conductive film on the first substrate by intermolecular force.

14. The combined semiconductor device of claim 1, wherein the thickness of the first thin semiconductor film is set such that the light reflected by the reflective material reaches outside the rod lens by penetrating through the first substrate and the rod lens.

15. The combined semiconductor device of claim 4, wherein the interconnecting electrode comes in direct contact with both the first thin semiconductor film and the second thin semiconductor film, without forming an electrode pad on the first and second thin semiconductor films.

16. The combined semiconductor device of claim 1, wherein the interconnecting electrode comes in direct contact with the first thin semiconductor film, without forming an electrode pad on the first thin semiconductor film.

17. The combined semiconductor device of claim 1, wherein the first film surface facing the first substrate is a common ground electrode, while the second film surface facing the interconnecting electrode is an individually driven electrode.

18. The combined semiconductor device of claim 17, wherein the interconnecting electrode covers the entire second film surface.

* * * * *